United States Patent [19]
Ueda et al.

[11] Patent Number: 5,633,524
[45] Date of Patent: May 27, 1997

[54] GATE ARRAY SEMICONDUCTOR INTEGRATED CIRCUIT DEVICE

[75] Inventors: Kimio Ueda; Hiroyuki Morinaka; Koichiro Mashiko, all of Tokyo, Japan

[73] Assignee: Mitsubishi Denki Kabushiki Kaisha, Tokyo, Japan

[21] Appl. No.: 580,609

[22] Filed: Dec. 29, 1995

[30] Foreign Application Priority Data

Aug. 10, 1995 [JP] Japan .................. 7-204375

[51] Int. Cl.⁶ .............. H01L 27/10; H01L 27/01; H01L 29/76
[52] U.S. Cl. .............. 257/369; 257/204; 257/205; 257/347; 257/351; 257/368
[58] Field of Search .............. 257/347, 368, 257/369, 351, 204, 205

[56] References Cited

U.S. PATENT DOCUMENTS

| | | | |
|---|---|---|---|
| 5,327,000 | 7/1994 | Miyata et al. | 257/369 |
| 5,440,161 | 8/1995 | Iwamatsu et al. | 257/350 |
| 5,495,124 | 2/1996 | Terashima | 257/369 |

FOREIGN PATENT DOCUMENTS 7-74363  12/1995  Japan .

OTHER PUBLICATIONS

1993 IEEE, IEDM, pp. 475–478, 1993, T. Iwamatsu, et al., "CAD–Compatible High–Speed CMOX/SIMOX Technology Using Field/Shield Isolation For 1M Gate Array".

Primary Examiner—Mahshid D. Saadat
Assistant Examiner—Valencia Martin Wallace
Attorney, Agent, or Firm—Oblon, Spivak, McClelland, Maier & Neustadt, P.C.

[57] ABSTRACT

In order to improve a withstand voltage and implement a gate array SOI semiconductor integrated circuit device having a large gate width, a region consisting of end cells (49) is provided on each end of a region formed by repeatedly arranging basic cells (BC) consisting of both transistor regions (32, 33) in a first direction and while symmetrically arranging the same to be folded in a second direction. Both ends of a channel region of a PMOS transistor (42) are drawn out in the second direction to provide a P-type semiconductor layer just under a field shielding gate electrode (FG), and this semiconductor layer is drawn also in the first direction to be connected with a P-type semiconductor layer of the end cell (49). A first source potential is applied to a region (PBD) which is bonded with one of the P-type semiconductor layers. Also as to an NMOS transistor (41) which is adjacent through a field oxide film (FO), on the other hand, an N-type semiconductor layer is similarly provided so that this N-type semiconductor layer is also connected with that of the end cell (49). A second source potential is applied to a region (NBD).

20 Claims, 46 Drawing Sheets

BC

49B

49B

FIG. 69a
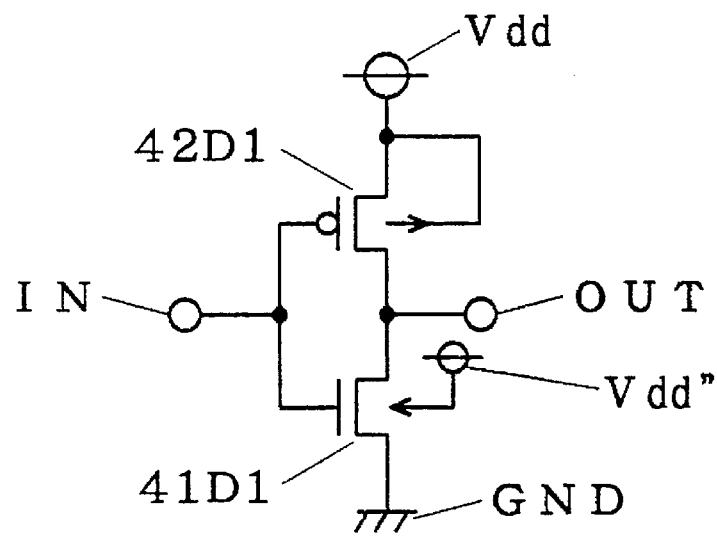
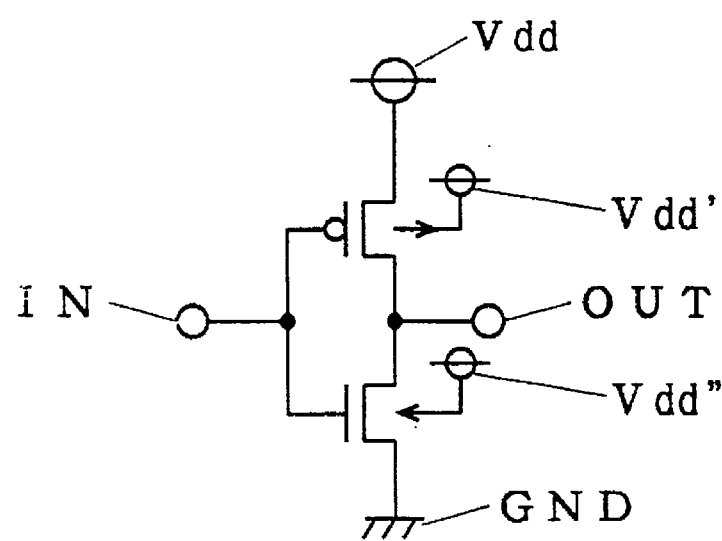
FIG. 69b

49E 5,633,524

1

GATE ARRAY SEMICONDUCTOR INTEGRATED CIRCUIT DEVICE

BACKGROUND OF THE INVENTION

1. Field of the Invention

The present invention relates to a gate array semiconductor integrated circuit device employing MOS transistors which are formed on a semiconductor layer (SOI (silicon on insulator) substrate) provided on a surface of an insulating layer.

2. Description of the Background Art

A gate array semiconductor integrated circuit device is widely employed as a technique capable of forming an LSI circuit in a short development period. In the gate array semiconductor integrated circuit device, steps (generally called a master step) up to those of forming PMOS and NMOS transistors are previously advanced, and connection of the transistors is varied with the user's order so that desired functions can be implemented through contact and wiring steps (generally called a slice step). Due to the previous preparation of the master step, it is possible to form a semiconductor integrated circuit device in a shorter development period as compared with a general semiconductor integrated circuit device.

FIG. 93 is a top plan view showing the structure of a conventional gate array semiconductor integrated circuit device in a block system. As shown in FIG. 93, input/output buffer regions 4 are arranged to enclose an internal transistor region 3 which is formed by foldedly arranging a portion consisting of a PMOS transistor region 1 and a NMOS transistor region 2 adjacent to each other.

FIG. 94 is a top plan view showing a part 5 of the internal transistor region 3 (it is done up to the master step) in FIG. 93 in an enlarge manner, to illustrate the structure of a basic cell BCP. Referring to FIG. 94, symbols PGP, PSDP and PBDP denote gate electrodes, source/drain electrodes and substrate contact arrangement regions of PMOS transistors respectively. Further, symbols NGP, NSDP and NBDP denote gate electrodes, source/drain electrodes and substrate contact arrangement regions of NMOS transistors respectively. In the figure, marks X show actual contact hole opening portions, and the respective electrodes of the transistors and wiring layers as well as the wiring layers themselves are connected with each other through the portions of the marks X. A portion consisting of one of the gate electrodes PGP and two source/drain electrodes PSDP which are adjacent to the gate electrode PGP forms one PMOS transistor, while a portion consisting of one gate electrode NGP and two source/drain electrodes NSDP which are adjacent to the gate electrode NGP forms one NMOS transistor, respectively. The region BCP which is formed by the PMOS transistor region 1 and the NMOS transistor region 2 is called a basic cell. Such basic cells BCP are repeatedly arranged along a transverse direction 6 (a first direction) while being foldedly arranged along a vertical direction 7 (a second direction), thereby forming the internal transistor region 3 (FIG. 93).

FIGS. 95 and 96 are sectional views taken along broken lines AP-BP and CP-DP in FIG. 94 respectively, showing the gate array semiconductor integrated circuit device in the case of employing a bulk silicon substrate 8. Referring to FIGS. 95 and 96, the first letters N and P of respective symbols indicate N-type and P-type semiconductors respectively, while a plus symbol + indicates a semiconductor concentration, i.e., an impurity concentration. Regions provided with the plus symbol + have high impurity con-

2 centration. When wiring layers and semiconductor layers are connected with each other, the semiconductor layers corresponding to the connecting regions are increased in concentration.

Referring to FIG. 96, symbols NCP and PCP denote channel regions of NMOS and PMOS transistors respectively the NMOS and PMOS transistors are structured on P and N wells 9 and 10 which are formed on a major surface of the bulk silicon substrate 8 respectively. The PMOS transistors are isolated from the NMOS transistors by field oxide films FOP, while the PMOS transistors themselves and the NMOS transistors themselves are also isolated from each other by field oxide films FOP. The field oxide films FOP isolating the PMOS transistors themselves and the NMOS transistors themselves from each other are so opened that N+ and P+ substrate contact arrangement regions PBDP and NBDP are formed from bottom surfaces of the respective openings toward the interior of the corresponding N and P wells 10 and 9. When voltages are applied to the N+ and P+ substrate contact arrangement regions PBDP and NBDP, potentials of channel regions PCP (N-type semiconductors) of the PMOS transistors and those of channel regions NCP (P-type semiconductors) of the NMOS transistors are fixed at the applied voltages through the N and P wells 10 and 9 respectively.

FIG. 97 is a top plan view showing such an example that a slice cell (also called a macro cell) of a CMOS invertor circuit shown in FIG. 98 as an example is arranged on a master (processed up to the master step). As shown in FIG. 97, the N+ contact arrangement region PBDP (FIG. 96) of the PMOS transistor is connected to a wiring layer 12 having a first source potential through a contact 11, whereby the channel regions PCP (FIG. 96) of the PMOS transistors are biased at the first source potential. On the other hand, the P+ substrate contact arrangement region NBDP (FIG. 96) of the NMOS transistor is connected to a wiring layer 13 having a second source potential through the contact 11, whereby the channel regions NCP of the NMOS transistors are biased at the second source potential.

The PMOS transistors are isolated from each other by connecting adjacent gate electrodes to the wiring layer 12 having the first source potential through contacts, while the adjacent PMOS and NMOS transistors are isolated from the each other by connecting adjacent gate electrodes to the wiring layer 13 having the second source potential through the contacts, although such structures are not shown in FIG. 97. In the gate array semiconductor integrated circuit device, several hundred types of such macro cells are generally prepared, to be capable of coping with various semiconductor integrated devices.

On the other hand, MOS transistors which are formed on the surface of a semiconductor layer (SO1 (silicon on insulator) substrate) provided on the surface of a buried oxide film (insulating layer) are noted as new devices since the same can implement low power consumption operations at a high speed with parasitic capacitances which are smaller than those of the MOS transistors formed on the ordinary bulk silicon substrate shown in FIGS. 95 and 96. However, the MOS transistors which are formed on the SOI substrate have such problems that withstand voltages across source/drain electrodes are reduced as compared with those formed on the bulk silicon substrate due to a substrate floating effect of the SOI layers serving as channels of the transistors.

FIG. 99 is a sectional view schematically showing the mechanism of the aforementioned substrate floating effect as to an NMOS transistor, for example. Holes 15 which are generated by impact ionization in the vicinity of a drain electrode 14 are stored in a channel region 17 under a gate electrode 16, to increase the potential of the channel region 17. This induces injection of electrons 19 from a source electrode 18. The electrons 19 injected through the induction reach the vicinity of the drain electrode 14, to newly generate holes 15. Thus, a feedforward loop which is formed by the injection of the electrons 19 and the generation of the holes 15 serves as a factor reducing the withstand voltage across the source/drain electrodes 14 and 18.

In the case of a PMOS transistor, on the other hand, electrons are stored in the channel region to reduce its potential, to deteriorate the withstand voltage of the PMOS transistor, similarly to the above.

Such deterioration of the withstand voltage is severer in the NMOS transistor storing holes, to dominantly influence on deterioration of the withstand voltage of the semiconductor integrated circuit device.

FIGS. 100 and 101 show source-to-drain electrode potential Vds-source-to-drain electrode current Ids characteristics of MOS transistors which are formed on bulk silicon and SOI substrates respectively.

In the case of the MOS transistor which is formed on an SOI substrate, withstand voltages VB1, VB2 and VB3, corresponding to the voltage Vds which is attained when the current Ids is abruptly increased with respect to the source-to-drain electrode voltage Vds, are reduced due to the aforementioned substrate floating effect and, as the result, the source-to-drain electrode current Ids is abruptly increased when the voltage Vds applied across the source/drain electrodes is increased as shown in FIG. 101.

One of methods of preventing the substrate floating effect is that of preventing storage of holes and electrons by fixing the potentials of the channel regions. When this method is applied to the case of driving an integrated circuit device between a first power source and a ground (GND), the channel regions of NMOS and PMOS transistors are fixed at the ground potential and the first source potential respectively, whereby stored holes and electrodes are extracted toward the ground and the first power source respectively.

When the structure (FIGS. 95 and 96) of the conventional gate array semiconductor integrated circuit device which is formed on a bulk silicon substrate is formed on a surface of a buried oxide film 20 as such as shown in FIG. 102 illustrating a conventional gate array which is formed on an SOI substrate as a sectional view taken along the broken line CP-DP in FIG. 94, however, substrate contact arrangement regions PBDP and NBDP and transistor channel regions PCP and NCP are inevitably isolated from each other due to the presence of the buried oxide film 20, and hence the potentials of the channel regions PCP and NCP cannot be fixed. Thus, the aforementioned solving method cannot be implemented.

In order to solve this problem, there has been proposed a method of drawing out an SOI layer from lower portions of gate electrodes PGP and NGP toward substrate contact arrangement regions PBDP and NBDP as shown in FIG. 103, which is drawn as a sectional view taken along the broken line CP-DP in FIG. 94, to thereby fix the potentials of the channel regions PCP, NCP (International Electron Devices Meeting, 1993, 18.5.1–18.5.4, pp. 47-5.478). When this method is applied to the case of driving an integrated circuit device between the first power source and the ground (GND), for example, field shielding gate electrodes FGP are provided as to a PMOS transistor region 1 in a certain basic cell BCP (FIG. 94) and a PMOS transistor region 1 which is adjacent thereto and in relation to an NMOS transistor region 2 in the basic cell BCP and an NMOS transistor region 2 which is adjacent thereto, thereby drawing out respective channel regions PCP and NCP toward substrate contact arrangement regions PBDP and NBDP and forming N-type and P-type regions 21 and 22. Due to the presence of the regions 21 and 22, the channel regions PCP and NCP of PMOS and NMOS transistors are fixed at the first source potential and the ground potential respectively. The field shielding gate electrodes FGP of the PMOS transistor regions are connected to the first power source so that the source/drain electrodes of the PMOS transistors will not conduct through N-type semiconductor layers provided just under the field shielding gate electrodes FGP, while the field shielding gate electrodes FGP of the NMOS transistor regions are connected to the ground so that the source/drain electrodes of the NMOS transistors will not conduct through P-type semiconductor layers provided just under the field shielding gate electrodes FGP. Thus, it is possible to suppress the substrate floating effect, thereby improving the withstand voltage.

In the master structure of the gate array shown in FIG. 103, however, the withstand voltage is disadvantageously reduced when the gate width WP (see FIG. 94) of each transistor is set at a large level. Namely, the gate width WP and the withstand voltage VB are in relation shown in FIG. 104. Even if the potentials of the channel regions are fixed to improve the withstand voltage by the structure shown in FIG. 103, therefore, the withstand voltage may be reduced depending on setting of a desired gate width. Thus, the design range for the gate width is inevitably limited.

Further, the channel regions of the PMOS and NMOS transistors are connected to the first power source and the ground respectively and hence threshold voltages of the transistors turned "on" are at high values by a back gate effect. Thus, the conventional gate array cannot be applied to a semiconductor integrated circuit device which operates at a higher speed.

In the prior art shown in FIG. 103, further, the two techniques of the field shielding gate electrodes FGP and the field oxide films FOP are employed for isolating the transistors from each other, and hence the fabrication process is complicated, leading to increase in cost.

SUMMARY OF THE INVENTION

According to a first aspect of the present invention, a gate array semiconductor integrated device comprises an insulating layer, a semiconductor layer which is formed on an upper major surface of the insulating layer, and N-type and P-type MOS transistors, having gate electrodes in gate length directions and gate width directions corresponding to a first direction and a second direction which is perpendicular to the first direction respectively, are adjacently formed in the semiconductor layer and on its upper major surface through an isolation region, the isolation region is a P-type layer which is formed in the semiconductor layer along the first direction, a P-type extended layer having one end surface bonded to one end surface which is perpendicular to the second direction of a channel region of the N-type MOS transistor and another end surface bonded to one end surface which is perpendicular to the second direction of the isolation region, and which is formed in the semiconductor layer, and an N-type extended layer having one end surface bonded to one end surface which is perpendicular to the second direction of a channel region of the P-type MOS transistor and another end surface bonded to another end surface which is perpendicular to the second direction of the isolation region, and which is formed in the semiconductor layer, a first oxide film covering the semiconductor layer, the isolation region and the N-type and P-type MOS transistors, a subsource line which is formed on an upper major surface of the first oxide film along the first direction and which is at a potential lower than a source potential, another subsource line which is formed on a portion in the upper major surface of the first oxide film and which is just above the isolation region along the first direction, a second oxide film covering the subsource line and the other subsource line, and a main source line which is positioned above the other subsource line, is formed on an upper major surface of the second oxide film along the second direction, has a line width which is set to be larger than a line width of the subsource line, and is at a potential lower than the source potential, the isolation region and the other subsource line are connected with each other through a contact portion which is provided in the first oxide film, the main source line and the subsource line are connected with each other through a contact portion which is provided in the second oxide film, and the main source line and the other subsource line are connected with each other through another contact portion which is provided in the second oxide film.

According to a second aspect of the present invention, the main source line, the subsource line and the other subsource line correspond to a second main source line, a second subsource line and a third subsource line respectively, and the gate array semiconductor integrated circuit device further comprises a first main source line, which is formed on the upper major surface of the second oxide film in parallel with the second main source line along the second direction and has a line width which is set to be equal to the line width of the second main source line, and at the source potential, and a first subsource line, which is formed on the upper major surface of the first oxide film in parallel with the second subsource line along the first direction, and at the source potential, the first main source line and the first subsource line are connected with each other through still another contact portion which is provided in the second oxide film, another P-type extended layer is formed in the semiconductor layer, the another P-type extended layer having one end surface bonded to another end surface which is perpendicular to the second direction of the channel region of the N-type MOS transistor and an upper major surface which is connected with the second subpower source line, and another N-type extended layer is formed in the semiconductor layer, the another N-type extended layer having one end surface bonded to another end surface which is perpendicular to the second direction of the channel region of the P-type MOS transistor and an upper major surface which is connected with the first subsource line.

According to a third aspect of the present invention, the potential which is lower than the source potential is a ground potential, and the ground potential and the source potential are applied to respective source regions of the N-type and P-type MOS transistors through the second and first subsource lines respectively.

According to a fourth aspect of the present invention, an end cell region having an end cell corresponding to a basic cell consisting of the N-type and P-type MOS transistors is formed on each end of a region which is formed by repeatedly arranging the basic cell in the first direction while symmetrically arranging the same to be folded in the second direction, all of the P-type extended layer, the other P-type extended layer, the N-type extended layer and the other N-type extended layer are extended in the semiconductor layer along the first direction to reach the end cell region, a part of the isolation region which is formed along the first direction also defines a part of the end cell, the end cell comprises an end cell P-type semiconductor layer which is formed in the semiconductor layer along the second direction so that one of end surfaces thereof which is perpendicular to the second direction is bonded to one end surface of the part of the isolation region, and an end cell N-type semiconductor layer which is formed in the semiconductor layer along the second direction so that one of end surfaces thereof which is perpendicular to the second direction is bonded to another end surface of the part of the isolation region, one and another end portions of the end cell P-type semiconductor layer are connected with the P-type extended layer and the other P-type extended layer respectively, and one and another end portions of the end cell N-type semiconductor layer are connected with the N-type extended layer and the other N-type extended layer respectively.

According to a fifth aspect of the present invention, a gate array semiconductor integrated device comprises an insulating layer, a semiconductor layer which is formed on an upper major surface of the insulating layer, N-type and P-type MOS transistors, having gate electrodes in gate length directions and gate width directions corresponding to a first direction and a second direction which is perpendicular to the first direction respectively, are adjacently formed in the semiconductor layer and on its upper major surface through an isolation region, the isolation region comprises a P-type isolation region layer which is formed in the semiconductor layer along the first direction, an N-type isolation region layer which is formed in the semiconductor layer along the first direction, and a field oxide film which is formed between one end surface of the P-type isolation region layer and one end surface of the N-type isolation region layer, a P-type extended layer is formed in the semiconductor layer, the P-type extended layer having one end surface bonded to one end surface which is perpendicular to the second direction of a channel region of the N-type MOS transistor and another end surface bonded to another end surface which is perpendicular to the second direction of the P-type isolation region layer, an N-type extended layer is formed in the semiconductor layer, the N-type extended layer having one end surface bonded to one end surface which is perpendicular to the second direction of a channel region of the P-type MOS transistor and another end surface bonded to another end surface which is perpendicular to the second direction of the N-type isolation region layer, a first oxide film covering the semiconductor layer, the isolation region and the N-type and P-type MOS transistors, a first subsource line which is formed on an upper major surface of the first oxide film along the first direction and is at a source potential, a second subsource line which is formed on the upper major surface of the first oxide film along the first direction and is at a potential which is lower than the source potential, a third subsource line which is formed on a portion of the upper major surface of the first oxide film and is just above the P-type isolation region layer along the first direction, a fourth subsource line which is formed on a portion of the upper major surface of the first oxide film and is just above the N-type isolation region layer along the first direction, a second oxide film covering the respective first to fourth subsource lines, a first main source line, which is positioned above the fourth subsource line and formed on an upper major surface of the second oxide film along the second direction with a line width which is set to be larger than those of the first and second subsource lines, and at the source potential, and a second main source line, which is positioned above the third subsource line and formed on the upper major surface of the second oxide film along the second direction with a line width which is set to be larger than those of the first and second subsource lines, and at a potential which is lower than the source potential, the P-type isolation region layer and the third subsource line are connected with each other through a contact portion which is provided in the first oxide film, the N-type isolation region layer and the fourth subsource line are connected with each other through another contact portion which is provided in the first oxide film, the first main source line and the first subsource line are connected with each other through a first contact portion which is provided in the second oxide film, the second main source line and the second subsource line are connected with each other through a second contact portion which is provided in the second oxide film, the second main source line and the third subsource line are connected with each other through a third contact portion which is provided in the second oxide film, and the first main source line and the fourth subsource line are connected with each other through a fourth contact portion which is provided in the second oxide film.

According to a sixth aspect of the present invention, an end cell region having an end cell corresponding to a basic cell consisting of the N-type and P-type MOS transistors is formed on each end of a region which is formed by repeatedly arranging the basic cell in the first direction while symmetrically arranging the same to be folded in the second direction, all of the P-type extended layer, the other P-type extended layer, the N-type extended layer and the other N-type extended layer are extended in the semiconductor layer along the first direction to reach the end cell region, a part of the isolation region which is formed along the first direction also defines a part of the end cell, the end cell comprises an end cell P-type semiconductor layer which is formed in the semiconductor layer along the second direction so that one of end surfaces thereof which is perpendicular to the second direction is bonded to another end surface of a part of the P-type isolation region layer, and an end cell N-type semiconductor layer which is formed in the semiconductor layer along the second direction so that one of end surfaces thereof which is perpendicular to the second direction is bonded to another end surface of a part of the N-type isolation region layer, one and another end portions of the end cell P-type semiconductor layer are connected with the P-type extended layer and the other P-type extended layer respectively, and one and another end portions of the end cell N-type semiconductor layer are connected with the N-type extended layer and the other N-type extended layer respectively.

According to a seventh aspect of the present invention, the potential which is lower than the source potential is a ground potential, and the ground potential and the source potential are applied to respective source regions of the N-type and P-type MOS transistors through the second and first subsource lines respectively.

According to an eighth aspect of the present invention, a gate array semiconductor integrated circuit device comprises an insulating layer, a semiconductor layer which is formed on an upper major surface of the insulating layer, N-type and P-type MOS transistors are formed in the semiconductor layer and on its upper major surface, a gate circuit portion including the N-type and P-type MOS transistors and operating through operating power sources of a first source potential and a second source potential which is lower than the first source potential, wherein a back gate potential of either the N-type or P-type MOS transistor is set at a potential which is lower than the first source potential and higher than the second source potential.

According to a ninth aspect of the present invention, a gate array semiconductor integrated circuit device comprises an insulating layer, a semiconductor layer which is formed on an upper major surface of the insulating layer, N-type and P-type MOS transistors are formed in the semiconductor layer and on its upper major surface, a gate circuit portion including the N-type and P-type MOS transistors and operating through operating power sources of a first source potential and a second source potential which is lower than the first source potential, wherein a back gate potential of the P-type MOS transistor is set at a third potential which is lower than the first source potential and higher than the second source potential, and a back gate potential of the N-type MOS transistor is set at a fourth potential which is lower than the first source potential and higher than the second source potential.

According to a tenth aspect of the present invention, a gate array semiconductor integrated circuit device comprises an insulating layer, a semiconductor layer which is formed on an upper major surface of the insulating layer, a first source wiring layer, being at a first source potential, which is formed on an upper major surface of the semiconductor layer, a second source wiring layer, being at a second potential being lower than the first source potential, which is formed on the upper major surface of the semiconductor layer, N-type and P-type MOS transistors, having gate electrodes in gate length directions and gate width directions corresponding to a first direction and a second direction which is perpendicular to the first direction respectively, are adjacently formed in the semiconductor layer and on its upper major surface through an isolation region, the isolation region is formed in the semiconductor layer along the first direction, a P-type extended layer is formed in the semiconductor layer along the first direction, the P-type extended layer having one end surface bonded to one end surface which is perpendicular to the second direction of a channel region of the N-type MOS transistor and another end surface bonded to one end surface which is perpendicular to the second direction of the isolation region, another P-type extended layer is formed in the semiconductor layer, the another P-type extended layer having one end surface bonded to another end surface which is perpendicular to the second direction of the channel region of the N-type MOS transistor and an upper major surface connected with the second source wiring layer, an N-type extended layer is formed in the semiconductor layer along the first direction, the N-type extended layer having one end surface bonded to one end surface which is perpendicular to the second direction of a channel region of the P-type MOS transistor and another end surface bonded to another end surface which is perpendicular to the second direction of the isolation region, another N-type extended layer is formed in the semiconductor layer, the another N-type extended layer having one end surface bonded to another end surface which is perpendicular to the second direction of the channel region of the P-type MOS transistor and an upper major surface connected with the first source wiring layer, and an end cell region having an end cell corresponding to a basic cell consisting of the N-type and P-type MOS transistors, the end cell region is formed on each end of a region which is formed by repeatedly arranging the basic cell in the first direction while symmetrically arranging the same to be folded in the second direction, wherein all of said P-type extended layer, said another P-type extended layer, said N-type extended layer and said another N-type extended layer are extended in said semiconductor layer along said first direction to reach said end cell region, a part of the isolation region which is formed along the first direction also defines a part of the end cell, the end cell comprises an end cell P-type semiconductor layer which is formed in the semiconductor layer along the second direction so that one of end surfaces thereof which is perpendicular to the second direction is bonded to one end surface of the part of the isolation region, and an end cell N-type semiconductor layer which is formed in the semiconductor layer along the second direction so that one of end surfaces thereof which is perpendicular to the second direction is bonded to another end surface of the part of the isolation region, one and another end portions of the end cell P-type semiconductor layer are connected to the P-type extended layer and the other P-type extended layer respectively, and one and another end portions of the end cell N-type semiconductor layer are connected to the N-type extended layer and the other N-type extended layer respectively.

According to an eleventh aspect of the present invention, the isolation region comprises a field oxide film which is formed on the upper major surface of the insulating layer.

According to a twelfth aspect of the present invention, the isolation region consists essentially of only the field oxide film.

According to a thirteenth aspect of the present invention, a P-type MOS transistor field shielding gate electrode is formed on an upper major surface of the P-type extended layer along the first direction through an insulating film, an N-type MOS transistor field shielding gate electrode is formed on an upper major surface of the N-type extended layer along the first direction through the insulating film, parts of the insulating film and the P-type MOS transistor field shielding gate electrode extending in the first direction are successively formed on an upper major surface of the end cell P-type semiconductor layer respectively, and another part of the insulating film and a part of the N-type MOS transistor field shielding gate electrode both extending in the first direction are successively formed on an upper major surface of the end cell N-type semiconductor layer respectively.

According to a fourteenth aspect of the present invention, a part of an upper major surface of the P-type MOS transistor field shielding gate electrode is connected to the first source wiring layer.

According to a fifteenth aspect of the present invention, an insulating film having a thickness capable of preventing implantation of impurity ions is formed on the upper major surfaces of the P-type and N-type extended layers along the first direction, and a part of the insulating film extending in the first direction is formed on upper major surfaces of the end cell P-type and N-type semiconductor layers.

According to a sixteenth aspect of the present invention, the isolation region comprises P-type and N-type isolation region layers which are formed in the semiconductor layer to be opposed to each other through the field oxide film, the one end surface of the isolation region corresponds to that, which is not opposed to the N-type isolation region layer, of both end surfaces of the P-type isolation region layer in relation to the second direction, and the other end surface of the isolation region corresponds to that, which is not opposed to the P-type isolation region layer, of both end surfaces of the N-type isolation region layer in relation to the second direction.

According to a seventeenth aspect of the present invention, the isolation region is a layer of a prescribed conductivity type which is formed in the semiconductor layer.

According to an eighteenth aspect of the present invention, the isolation region is the semiconductor layer of an N-type conductivity.

According to a nineteenth aspect of the present invention, the isolation region is semiconductor layer of a P-type conductivity.

According to a twentieth aspect of the present invention, the isolation region is connected with the second source wiring layer.

According to a twenty-first aspect of the present invention, a method of fabricating a gate array semiconductor integrated circuit device comprises a first step of successively forming an SOI layer and a silicon oxide film on an upper major surface of an insulating layer, a second step of forming a silicon nitride film having a prescribed opening on an upper major surface of the silicon oxide film, and forming a field oxide film by selective oxidation in a portion just under the prescribed opening so that a bottom surface of the field oxide film is defined by the upper major surface of the insulating layer, a third step of forming channel regions of N-type and P-type MOS transistors in one and another portions of the SOI layer which are isolated by the field oxide film respectively, a fourth step of successively forming a field shielding gate electrode layer and an oxide film for covering the field oxide film and the silicon oxide film and etching the oxide film, the field shielding gate electrode layer, the silicon oxide film and the field oxide film through a resist material which is patterned by photolithography, thereby forming field shielding gate electrodes which are held by the oxide film and the silicon oxide film after the etching on both side positions of the field oxide film after the etching and a prescribed position, a fifth step of forming respective gate oxide films and gate electrodes on the channel regions of the P-type and N-type MOS transistors respectively, a sixth step of forming a source/drain region of the N-type MOS transistor in one portion of the SOI layer by ion implantation and a seventh step of forming a source/drain region of the P-type MOS transistor in the another portion of the SOI layer by another ion implantation.

According to a twenty-second aspect of the present invention, the sixth step comprises a step of forming a P-type semiconductor layer by the ion implantation also in one portion of the SOI layer which is just under a space between the field oxide film and the field shielding gate electrode of the N-type MOS transistor side which is adjacent to the field oxide film, and the seventh step comprises a step of forming an N-type semiconductor layer by the other ion implantation also in another portion of the SOI layer which is just under a space between the field oxide film and the field shielding gate electrode of the P-type MOS transistor side which is adjacent to the field oxide film.

According to a twenty-third aspect of the present invention, a method of fabricating a gate array semiconductor integrated circuit device comprises a first step of successively forming an SOI layer and a silicon oxide film on an upper major surface of an insulating layer, a second step of forming channel regions of N-type and P-type MOS transistors in one and another portions in the SOI layer respectively, a third step of successively forming a field shielding gate electrode layer and an oxide film on an upper major surface of the silicon oxide film and further performing etching of the oxide film, the field shielding gate electrode layer and the silicon oxide film through a resist material which is patterned by photolithography, thereby forming field shielding gate electrodes which are held by the oxide film and the silicon oxide film after the etching on a first region of an upper major surface of the SOI layer corresponding to a portion above one end of the channel region of the N-type MOS transistor which is bonded with the channel region of the P-type MOS transistor and a second region in the upper major surface of the SOI layer which is separated from the first region toward the N-type MOS transistor by a first space while repeatedly forming two the field shielding gate electrodes which are formed on the first and second regions also toward the N-type and P-type MOS transistors at second spaces, a fourth step of forming respective gate oxide films and gate electrodes on the channel regions of the respective N-type and P-type MOS transistors, a fifth step of forming a source/drain region of the N-type MOS transistor in the one portion in the SOI layer by ion implantation, and a sixth step of forming a source/drain region of the P-type MOS transistor in the other portion in the SOI layer by another ion implantation.

According to a twenty-fourth aspect of the present invention, the sixth step comprises a step of forming a P-type semiconductor layer also in the other portion in the SOI layer just under a portion held by the first and second regions by the other ion implantation.

According to a twenty-fifth aspect of the present invention, a method of fabricating a gate array semiconductor integrated circuit device comprises a first step of successively forming an SOI layer and a silicon oxide film on an upper major surface of an insulating layer, a second step of forming a silicon nitride film having a prescribed opening on an upper major surface of the silicon oxide film and forming a field oxide film by selective oxidation in a portion just under the prescribed opening so that a bottom surface of the field oxide film is defined by the upper major surface of the insulating film, a third step of forming channel regions of N-type and P-type transistors in one SOI layer and another SOI layer which are isolated from each other by the field oxide film respectively, a fourth step of forming an oxide film having a thickness capable of inhibiting implantation of impurity ions to cover the field oxide film and the silicon oxide film and performing patterning employing photolithography and etching of the oxide film, the silicon oxide film and the field oxide film, thereby forming new oxide films consisting essentially of the silicon oxide film and the oxide film after the etching on both side positions of the field oxide film after the etching and a prescribed position on the upper major surface of the SOI layer to project beyond the field oxide film after the etching, a fifth step of forming respective gate oxide films and gate electrodes on the respective channel regions of the N-type and P-type MOS transistors, a sixth step of forming a source/drain region of the N-type MOS transistor in the one SOI layer by ion implantation, and a seventh step of forming a source/drain region of the P-type MOS transistor in the other SOI layer by another ion implantation.

Accordingly, a first object of the present invention is to implement a gate array semiconductor integrated circuit device formed on an SOI substrate, which can be used under a higher source voltage upon setting of a gate width at a large level through further improvement of the withstand voltage, i.e., Vds-Ids characteristics, and a method of fabricating the same. In other words, the present invention is aimed at enlarging the design range of the gate width by attaining improvement of the withstand voltage.

A second object of the present invention is to implement a gate array semiconductor integrated circuit device formed on an SOI substrate, which can operate at a higher speed than the conventional one by suppressing a back gate effect.

A third object of the present invention is to implement a gate array semiconductor integrated circuit device formed on an SOI substrate, which can be implemented through a simpler fabrication process than the conventional one, and a method of fabricating the same.

A fourth object of the present invention is to implement a gate array semiconductor integrated circuit device formed on an SOI substrate, which can attain improvement of the withstand voltage in the case of a multilayer metal wire structure.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 69(a) and 69(b) illustrate still another invertor gates of the present invention;

DESCRIPTION OF THE PREFERRED EMBODIMENTS

Figure 103:
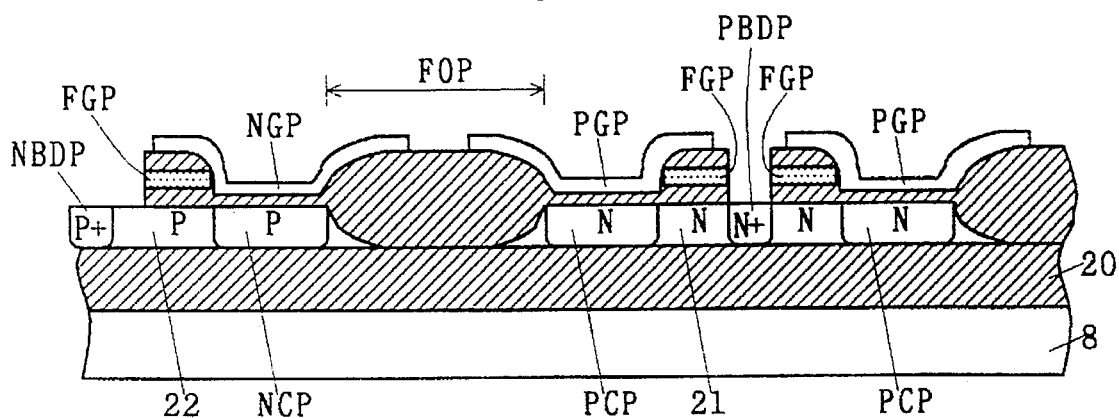
FIG. 103 illustrates a conventional gate array employing field shielding gate electrodes.
Figure 104:
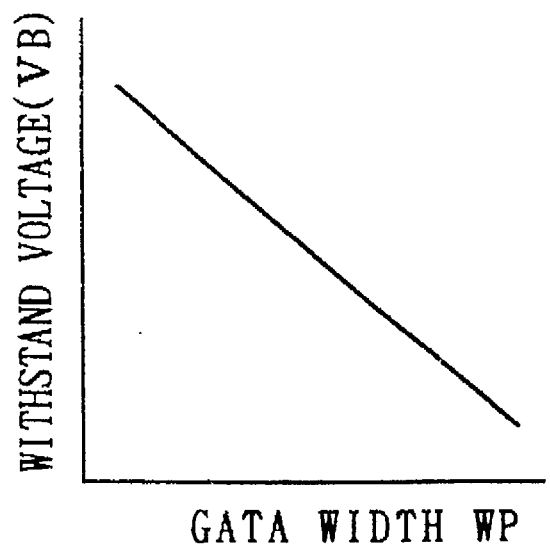
FIG. 104 illustrates the relation between a withstand voltage and a gate width.

As hereinabove described, the gate array semiconductor integrated circuit device shown FIG. 103 has such a problem that its withstand voltage is reduced as the gate width is enlarged. This is conceivably because holes and electrons which are generated in the vicinity of the other end of each gate electrode cannot be efficiently extracted as the gate width is increased in length since each substrate contact arrangement region is arranged only on one side of the gate electrode as shown in FIG. 103, and hence the amount of storage of these carriers in each channel region is increased. According to the present invention, therefore, respective preferred embodiments hereafter described are proposed in consideration of this point.

(First Preferred Embodiment)

Figure 1:
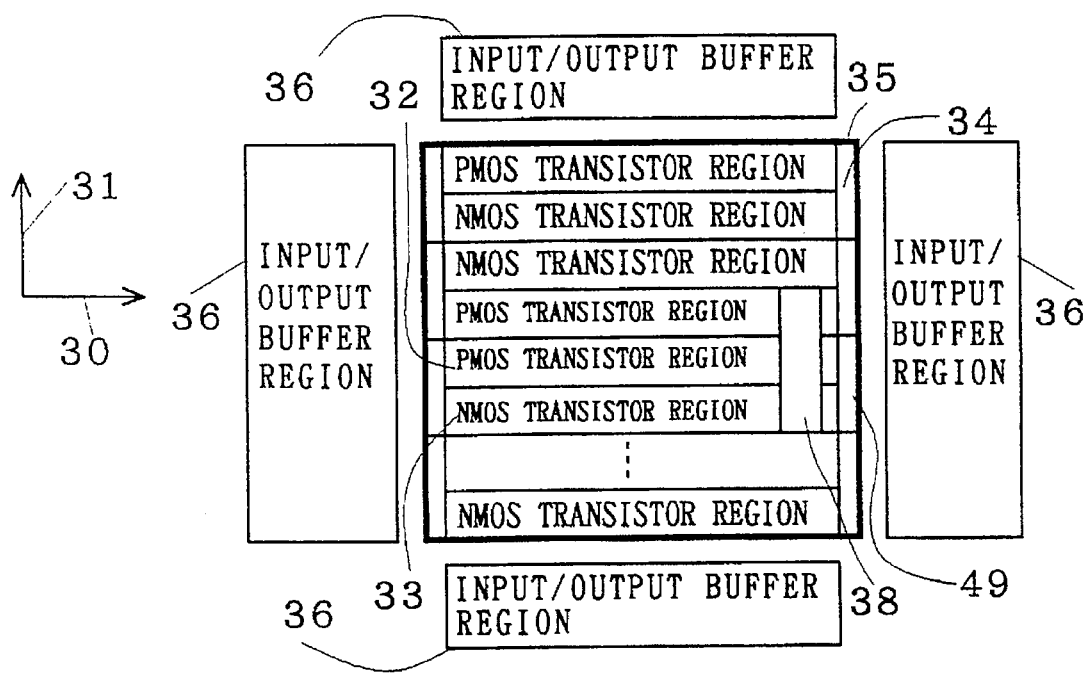
FIG. 1 illustrates a gate array semiconductor integrated circuit device according to a first preferred embodiment of the present invention.

FIG. 1 is a top plan view showing the structure of a gate array semiconductor integrated circuit device which is formed on an SOI (silicon on insulator) substrate in a block system. As shown in FIG. 1, an end cell region 34 (a second region) is formed on each end of a first region which is formed by repeatedly arranging a basic cell formed by a PMOS transistor region 32 and a NMOS transistor region 33 in a transverse direction 30 (a first direction) while symmetrically arranging the same to be folded in a longitudinal direction 33 (a second direction). An internal transistor region 35 is formed by the first region consisting of a set of the PMOS transistor regions 32 and the NMOS transistor regions 33 and the end cell regions 34. Further, input/output buffer regions 36 are arranged around the internal transistor region 35, to enclose the same.

The aforementioned first and second directions 30 and 31 correspond to gate length directions and gate width directions of the respective MOS transistors respectively.

Figure 2:
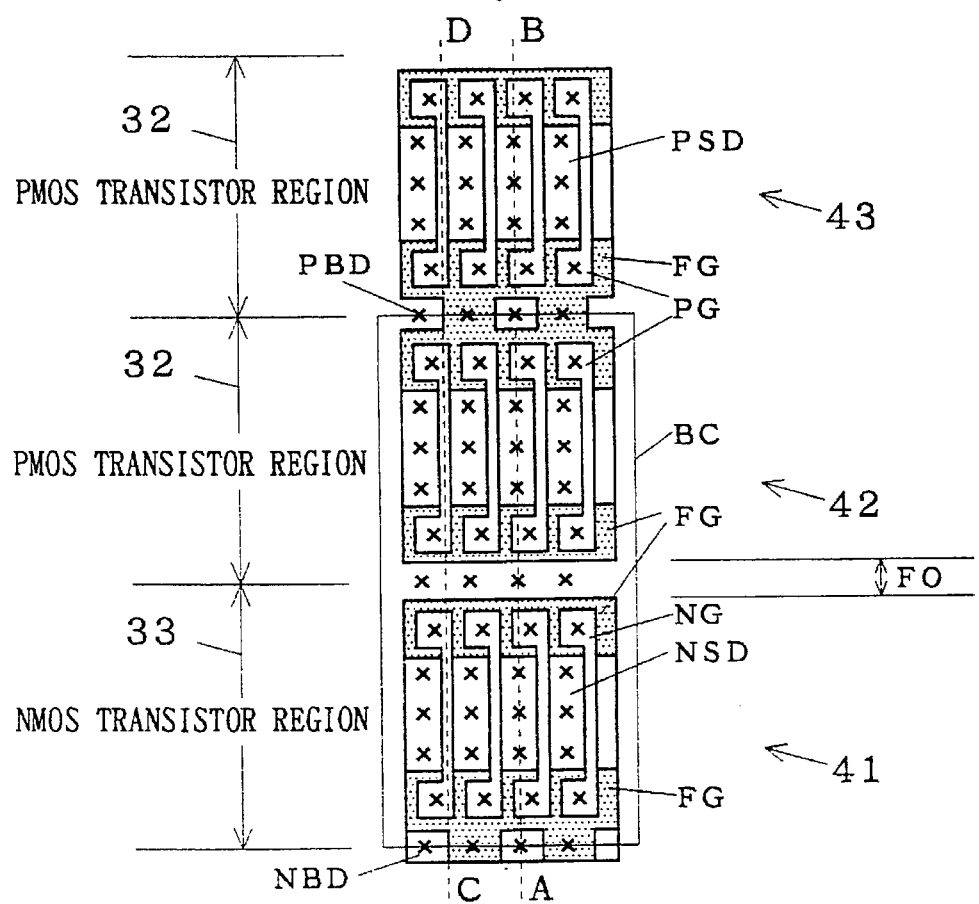
FIG. 2 illustrates a basic cell according to the first preferred embodiment of the present invention.
Figure 3:
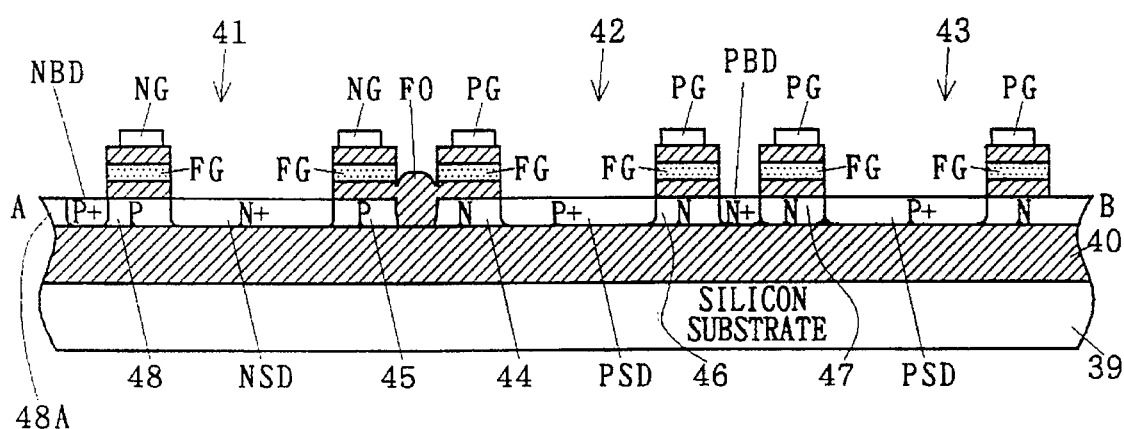
FIG. 3 is a sectional view taken along the broken line A-B in FIG. 2.
Figure 4:
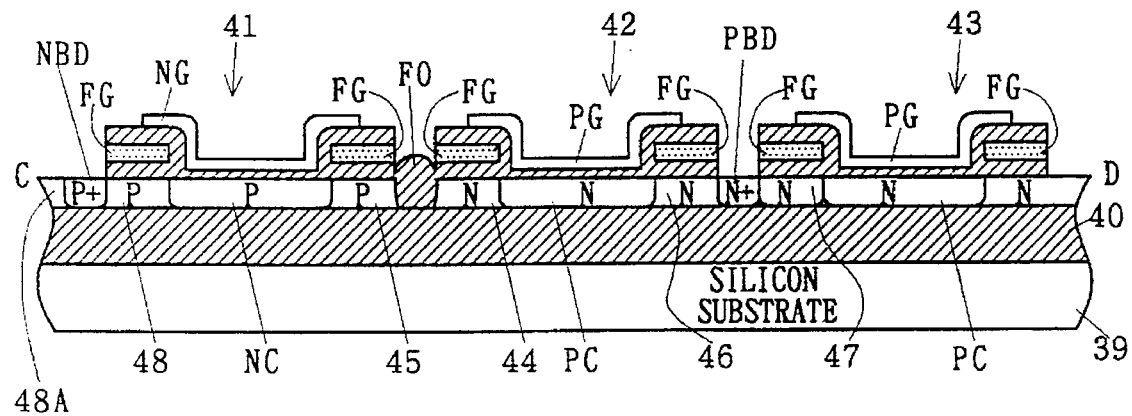
FIG. 4 is a sectional view taken along the broken line C-D in FIG. 2.

FIG. 2 is a top plan view showing a partial region 38 (this region 38 has been processed up to a master step) of the internal transistor region 35 in FIG. 1 in an enlarged manner, for illustrating the structure of the basic cell BC. Referring to FIG. 2, respective symbols denote the following elements: Symbols PG, PSD and PBD denote gate electrodes, source/drain electrodes, and substrate contact arrangement regions of the PMOS transistors respectively. On the other hand, symbol NG, NSD and NBD denote gate electrodes, source/drain electrodes, and substrate contact arrangement regions of the NMOS transistors respectively. Further, symbol FG denotes field shielding gate electrodes. A gate electrode PG and two source/drain electrodes PSD which are adjacent to this gate electrode PG form one PMOS transistor, while a gate electrode NG and two source/drain electrodes NSD which are adjacent to this gate electrode NG form one NMOS transistor. A region BC which is formed by the PMOS transistor region 32 and the NMOS transistor region 33 is called a basic cell. Such basic cells BC are repeatedly arranged in the transverse direction 30 (the first direction), and symmetrically arranged to be folded in the longitudinal direction 31 (the second direction), whereby the internal transistor region 35 is formed along with each end cell region 35, as described above. FIGS. 3 and 4 are sectional views taken along the broken lines A-B and C-D in FIG. 2 respectively. Referring to FIGS. 3 and 4, the first letters N and P of the respective symbols denote N-type and P-type semiconductors respectively, while a plus symbol + indicates semiconductor concentration, i.e., concentration of impurity concentration. Regions provided with the plus symbol + have high impurity concentration. When wiring layers and semiconductor layers are connected with each other, the semiconductor layers corresponding to the connecting regions are increased in concentration. Referring to FIG. 4, symbols NC and PC denote channel regions of NMOS and PMOS transistors respectively. A semiconductor layer (SOI) is formed on an upper major surface of a buried oxide film 40 (corresponding to an insulating layer) which is formed on an upper major surface of a silicon substrate 39, so that an NMOS transistor 41 and PMOS transistors 42 and 43 are formed on this semiconductor layer (SOI). The PMOS transistor 42 and the NMOS transistor 41 are isolated from each other by an N-type semiconductor layer 44 (corresponding to an N-type extended layer) which is positioned just under the field shielding gate electrode FG, a field oxide film FO, and a P-type semiconductor layer 45 (corresponding to a P-type extended layer) which is positioned just under the field shielding gate electrode FG. Namely, isolation between the transistors 41 and 42 is achieved by the field oxide film FO serving as a LOCOS film. The film FO forms an isolation region in this case. On the other hand, the PMOS transistors 42 and 43 are isolated from each other by N-type semiconductor layers 46 and 47, while the NMOS transistor 41 is isolated from another NMOS transistor which is adjacent thereto by P-type semiconductor layers 48 and 48A respectively (the N-type semiconductor layer 46 and the P-type semiconductor layer 48 correspond to another N-type extended layer and another P-type extended layer respectively). Both of the field shielding gate electrodes FG which are arranged between the PMOS transistors 42 and 43 and between the NMOS transistor 41 and that adjacent thereto are opened, so that N+ and P+ substrate contact wiring regions PBD and NBD are formed from bottom surfaces of the respective openings toward the interior of the SOI layer respectively. When voltages are applied to the N+ and P+ substrate contact wiring regions PBD and NBD, potentials of the respective channel regions (N-type semiconductors) of the PMOS transistors 42 and 43 and the channel regions NC (P-type semiconductor) of the NMOS transistor 41 etc. are fixed to the aforementioned applied corresponding voltages respectively.

Figure 5:
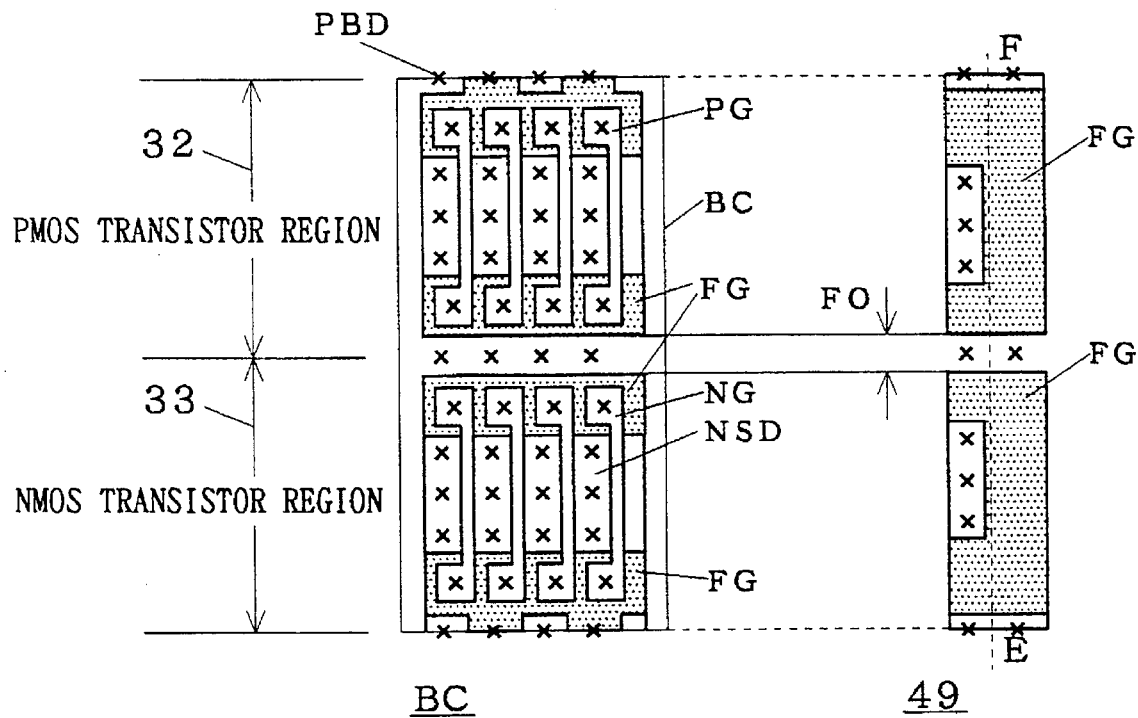
FIG. 5 illustrates the structure of an end cell according to the first preferred embodiment of the present invention.
Figure 6:
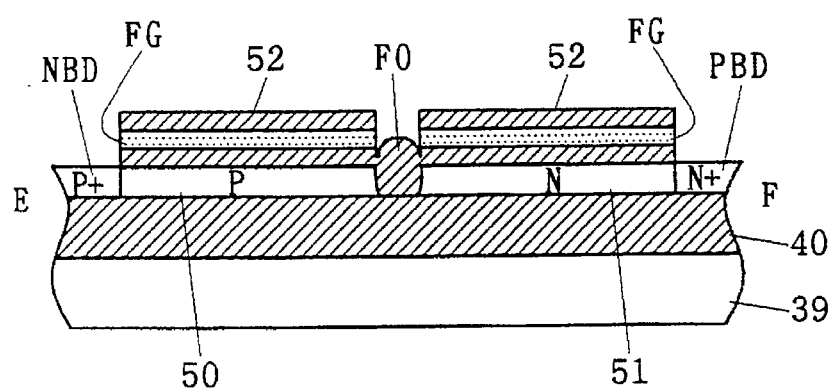
FIG. 6 is a sectional view taken along the broken line E-F in FIG. 5.

FIG. 5 shows a plan view of an end cell 49 of FIG. 1 along with the basic cell BC, and FIG. 6 is a sectional view taken along the broken line E-F in FIG. 5. In correspondence to the structures of the NMOS transistor 41 and the PMOS transistor 42 shown in FIGS. 3 and 4, the end cell 49 has an end cell P-type semiconductor layer 50, an end cell N-type semiconductor layer 51, a field oxide film FO, field shielding gate electrodes FG, insulating films 52, and substrate contact arrangement regions PBD and NBD. Each end cell region 34 shown in FIG. 1 is formed by arranging the end cell 49 shown in FIGS. 5 and 6 to be folded along the second direction 31 shown in FIG. 2.

In the following description and also in description of other preferred embodiments, the end cell P-type and N-type semiconductor layers are simply referred to as P-type and N-type semiconductor layers respectively.

The respective concepts of the aforementioned "N-type extended layer", "another N-type extended layer", "P-type extended layer" and "another P-type extended layer" are also similarly employed as to corresponding ones in the following preferred embodiments. The "another N-type extended layer" is a concept including the substrate contact arrangement region PBD, and the "another P-type extended layer" is also a concept including the substrate contact arrangement region NBD.

Thus, the end cell region 34 is formed on each end of the first region which is formed by repeatedly arranging the basic cells BC in the first direction while symmetrically arranging the same to be folded in the second direction, whereby the N-type semiconductor layers 44 and 46 provided on both ends of the PMOS transistor 42 are connected with each other through the substrate contact arrangement region PBD and the N-type semiconductor layer 51 of the end cell 49, while the P-type semiconductor layers 45 and 48 provided on both ends of the NMOS transistor 41 are also connected with each other through the substrate contact arrangement region NBD and the p-type semiconductor layer 50. Thus, carriers crosswisely developed in the vicinity of both sides of the gate electrodes PG and NG are efficiently extracted through a new path via the end cell 49 connected with the substrate contact arrangement regions PBD and NBD, whereby the withstand voltage is improved.

Figure 7:
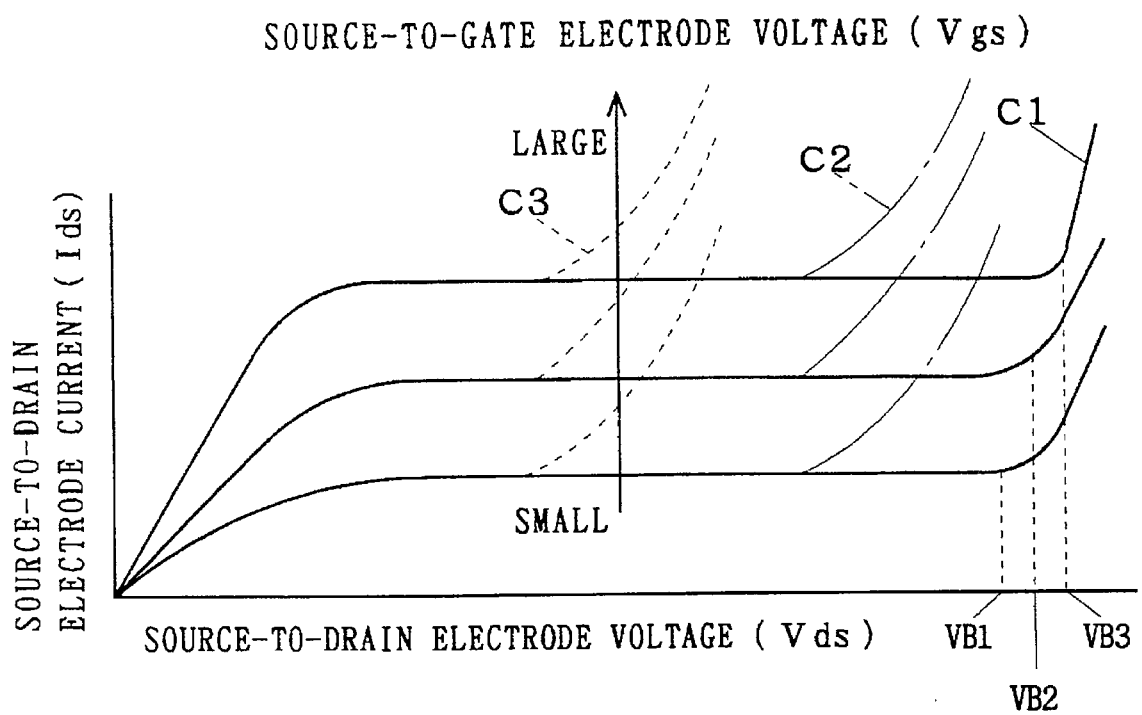
FIG. 7 illustrates an effect of the present invention.

FIG. 7 shows this point as Vds-Ids characteristics. Referring to FIG. 7, solid curves C1 show the characteristics of the first preferred embodiment, while chained curves C2 and broken curves C3 show the characteristics of the structure shown in FIG. 103 and the case of not fixing potentials of channel regions. According to this first preferred embodiment, withstand voltages VB1 to VB3 are increased to remarkably high voltage values.

Figure 8:
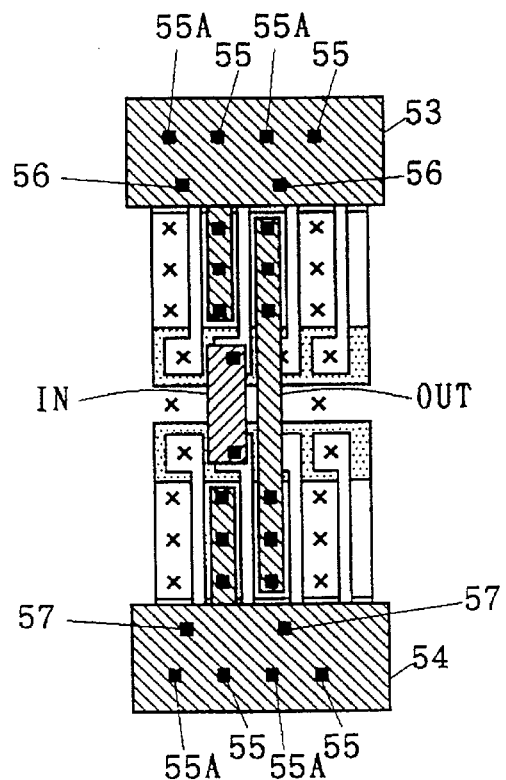
FIG. 8 illustrates slice cell arrangement in the first preferred embodiment of the present invention.

FIG. 8 is a plan view showing a slice cell of the CMOS invertor circuit shown in FIG. 6 which is arranged on a master, for example. The channel region PC of the PMOS transistor 42 (FIG. 4) is connected to a wiring layer 53 of a first power source through the N-type semiconductor layer 46 which is positioned just under the field shielding gate electrode FG and the substrate contact arrangement region PBD which is bonded to the same. Further, the channel region NC of the NMOS transistor 41 (FIG. 4)is connected to a wiring layer 54 of a second power source through the P-type semiconductor layer 48 which is positioned just under the field shielding gate electrode FG and the substrate contact arrangement region NBD which is bonded to the same. The channel regions PC of the PMOS transistors 42 and 43 are connected to the wiring layer 53 of the first power source through the N-type semiconductor layers 46 and 47 and the substrate contact arrangement region PBD. Thus, the channel regions PC and NC are biased to first and second source potentials respectively. At this time, each channel region PC (NC) is drawn out in the second direction 31 shown in FIG. 1 beyond both ends of the gate electrode PG (NG) due to the presence of the field shielding gate electrode FG, while the semiconductor layer 44 (45) which is provided just under the field shielding gate electrode FG is connected to the substrate contact arrangement region PBD (NBD) by the end cell 34 (49) (FIG. 1). At this time, through contacts 55 (FIG. 8) which are arranged on the upper major surfaces of the field shielding gate electrodes FG, the field shielding gate electrodes FG in the PMOS transistors 42 and 43 are fixed at the first source potential, while the field shielding electrode FG in the NMOS transistor 41 is fixed at the second source potential. Further, the PMOS and NMOS transistors 42 and 41 are isolated from the adjacent PMOS and NMOS transistors in the basic cell BC by connecting the adjacent gate electrodes in the basic cell BC to the wiring layers 53 and 54 of the first and second power sources through contacts 56 and 57 respectively, as shown in FIG. 8.

Contacts 55A shown in FIG. 8 are adapted to connect the region PBD (NBD) to the wiring layer 53 of the first power source (the wiring layer 54 of the second power source).

Principal steps of fabricating the gate array semiconductor integrated circuit are now described.

Figure 9:
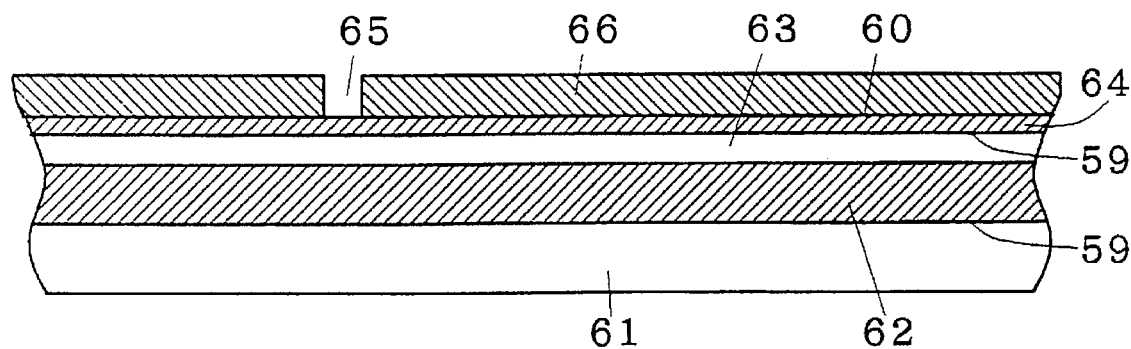
FIGS. 9 to 21 are sectional views showing a fabrication step according to the first preferred embodiment of the present invention.

With reference to a sectional view shown in FIG. 9, a buried oxide film 62 (an insulating layer) and an SOI layer 63 are first successively formed on an upper major surface 58 of a silicon substrate 61. Then, a silicon oxide film 64 (an insulating film) is formed on an upper major surface 59 of the SOI layer 63 by thermal oxidation. Thereafter, a silicon nitride film 66 having a prescribed opening 65 is formed on an upper major surface 60 of the silicon oxide film 64.

Figure 10:
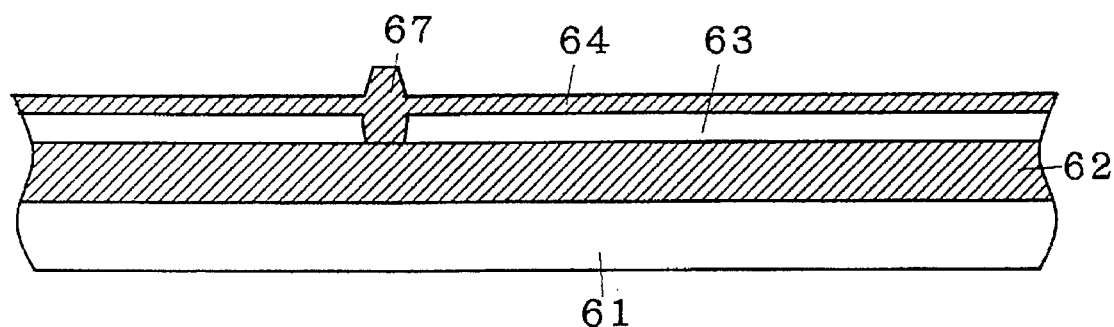

Referring to FIG. 10, a field oxide film 67 is formed by selective oxidation, and the nitride film 66 is removed. At this time, the field oxide film 67 is so formed that its lower surface reaches the upper major surface of the buried oxide film 62.

Figure 11:
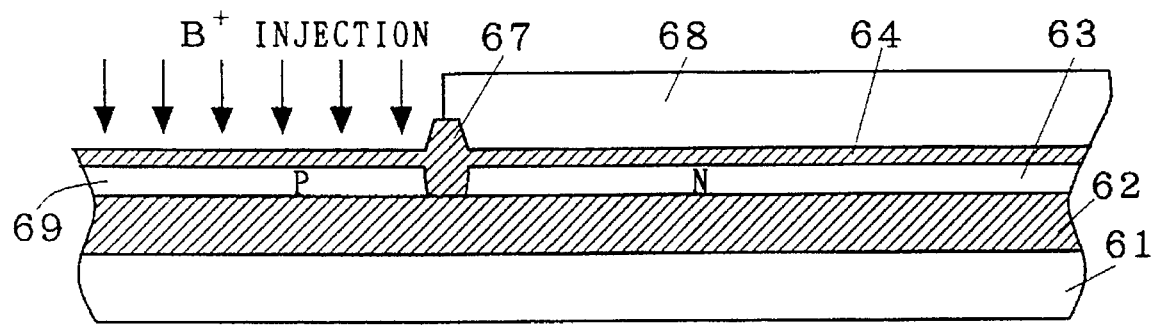

Referring to FIG. 11, a resist material 68 is applied to open a PMOS transistor formation region by photolithography, and boron, for example, is injected to form a channel region 69 of a PMOS transistor.

Figure 12:
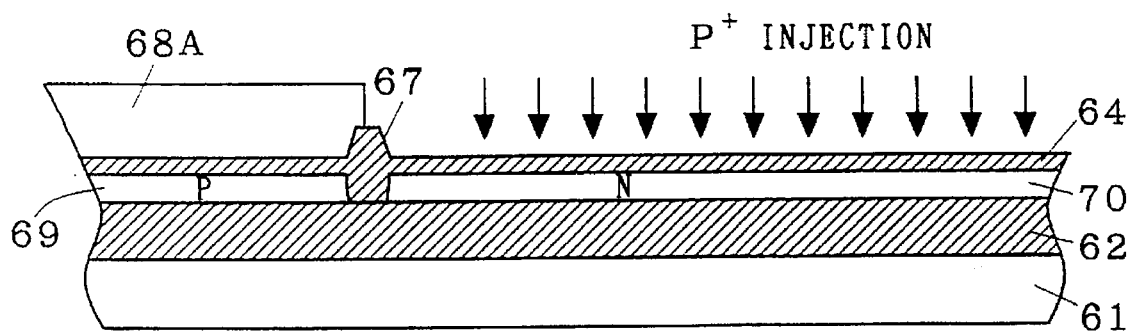

Referring to FIG. 12, another resist material 68A is applied to open an NMOS transistor formation region by photolithography, and phosphorus, for example, is injected to form a channel region 70 of an NMOS transistor.

Figure 13:
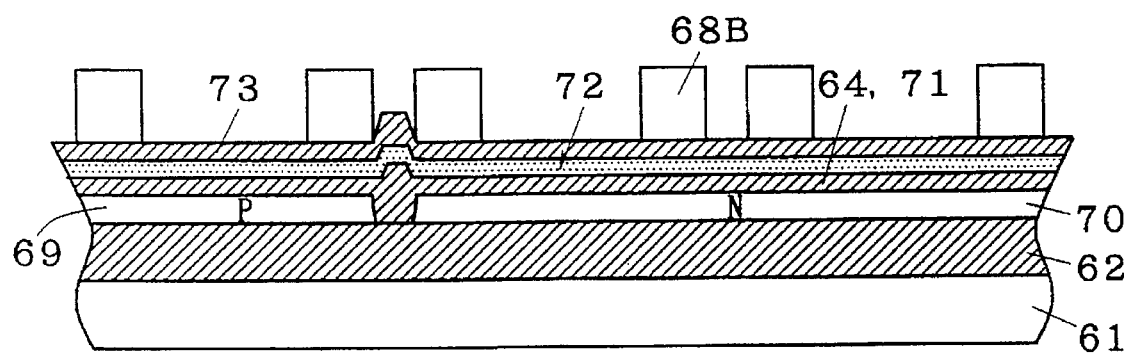
Figure 14:
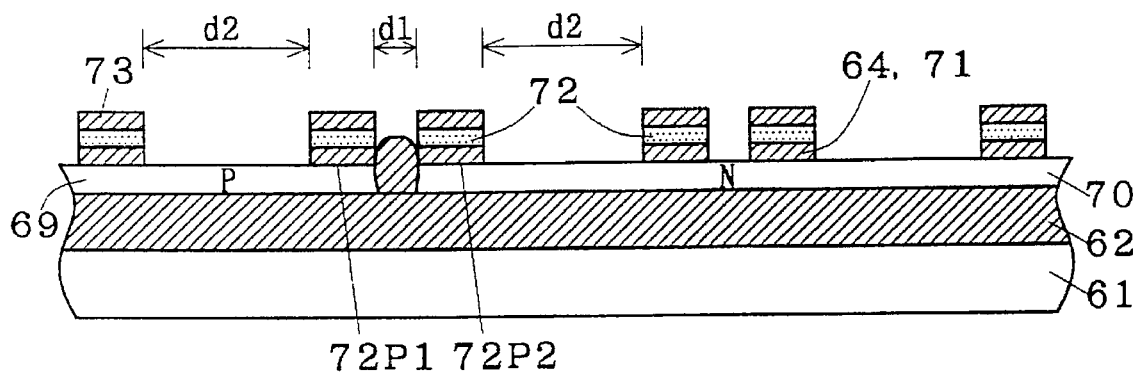

Referring to FIG. 13, an oxide film 71, a polysilicon layer 72 for field shielding gate electrodes FG and an oxide film 73 are formed while resist materials 68B are patterned into prescribed shapes by photolithography, and thereafter the polysilicon layer 72 for field shielding electrodes is etched to obtain desired field shielding gate electrodes 72 shown in FIG. 14.

Namely, the field shielding gate electrodes 72 (FG) which are held between the oxide films are formed on a first region 72P1 (a region on the upper major surface of the SOI layer on the NOS transistor side) and a second region 72P2 (a region on the upper major surface of the SOI layer on the PMOS transistor side) which are positioned on both sides of the field oxide film 67 (FO). A first space d1 is the distance between the first and second regions 72P1 and 72P2. The aforementioned pattern of the field shielding gate electrode 72 (FG) is formed every region separated from the first and second regions 72P1 and 72P2 to the NMOS and PMOS transistor sides by a second space d2.

Figure 15:
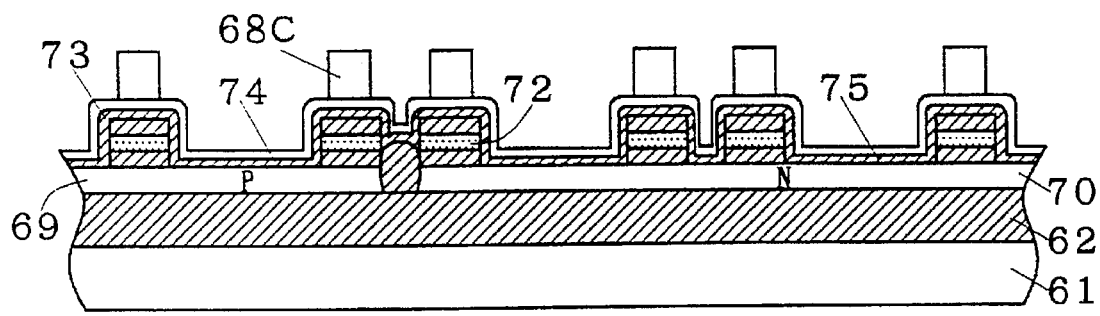
Figure 16:
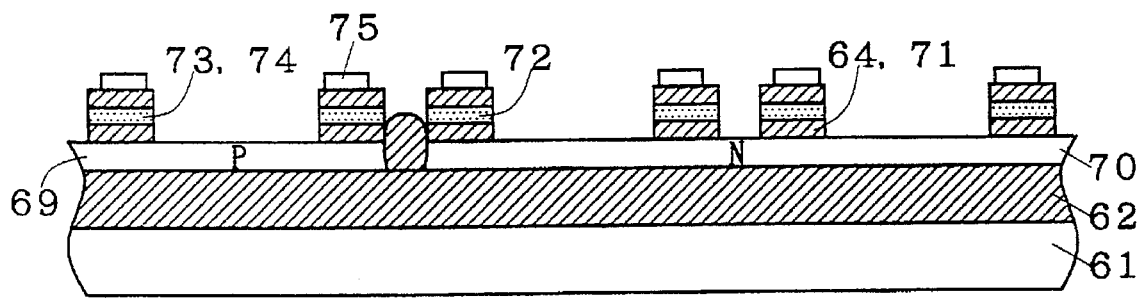

Referring to FIG. 15, a gate oxide film 74 and a gate electrode 75 are formed and then patterned and etched into prescribed shapes shown in FIG. 16. FIGS. 16 to 21 are sectional views taken along the broken line A-B in FIG. 2.

Figure 17:
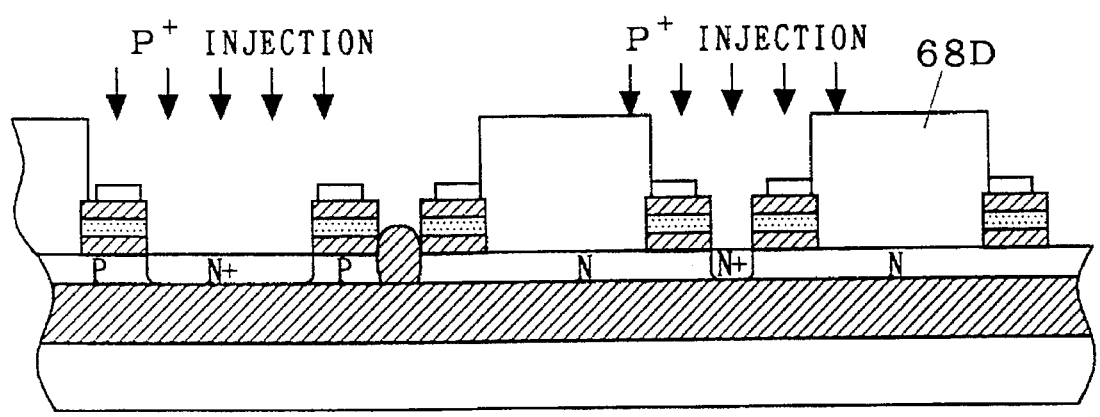

Referring to FIG. 17, resist materials 68D are applied to open a source/drain electrode NSD (FIG. 3) of the NMOS transistor and a substrate contact formation region PBD (FIG. 3) of the PMOS transistor, and phosphorus, for example, is injected. At this time, injection of phosphorus into the semiconductor layer which is positioned just under the gate electrodes 75 and the field shielding gate electrodes 72 of the transistors is inhibited through these electrodes 72 and 75 serving as masks.

Figure 18:
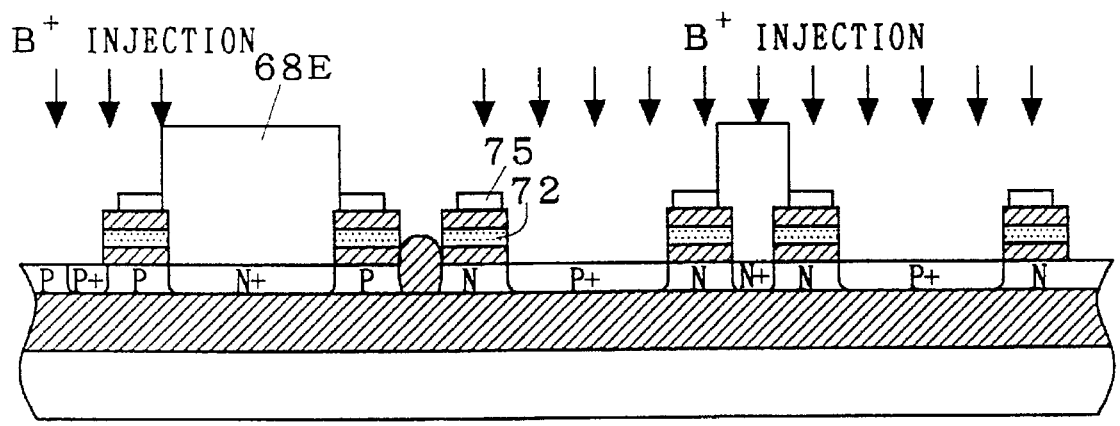

Referring to FIG. 18, resist materials 68E are applied to open a source/drain region PSD (FIG. 3) of the PMOS transistor and a substrate contact formation region NBD (FIG. 3) of the NMOS transistor, and boron, for example, is injected. At this time, injection of boron into the semiconductor layer which is positioned just under the gate electrodes 75 and the field shielding gate electrodes 72 of the transistors is inhibited through these electrodes 72 and 75 serving as masks.

Figure 19:
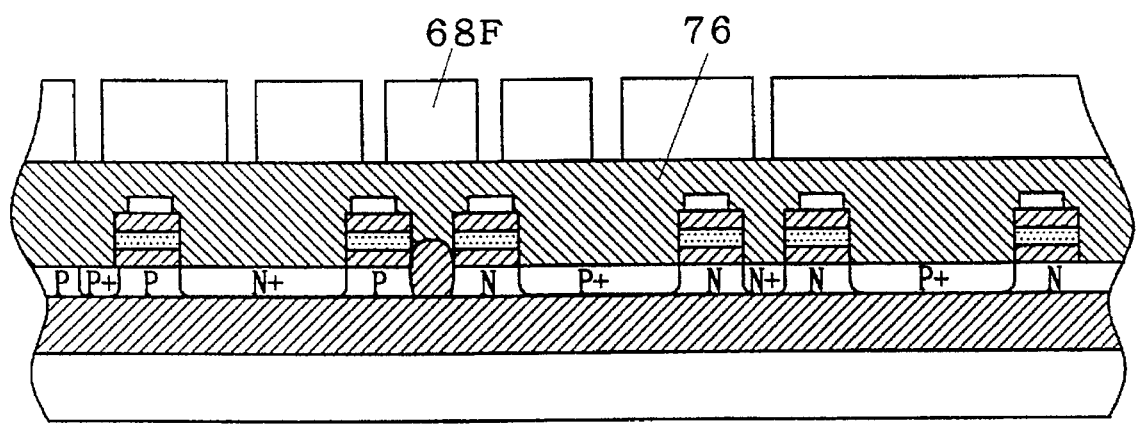

Referring to FIG. 19, overall exposed surfaces of the MOS transistors which are formed on the upper major surface 58 of the silicon substrate 61 are covered with an oxide film 76, and resist materials 68F are applied thereto, so that only resist portions corresponding to contact opening portions are removed by photolithography.

Figure 20:
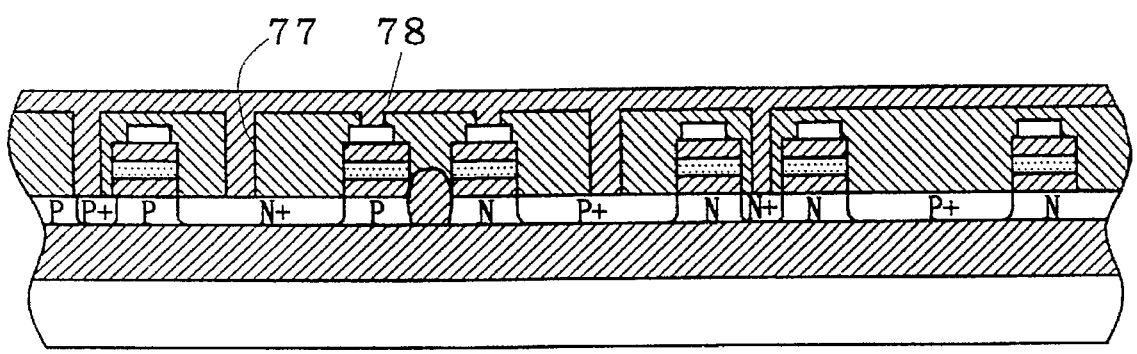

Then, the oxide film 76 is etched to remove the resist materials 68F, and a contact layer 77 is formed in the contact holes while a wiring layer 78 is formed thereon, as shown in FIG. 20.

Figure 21:
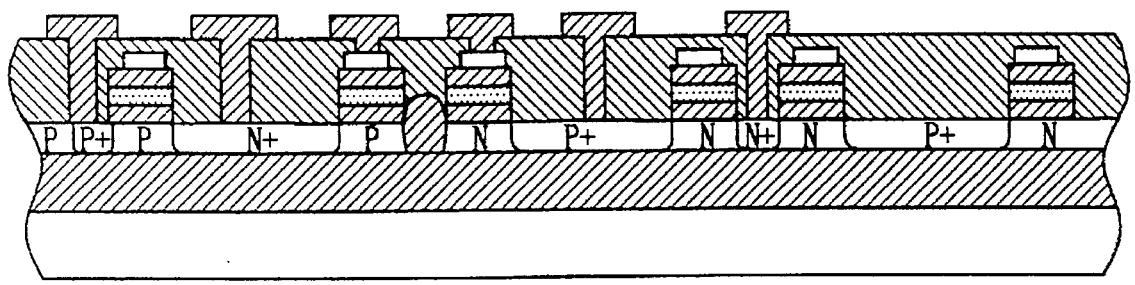

Then, the wiring layer 78 is formed into prescribed shapes by photolithography and etching, thereby completing the gate array semiconductor integrated circuit device shown in FIG. 21. While no contact regions are provided on upper major surfaces of the field shielding gate electrodes 72 in the sectional shape shown in FIG. 21, the contact regions are also provided on the upper major surfaces of the field shielding gate electrodes 72 through the process steps shown in FIGS. 19 and 20, similarly to the gate electrodes 75, the source/drain electrodes and the substrate contact arrangement regions of the transistors (see FIG. 2).

(Second Preferred Embodiment)

Figure 22:
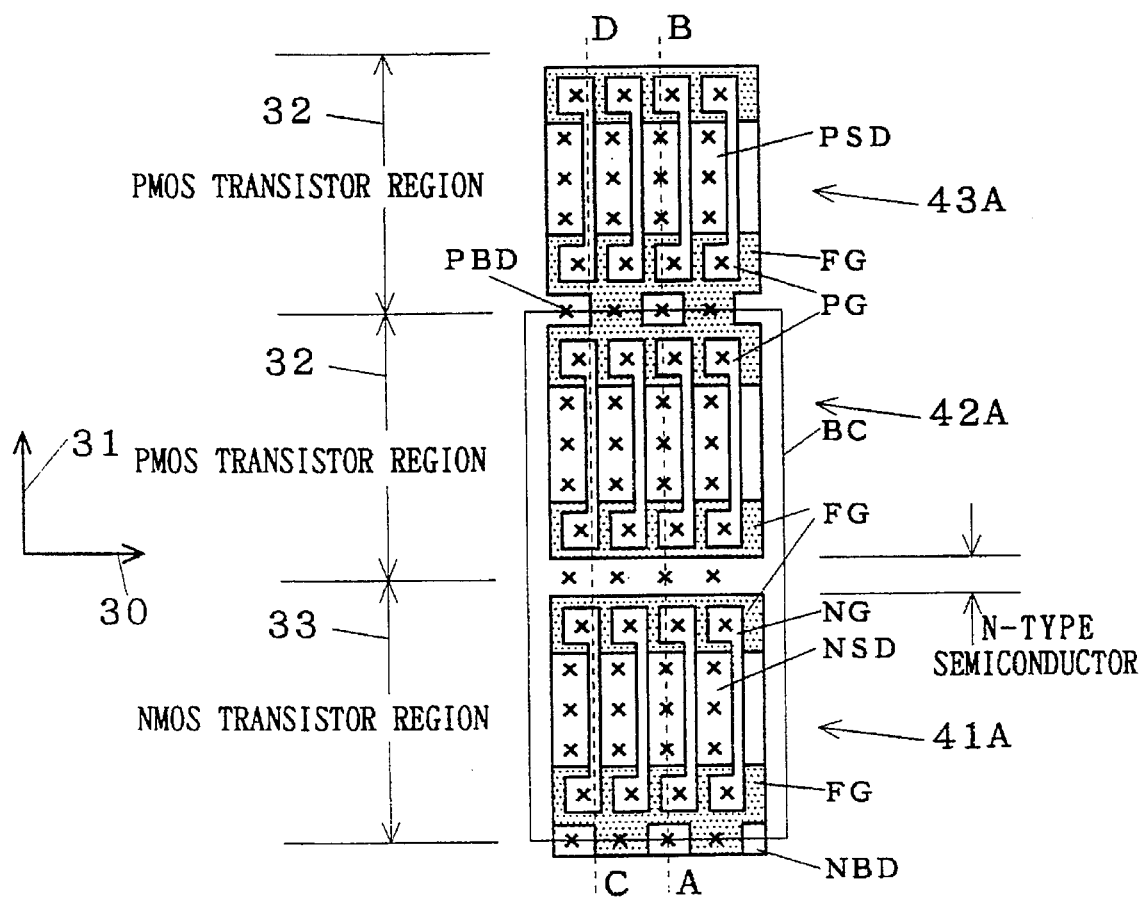
FIG. 22 illustrates the structure of a basic cell according to a second preferred embodiment of the present invention.

FIG. 22 is a plan view showing the structure of a basic cell BC according to a second preferred embodiment of the present invention, in correspondence to an enlarged view of a portion corresponding to the region 38 shown in FIG. 1. Referring to FIG. 22, symbols PG, PSD and PBD denote gate electrodes, source/drain electrodes and substrate contact arrangement regions of PMOS transistors respectively. On the other hand, symbols NG, NSD and NBD denote gate electrodes, source/drain electrodes and substrate contact arrangement regions of NMOS transistors respectively. Symbol FG denotes field shielding gate electrodes. A gate electrode PG and two source/drain regions PSD which are adjacent thereto define one PMOS transistor, while a gate electrode NG and two source/drain regions NSD which are adjacent thereto define one NMOS transistor respectively. The region BC which is formed by PMOS and NMOS transistor regions 32 and 33 is called a basic cell. Such basic cells BC are repeatedly arranged in a transverse direction (a first direction) while being continuously arranged to be folded in the vertical direction 31 (a second direction), thereby forming an internal transistor region 35 as shown in FIG. 1.

Figure 23:
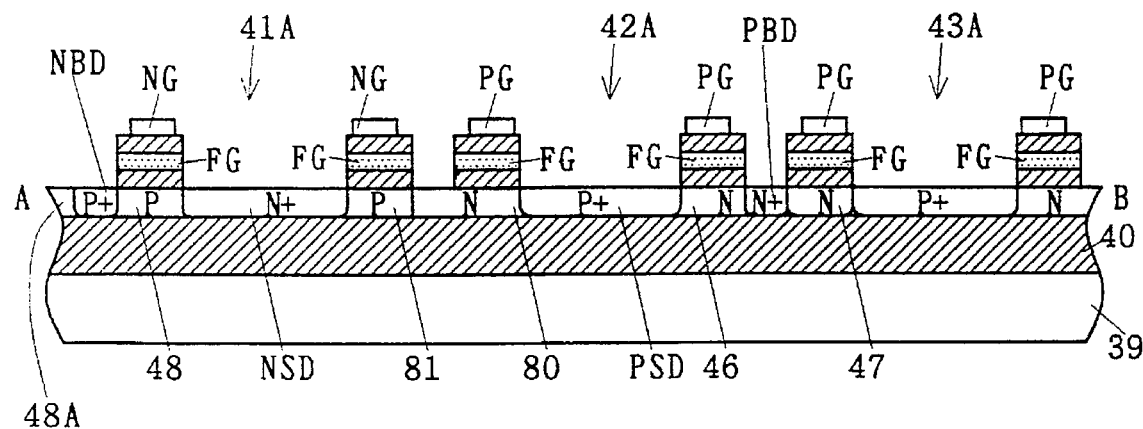
FIG. 23 is a sectional view taken along the broken line A-B in FIG. 22.
Figure 24:
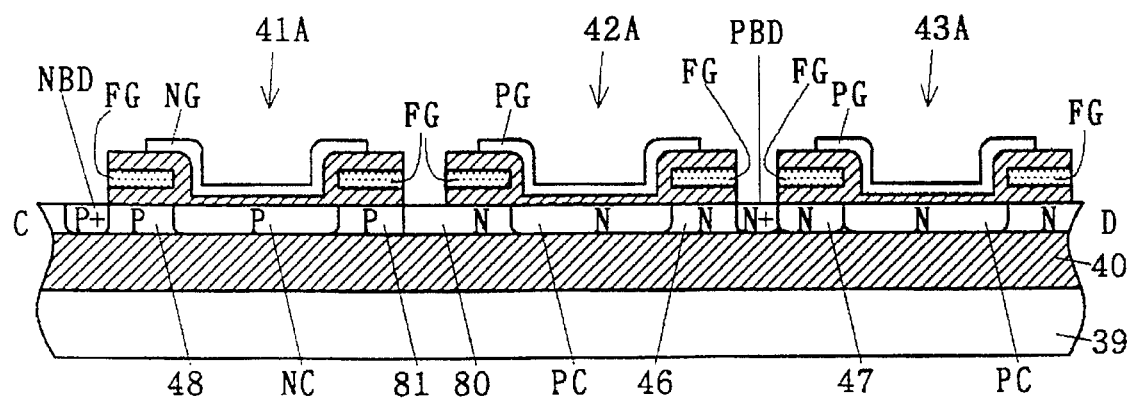
FIG. 24 is a sectional view taken along the broken line C-D in FIG. 22.

FIGS. 23 and 24 are sectional views taken along the broken lines A-B and C-D in FIG. 22 respectively. Referring to FIGS. 23 and 24, the first letters N and P of the respective symbols denote N-type and P-type semiconductors respectively, while a plus symbol + indicates semiconductor concentration (impurity concentration). Regions provided with the plus symbol + have high impurity concentration. When wiring layers and semiconductor layers are connected with each other, the semiconductor layers corresponding to the connecting regions are increased in concentration.

Referring to FIG. 24, symbols NC and PC denote channel regions of the NMOS and PMOS transistors respectively. An NMOS transistor 41A and PMOS transistors 42A and 43A are formed in a semiconductor layer (SOI) which is formed on an upper major surface of a buried oxide film 40. The PMOS transistor 42A and the NMOS transistor 41A are isolated from each other by a P-N junction consisting of an N-type semiconductor layer 80 integrally forming N-type extended regions which are positioned just under the field shielding gate electrodes FG and an isolation region, and a P-type semiconductor layer 81 (a P-type extended layer) which is positioned just under the field shielding electrodes FG. Further, the PMOS transistors 42A and 43A are isolated from each other by N-type semiconductor layers 46 and 47 (other N-type extended layers), while the NMOS transistor 41A and an NMOS transistor (not shown) adjacent thereto are isolated from each other by P-type semiconductor layers 48 and 48A (other P-type extended layers) respectively. On the other hand, both of the field shielding gate electrodes FG which are arranged between the PMOS transistors 42A and 43A and between the NMOS transistor 41A and the adjacent NMOS transistor (not shown) are opened, so that N+ and P+ substrate contact formation regions PBD and NBD are formed in the SOI layer from bottom surfaces of the respective openings toward the upper major surface of the buried oxide film 40. When voltages are applied to the N+ and P+ substrate contact formation regions PBD and NBD, potentials of respective channel regions PC (N-type semiconductors) of the PMOS transistors 42A and 43A and a potential of a channel region NC (a P-type semiconductor) of the NMOS transistor 41A are fixed at the applied corresponding voltages respectively.

Figure 25:
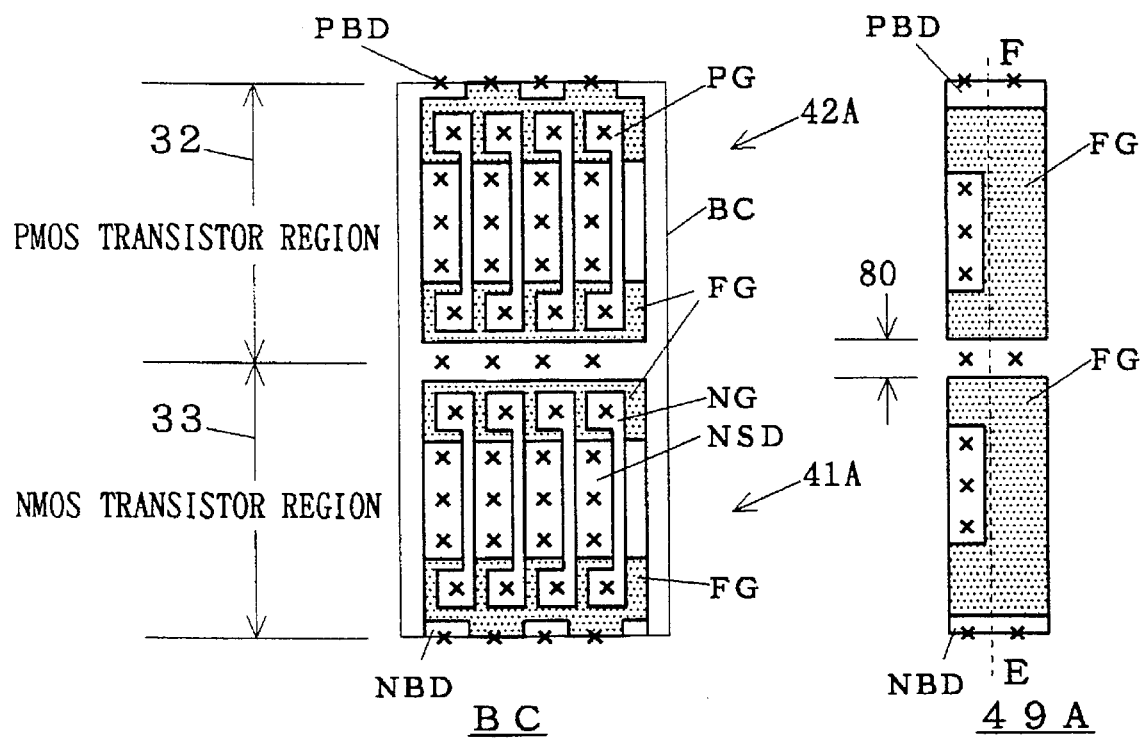
FIG. 25 illustrates the structure of an end cell according to the second preferred embodiment of the present invention.
Figure 26:
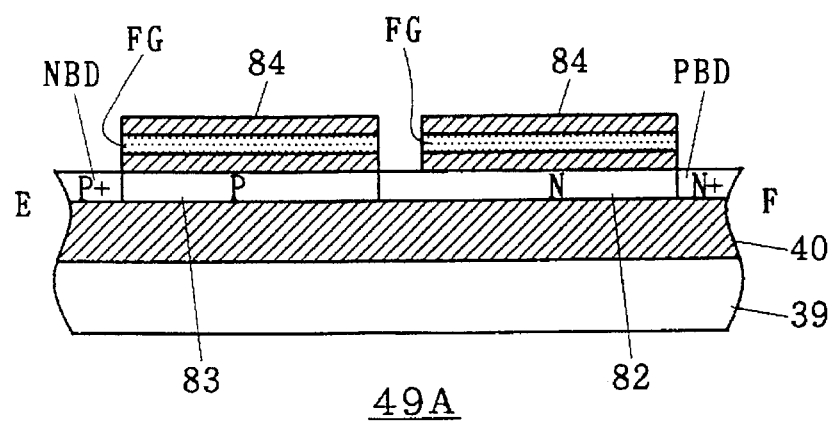
FIG. 26 is a sectional view taken along the broken line E-F in FIG. 25.

FIG. 25 is a plan view showing an end cell 49A corresponding to that 49 shown in FIG. 1, and FIG. 26 is a sectional view of the end cell 49A taken along the broken line E-F in FIG. 25. This end cell 49A has a P-type semiconductor layer 83 and an N-type semiconductor layer 82, which are bonded to each other, formed on the upper major surface of the buried oxide film 40, the substrate contact arrangement regions PBD and NBD, the field shielding gate electrodes FG through oxide films, and oxide films 84 provided thereon.

The end cells 49A shown in FIGS. 25 and 26 are arranged on each end of the first region which is formed by repeatedly arranging the basic cells BC, whereby the N-type semiconductor layers 80 and 46 on both ends of the PMOS transistor 42A are connected with each other through the substrate contact arrangement region PBD and the N-type semiconductor layer 82 of the end cell 49A, while the P-type semiconductor layers 81 and 48 on both ends of the NMOS transistor 41A are also connected with each other through the substrate contact arrangement region NBD and the P-type semiconductor layer 83 of the end cell 49A.

Figure 27:
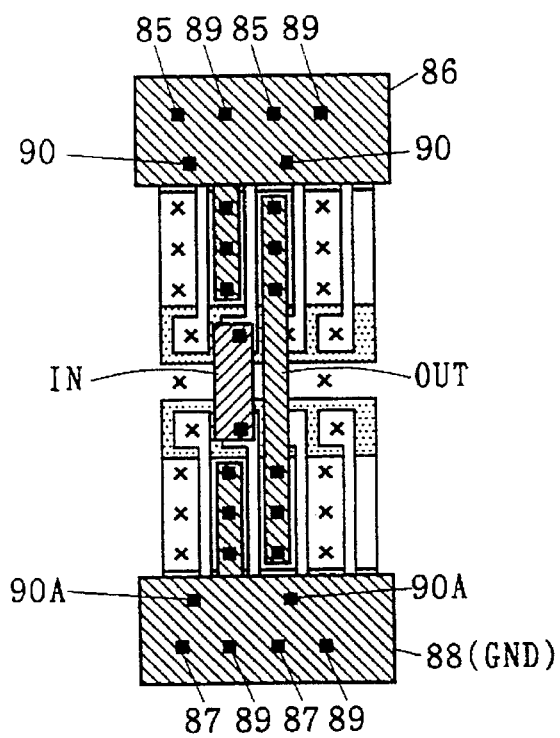
FIG. 27 illustrates slice cell arrangement in the second preferred embodiment of the present invention.
Figure 98:
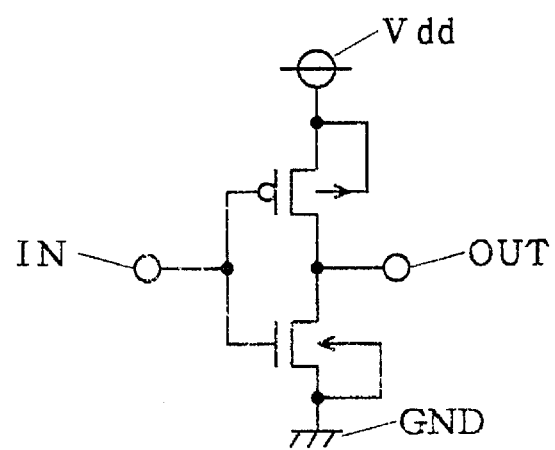
FIG. 98 illustrates an invertor gate.
Figure 99:
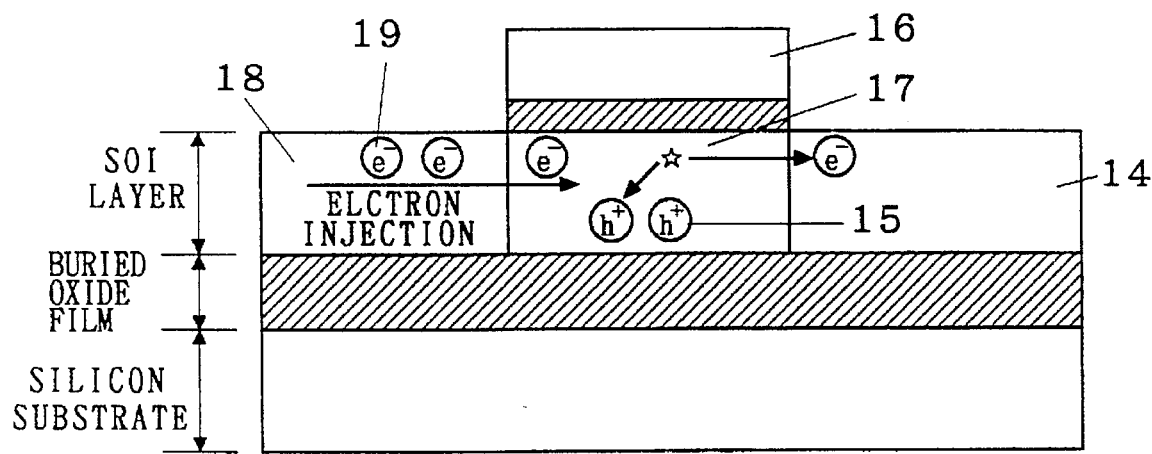
FIG. 99 illustrates the mechanism of a substrate floating effect.
Figure 100:
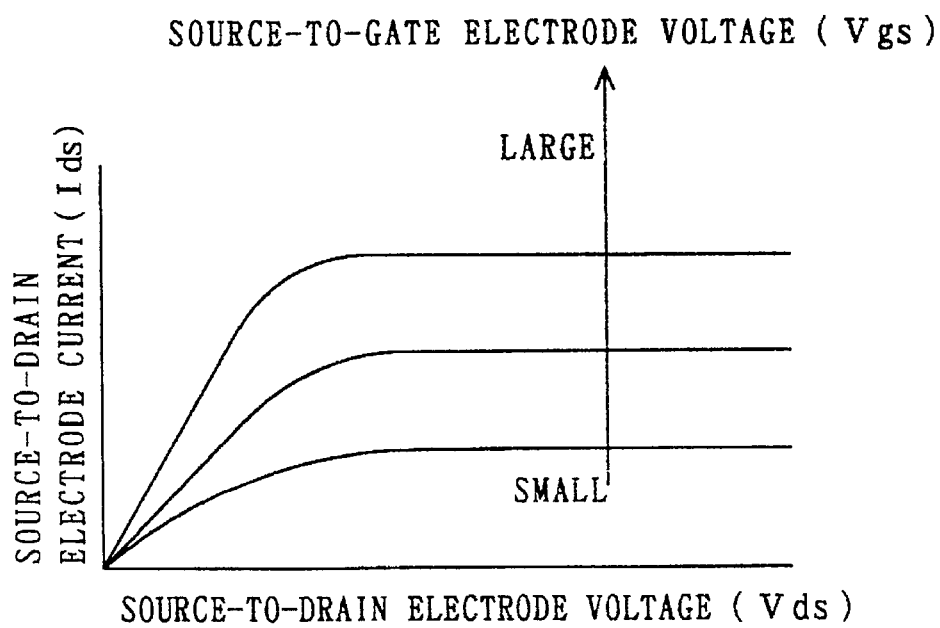
FIG. 100 illustrates Vds-Ids characteristics of a MOS transistor provided on a bulk silicon substrate.
Figure 101:
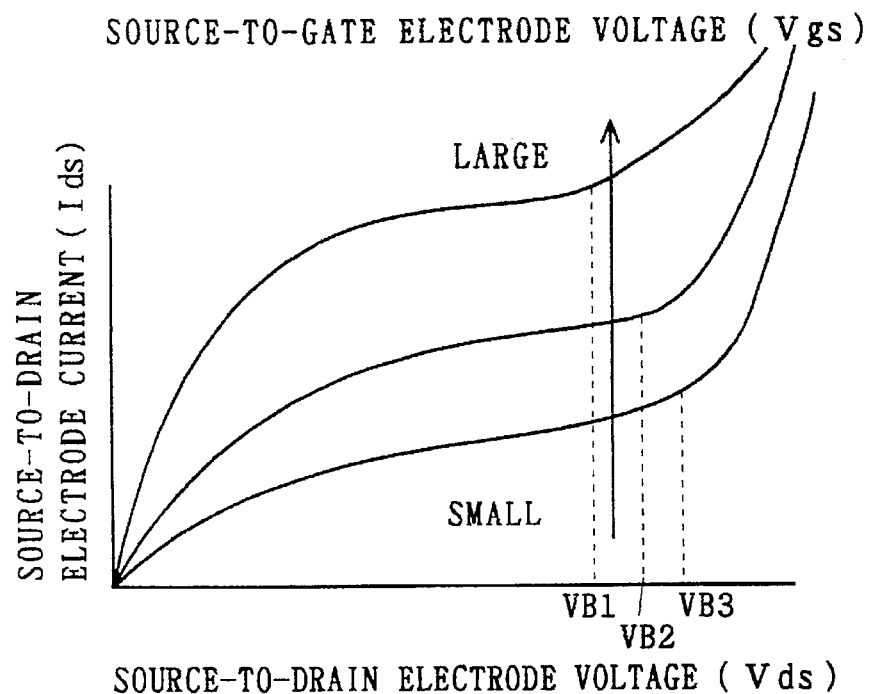
FIG. 101 illustrates Vds-Ids characteristics of a MOS transistor provided on an SOI substrate.
Figure 102:
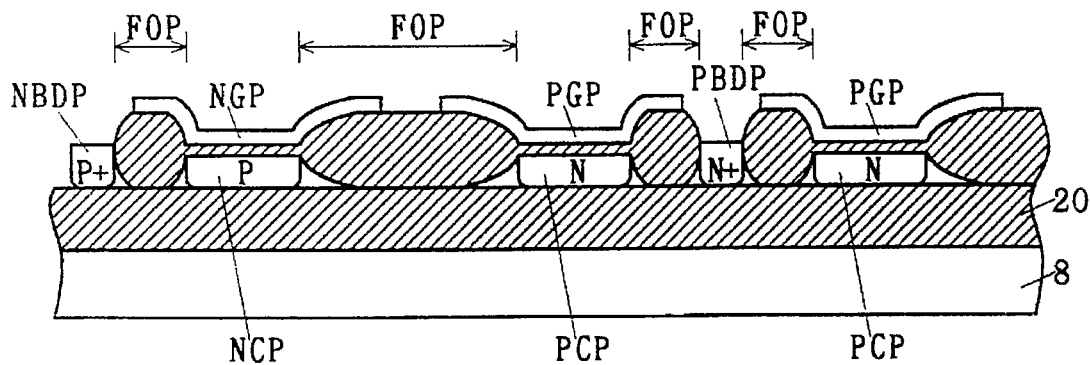
FIG. 102 illustrates a conventional gate array which is formed on an SOI substrate.

FIG. 27 is a plan view showing the slice cell of the CMOS invertor circuit shown in FIG. 98, which is arranged on a master, for example. The channel regions PC of the PMOS transistors 42A and 43A (FIG. 24) are connected to a wiring layer 86 of a first power source through the N-type semiconductor layer 46 which is positioned just under the field shielding gate electrodes FG and contacts 85, while the channel region NC of the NMOS transistor 41A (FIG. 24) is connected to a wiring layer 88 of a second power source through the P-type semiconductor layer 48 which is positioned just under the field shielding gate electrode FG and contacts 87 shown in FIG. 27, so that the channel regions PC and NC are biased to first and second source potentials respectively. At this time, each channel region PC (NC) is drawn out in the second direction 31 shown in FIG. 1 beyond both ends of the gate electrode PG (NG) due to the presence of the field shielding gate electrode FG (FIG. 24), and the semiconductor layers 46 and 80 (48 and 81) which are positioned just under the field shielding gate electrodes FG are connected with each other by the end cell region 34 shown in FIG. 1 (or the end cell 49A in FIG. 25). At this time, the field shielding gate electrodes FG in the PMOS transistors 42A and 43A and the NMOS transistor 41A are fixed at the first and second source potentials respectively through contacts 89 shown in FIG. 27, which are arranged on the upper major surfaces of the field shielding gate electrodes FG. Further, each of the PMOS transistors 42A and 43A is isolated from its adjacent PMOS transistors by connecting two gate electrodes adjacent in the first direction 30 of FIG. 1 inside the corresponding basic cell BC to the wiring layer 86 of the first power source through contacts 90 shown in FIG. 27. And the NMOS transistor 41A is also isolated from its adjacent NMOS transistors by connecting two gate electrodes adjacent thereto in the first direction 30 inside the corresponding basic cell BC to the wiring layer 88 of the second power source through contacts 90A of FIG. 27.

Principal steps of fabricating this gate array semiconductor integrated circuit device are now described.

Figure 28:
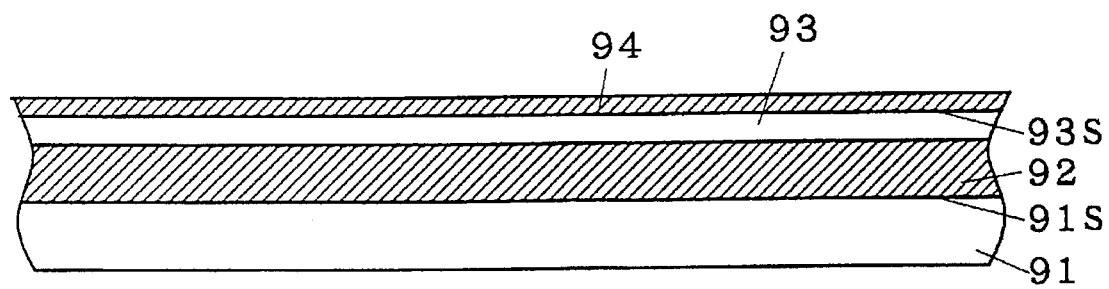
FIGS. 28 to 39 are sectional views showing a fabrication step according to the second preferred embodiment of the present invention.

Referring to FIG. 28, a buried oxide film 92 and an SOI layer 93 are successively formed on an upper major surface of a silicon substrate 91. Then, a silicon oxide film 49 is formed on an upper major surface 93S of the SOI layer 93 by thermal oxidation.

Figure 29:
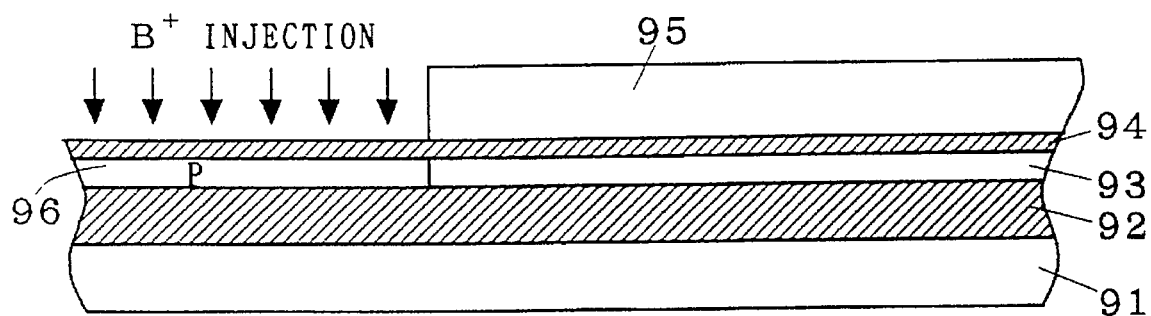

Referring to FIG. 29, a resist material 95 is applied to open a PMOS transistor formation region by photolithography, and boron, for example, is injected to form a channel region 96 of a PMOS transistor.

Figure 30:
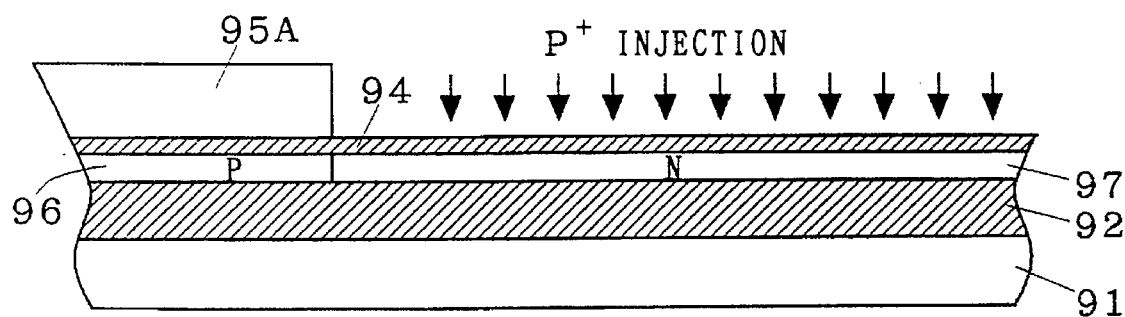

Referring to FIG. 30, a resist material 95A is similarly applied to open an NMOS transistor formation region by photolithography, and phosphorus, for example, is injected to form a channel region 97 of an NMOS transistor.

Figure 31:
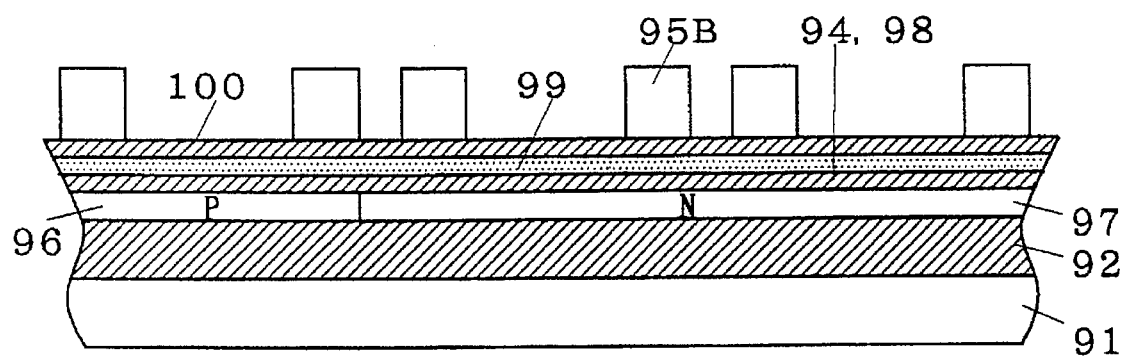
Figure 32:
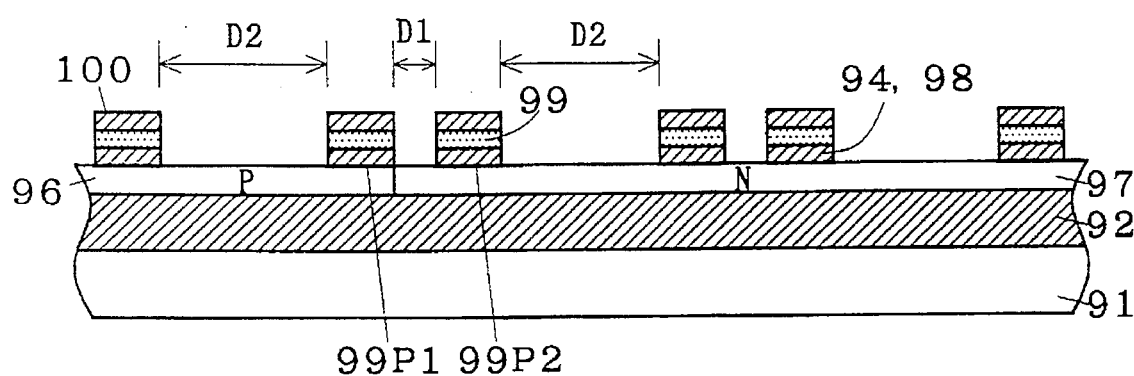

Referring to FIG. 31, an oxide film 98, a polysilicon layer 99 for field shielding gate electrodes and an oxide film 100 are formed and resist materials 95B are patterned by photolithography into prescribed shapes, and thereafter field shielding gate electrodes 99 of desired shapes shown in FIG. 32 are obtained by etching.

Namely, patterns of the field shielding gate electrodes 99 (FG) held by the oxide films 100 and 94 (98) are formed on a first region 99P1 on the upper major surface of the SOI layer on the NMOS transistor side at the junction plane between the channel regions and a second region 99P2 which is separated from the junction plane toward the PMOS transistor by a first space D1, and the two opposite patterns are repeatedly formed toward the NMOS and PMOS transistors every second space D2.

Figure 33:
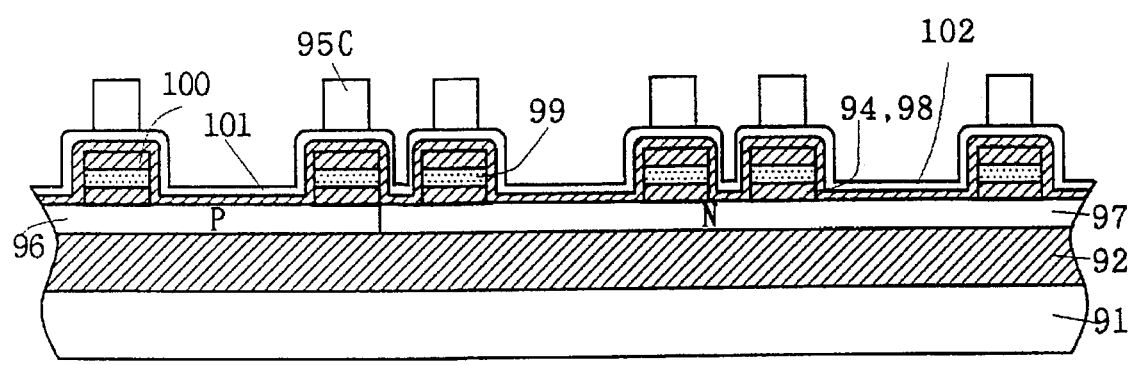
Figure 34:
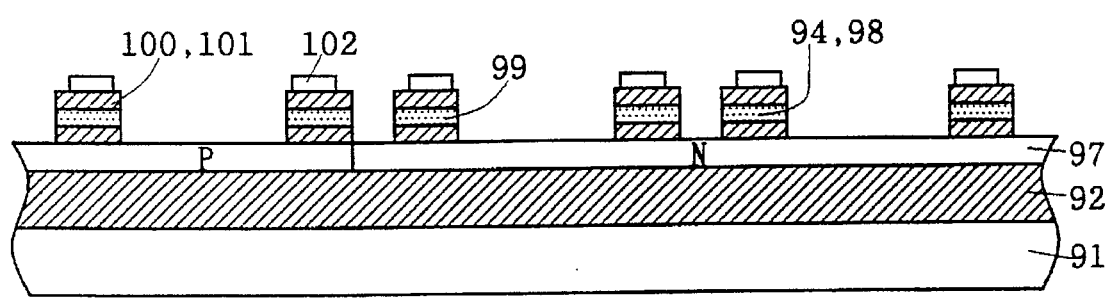

Referring to FIG. 33, a gate oxide film 101 and a gate electrode 102 are formed and resist materials 95C are patterned into prescribed shapes and thereafter etched, thereby obtaining the structure shown in FIG. 34. FIGS. 34 to 39 are sectional views taken along the broken line A-B in FIG. 22 respectively.

Figure 35:
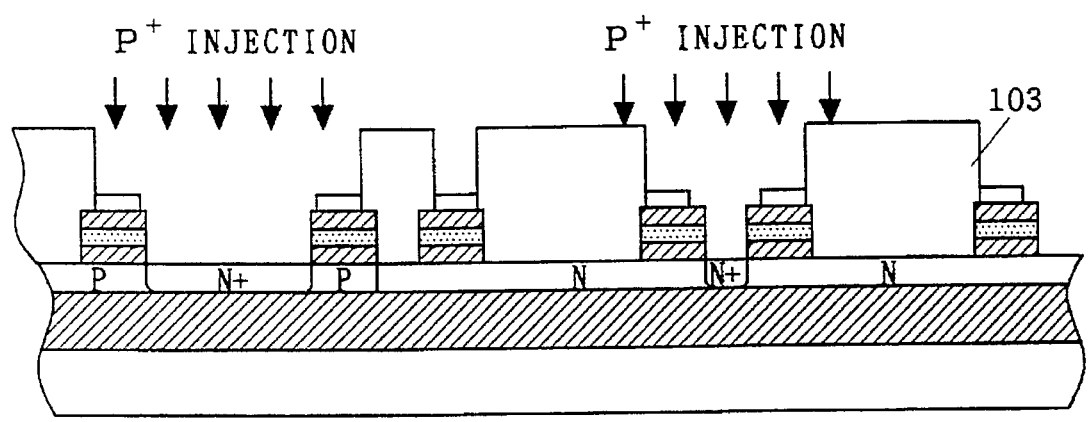

Referring to FIG. 35, resist materials 103 are applied to open source/drain regions of the NMOS transistor and a substrate contact formation region of the PMOS transistor by photolithography, and phosphorus, for example, is injected. At this time, injection of phosphorus into the semiconductor layer which is positioned just under the gate electrode 102 and the field shielding gate electrodes 99 of the transistors is inhibited through the electrodes 102 and 99 serving as masks.

Figure 36:
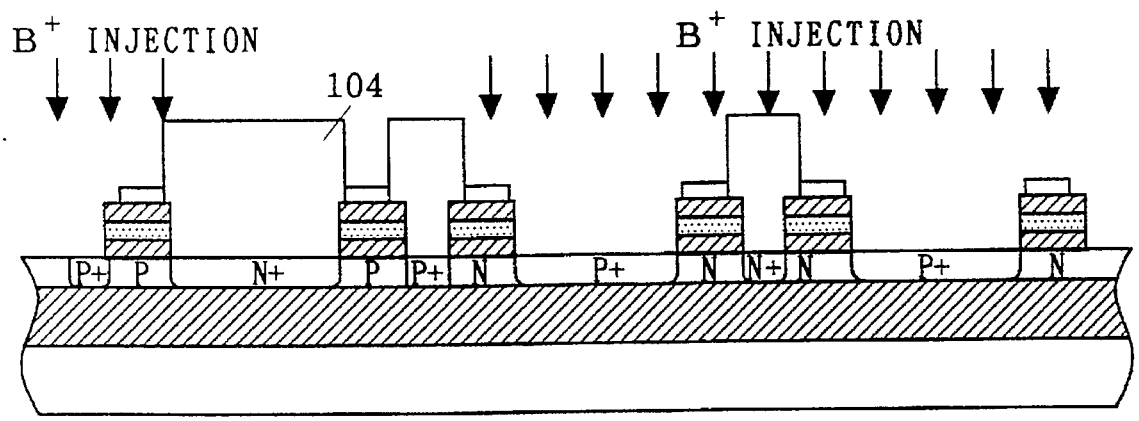

Referring to FIG. 36, resist materials 104 are similarly applied to open source/drain regions of the PMOS transistor and a substrate contact formation region of the NMOS transistor by photolithography, and boron, for example, is injected. At this time, injection of boron into the semiconductor layer which is positioned just under the gate electrode 102 and the field shielding gate electrodes 99 of the transistors is inhibited through the electrodes 102 and 99 serving as masks.

Figure 37:
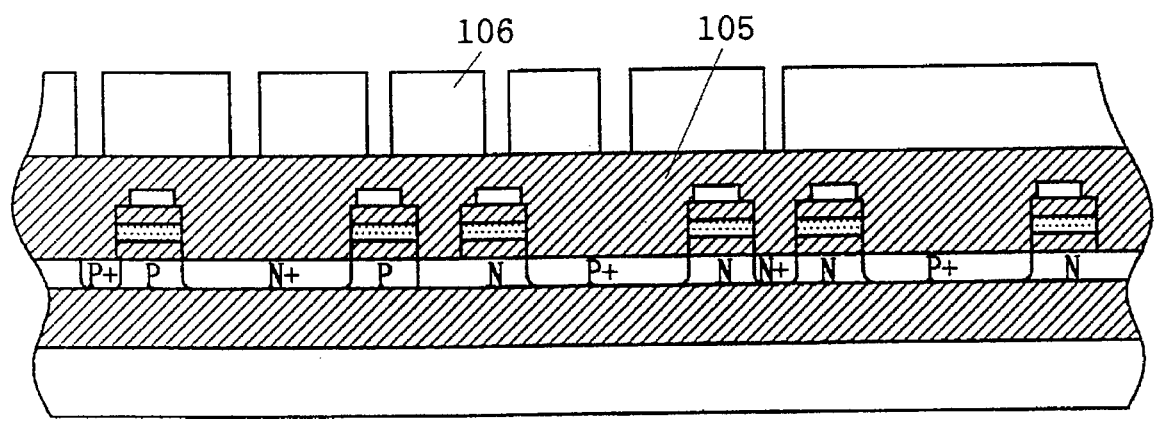

Referring to FIG. 37, the overall surface of the silicon substrate is covered with an oxide film 105, resist materials 106 are applied, and thereafter the resist materials are removed from contact opening portions by photolithography.

Figure 38:
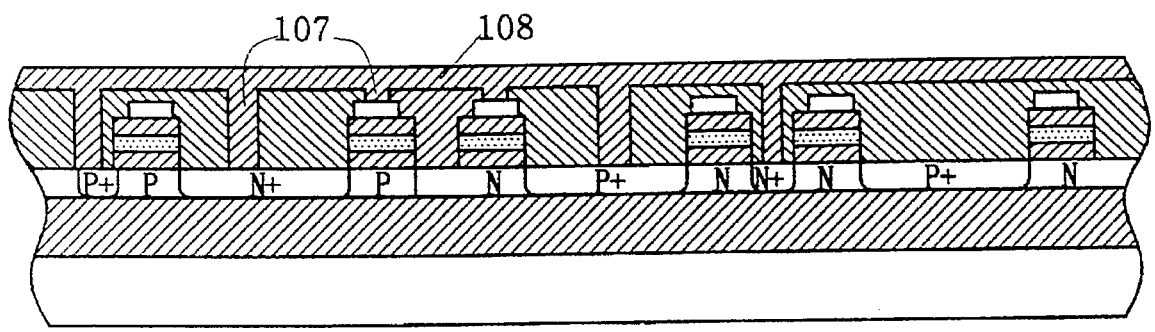

Then, the oxide film 105 is etched and the resist materials 106 are removed, so that contact layers 107 are formed in the contact holes followed by formation of a wiring layer 108, as shown in FIG. 38.

Figure 39:
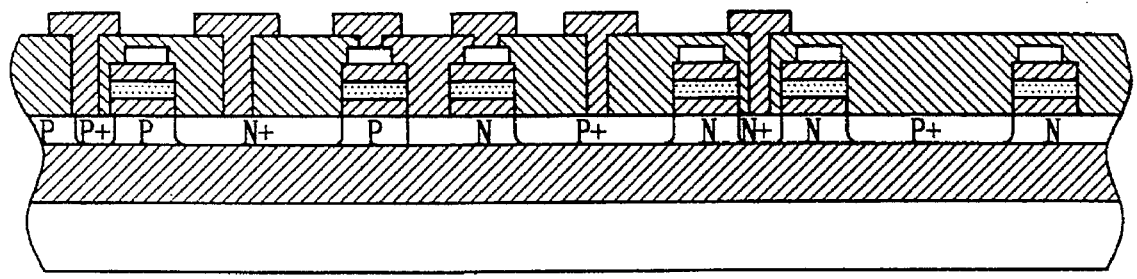

Then, the wiring layer 108 is formed into desired shapes by photolithography and etching, thereby completing the gate array semiconductor integrated circuit device shown in FIG. 39.

While no contact regions are provided on upper major surfaces of the field shielding gate electrodes 99 in the sectional shape shown in FIG. 39, the contact regions are also provided on the upper major surfaces of the field shielding gate electrodes 99 through the process steps shown in FIGS. 37 and 38, similarly to the gate electrodes, the source/drain electrodes and the substrate contact regions of the transistors.

According to this preferred embodiment, as hereinabove described, the isolation region between the PMOS and NMOS transistors is formed by the N-type semiconductor layer 80 (FIGS. 23 and 24) in addition to the advantage of improvement in withstand voltage, whereby the fabrication process is simplified as compared with the first preferred embodiment since it is not necessary to form a field oxide film in the isolation region between the transistors.

(Third Preferred Embodiment)

Figure 40:
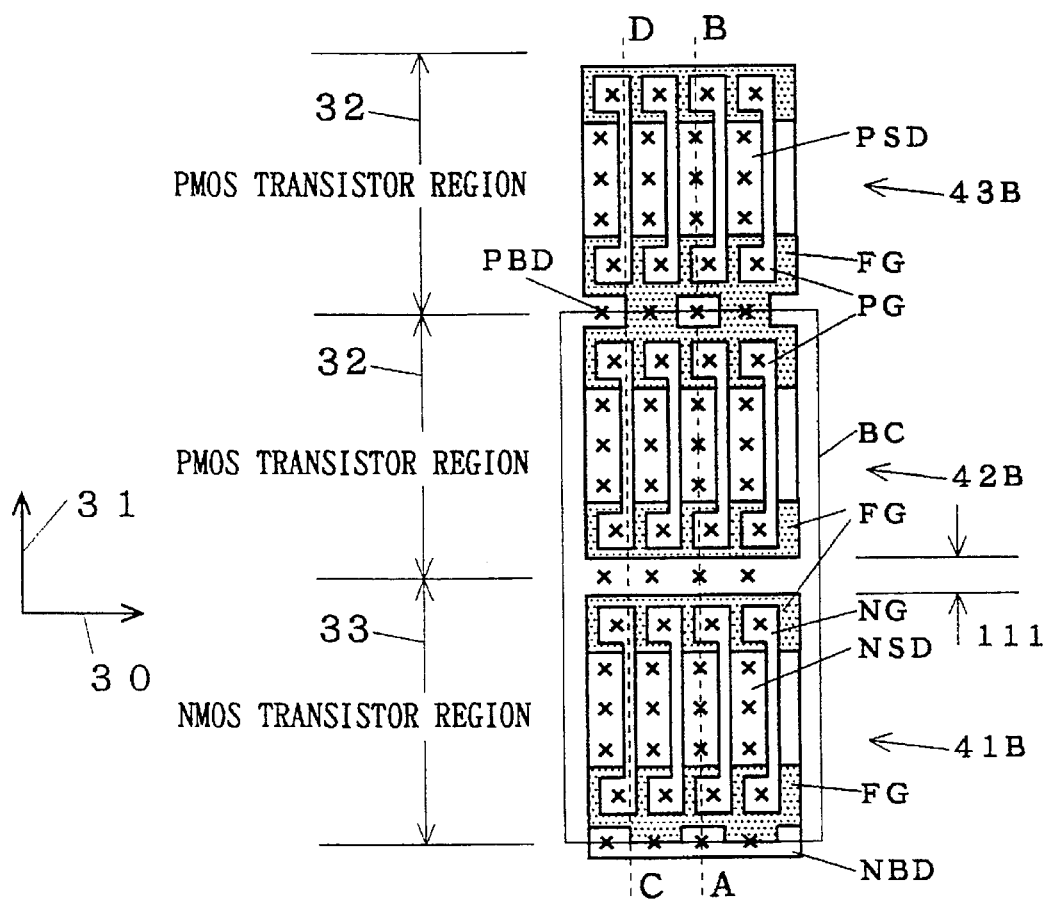
FIG. 40 illustrates the structure of a basic cell according to a third preferred embodiment of the present invention.

FIG. 40 is a plan view showing the structure of a basic cell BC according to a third preferred embodiment of the present invention. This figure shows a part corresponding to the region 38 shown in FIG. 1 in an enlarged manner. Referring to FIG. 40, numerals which are identical to those in FIGS. 2 and 22 denote the same components.

Figure 41:
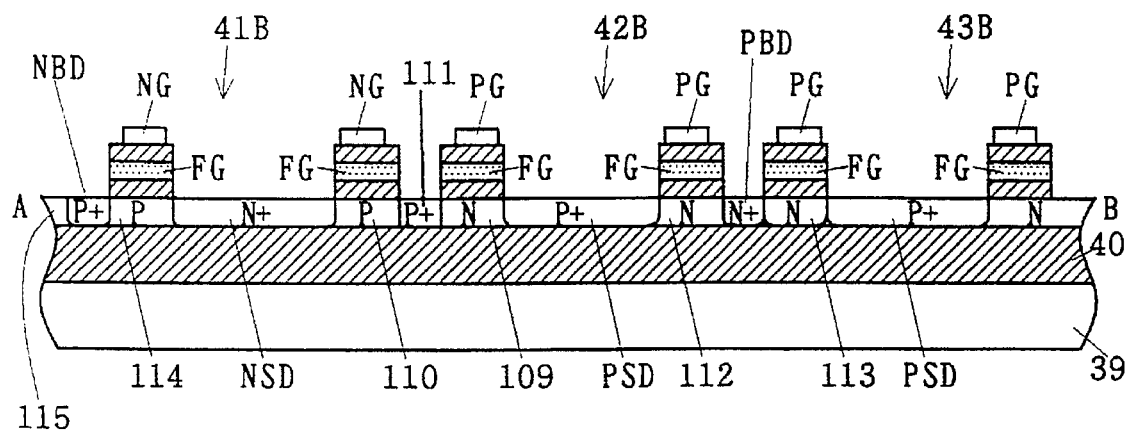
FIG. 41 is a sectional view taken along the broken line A-B in FIG. 40.
Figure 42:
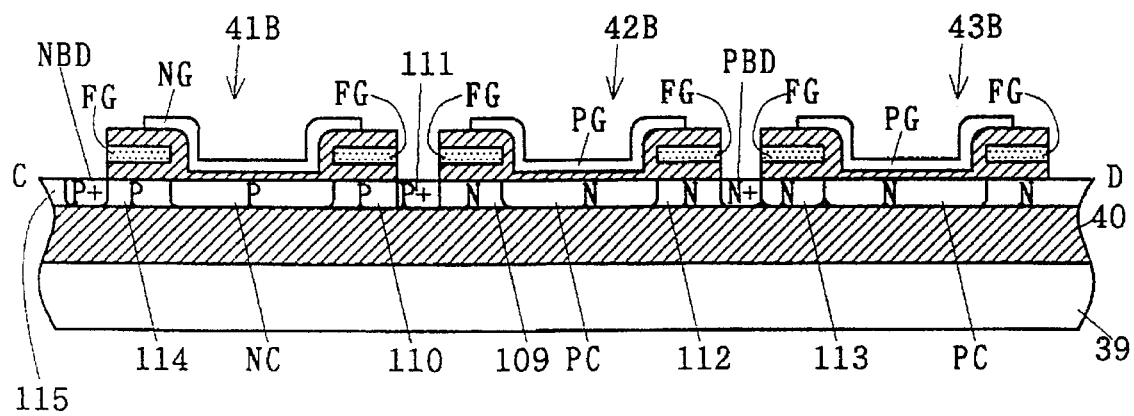
FIG. 42 is a sectional view taken along the broken line C-D in FIG. 40.

FIGS. 41 and 42 are sectional views taken along the broken lines A-B and C-D in FIG. 4(5) respectively. Referring to FIGS. 41 and 42, numerals which are identical to those in FIGS. 3 and 4 denote the same components.

As shown in FIGS. 41 and 42, an NMOS transistor 41B and PMOS transistors 42B and 43B are formed in a semiconductor layer (an SOI layer) which is formed on an upper major surface of a buried oxide film 40. The PMOS transistor 42B and the NMOS transistor 41B are isolated from each other by an N-type semiconductor layer 109 (an N-type extended layer) and a P-type semiconductor layer 110 (a P-type extended layer) which are formed in the SOI layer just under respective field shielding gate electrodes FG and a P-type semiconductor layer 111 which is formed on the isolation region between the transistors 41B and 42B. Also in this preferred embodiment, the transistors 41B and 42B are isolated from each other through a reverse bias of a P-N junction, similarly to the second preferred embodiment. In this case, however, concentration of the P-type semiconductor layer 111 of the isolation region is P+ in consideration of provision of contact, as described later. Alternatively, the isolation region may be formed without taking the contact, that is, not to be set at the GND potential with an Al wiring layer, and the concentration of the P-type semiconductor layer 111 is P− in this case.

On the other hand, the PMOS transistors 42B and 43B are isolated from each other by an N-type semiconductor layer consisting of another N-type extended layer 112, the substrate contact arrangement region PBD and the N-type semiconductor layer 113, while the NMOS transistor 41B and another NMOS transistor (not shown) which is adjacent thereto are isolated from each other by a P-type semiconductor layer consisting of another P-type extended layer 114, the substrate contact arrangement region NBD and the P-type semiconductor layer 115, respectively. Both of the field shielding gate electrodes FG which are arranged between the PMOS transistors 42B and 43B and between the NMOS transistor 41B and the NMOS transistor (not shown) adjacent thereto respectively are opened, so that N+ and P+ substrate contact arrangement regions PBD and NBD are formed in the interior of the SOI layer from bottom surfaces of the respective openings. When corresponding voltages are applied to the N+ and P+ substrate contact arrangement regions PBD and NBD respectively, potentials of channel regions PC (N-type semiconductor layers) of the PMOS transistors 42B and 43B and a potential of a channel region NC (a P-type semiconductor layer) of the NMOS transistor 41B are fixed to the corresponding applied voltages respectively.

Figure 43:
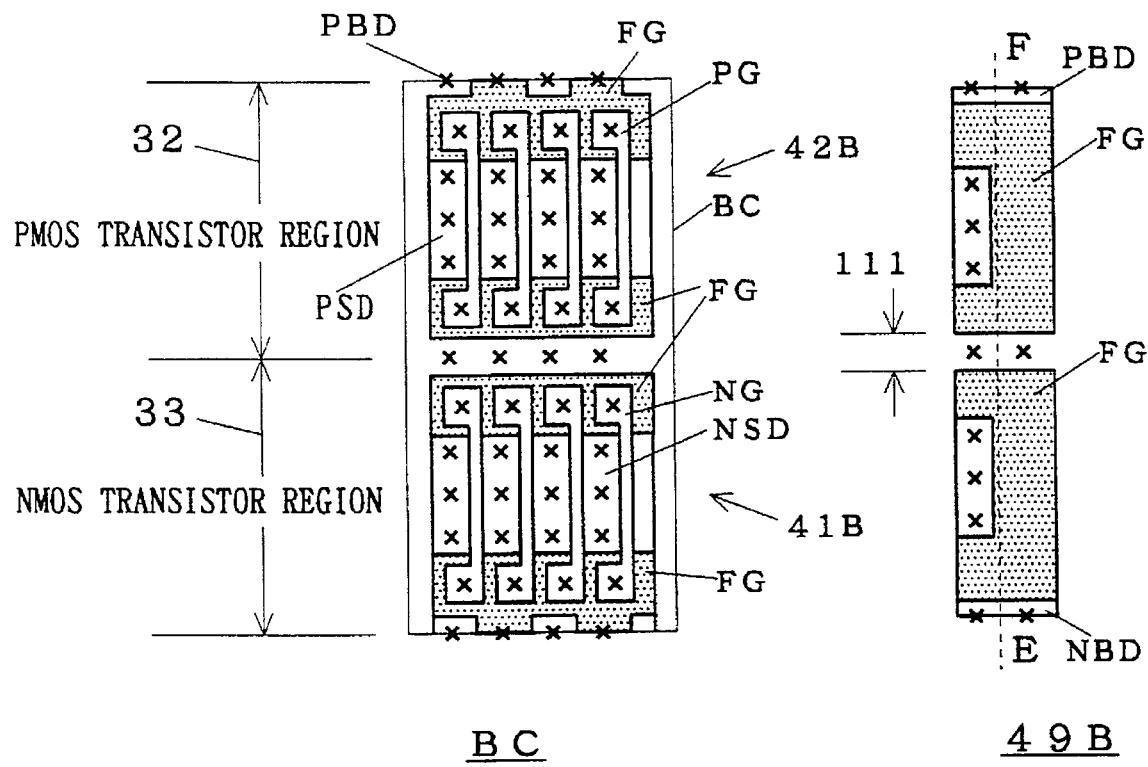
FIG. 43 illustrates the structure of an end cell according to the third preferred embodiment of the present invention.
Figure 44:
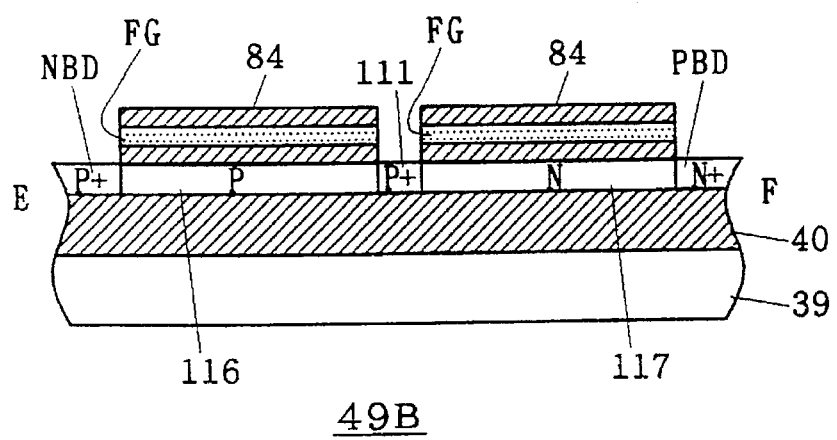
FIG. 44 is a sectional view taken along the broken line E-F in FIG. 43.

FIG. 43 is a plan view of an end cell 49B corresponding to the third preferred embodiment of the end cell 49 shown in FIG. 1, and FIG. 44 is a sectional view of the end cell 49B taken along the broken line E-F in FIG. 43 respectively. As shown in these figures, the end cell 49B has a P-type semiconductor layer 116, an N-type semiconductor layer 117, a P+ semiconductor layer 111, substrate contact arrangement regions PBD and NBD, and an oxide film 84. As hereinabove described, the P+ semiconductor layer 111 is brought into + concentration in consideration of the fact that contact is taken in the P+ semiconductor layer 111. If no contact is taken, the P+ semiconductor layer 111 may alternatively be replaced by a P− semiconductor layer.

The end cells 49B shown in FIGS. 43 and 44 are arranged on each end of a first region which is formed by repeatedly arranging the basic cells BC, whereby the N-type semiconductor layers 109 and 112 on both ends of the PMOS transistor 42B (FIG. 42) are connected with each other through the N-type semiconductor layer 117 of the end cell 49B, while the P-type semiconductor layers 110 and 114 on both ends of the NMOS transistor 41B are also connected with each other through the P-type semiconductor layer 116 of the end cell 49B.

Figure 45:
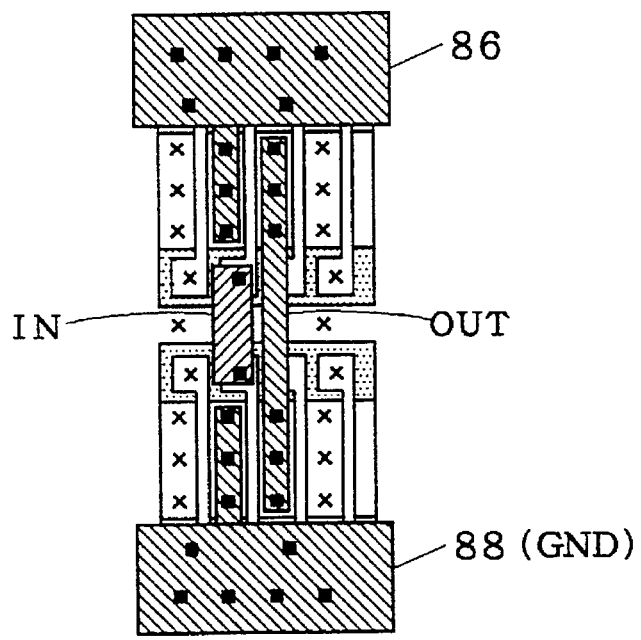
FIG. 45 illustrates slice cell arrangement according to the third preferred embodiment of the present invention.

FIG. 45 is a plan view showing the slice cell of the CMOS invertor circuit shown in FIG. 98, which is arranged on a master, for example. The arrangement shown in FIG. 45 is similar to those described with reference to the first and second preferred embodiments (FIGS. 8 and 27), and hence redundant description is omitted. In this case, the P+ semiconductor layer 111 may alternatively be replaced by a P+ semiconductor layer.

Principal steps of fabricating this gate array semiconductor integrated circuit device are now described with reference to sectional views shown in FIGS. 46 to 57.

Figure 46:
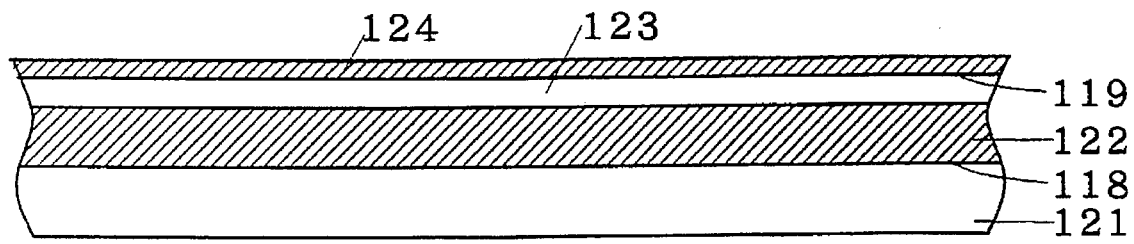
FIGS. 46 to 57 are sectional views showing a fabrication step according to the third preferred embodiment of the present invention.

Referring to FIG. 46, a buried oxide film 122 and an SOI layer 123 are formed on an upper major surface 118 of a silicon substrate 121. Then, a silicon oxide film 124 is formed on an upper major surface of the SOI layer 123, by thermal oxidation.

Figure 47:
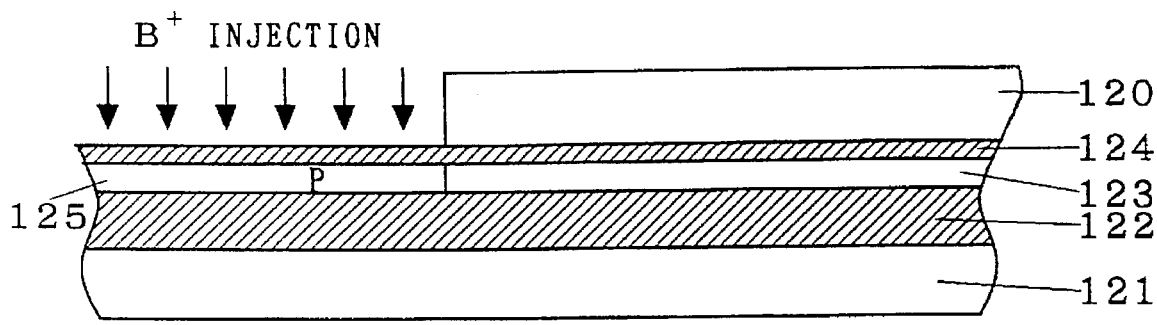
Figure 48:
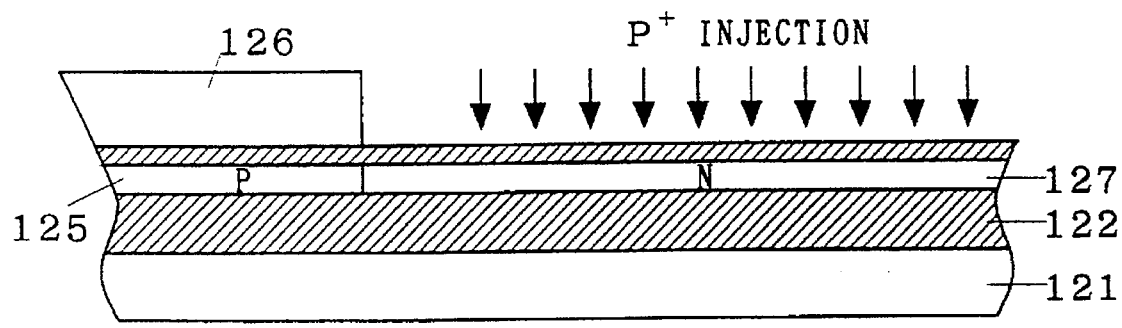

Referring to FIG. 47, a resist material 120 is applied to open a PMOS transistor formation region by photolithography, and boron, for example, is injected to form a channel region 125 of a PMOS transistor. Referring to FIG. 48, a resist material 126 is similarly applied to open an NMOS transistor formation region by photolithography, and phosphorus, for example, is injected to form a channel region 127 of an NMOS transistor.

Figure 49:
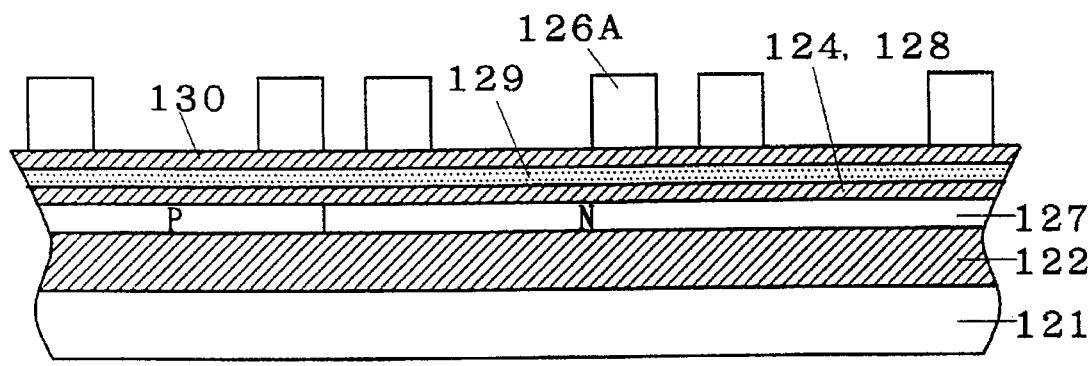
Figure 50:
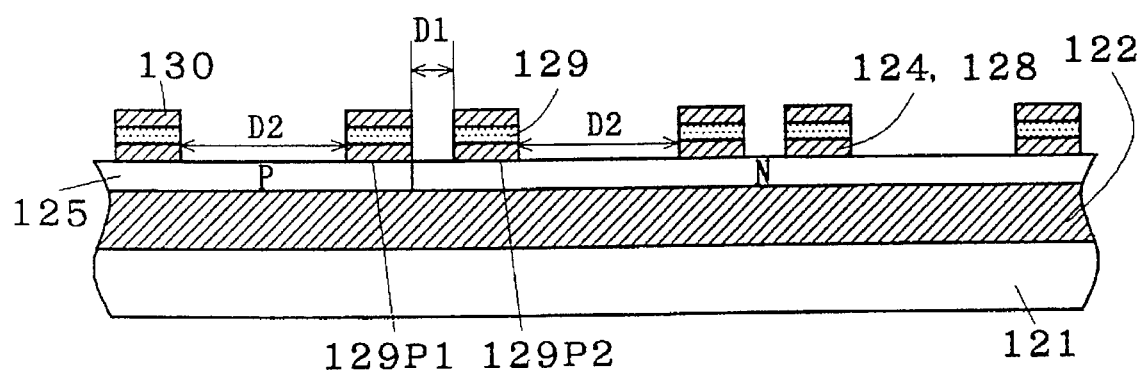

Referring to FIG. 49, an oxide film 128, a polysilicon layer 129 for field shielding gate electrodes and an oxide film 130 are formed, resist materials 126A are patterned into desired shapes by photolithography, and thereafter desired field shielding gate electrodes shown in FIG. 50 are obtained by etching.

Referring to FIG. 50, numerals 129P1 and 129P2 denote first and second regions respectively, and symbols D1 and D2 denote first and second spaces respectively. Patterns of field shielding gate electrodes 129 (FG) after etching are identical to those described with reference to FIG. 32.

Figure 51:
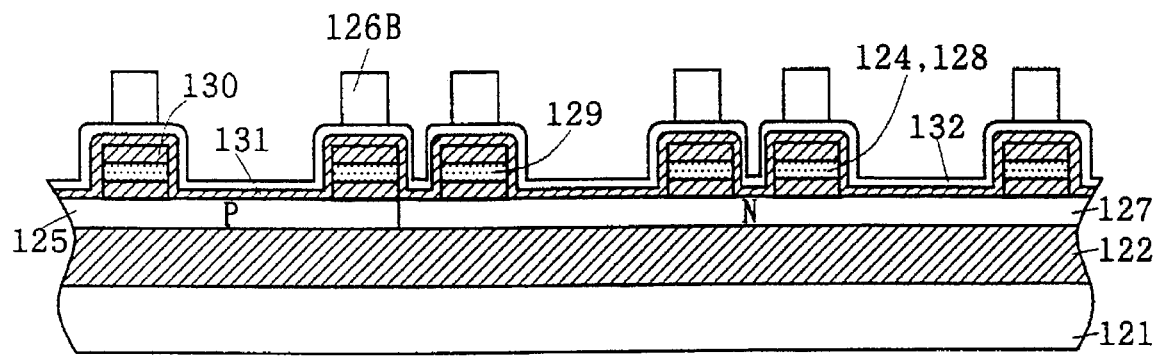
Figure 52:
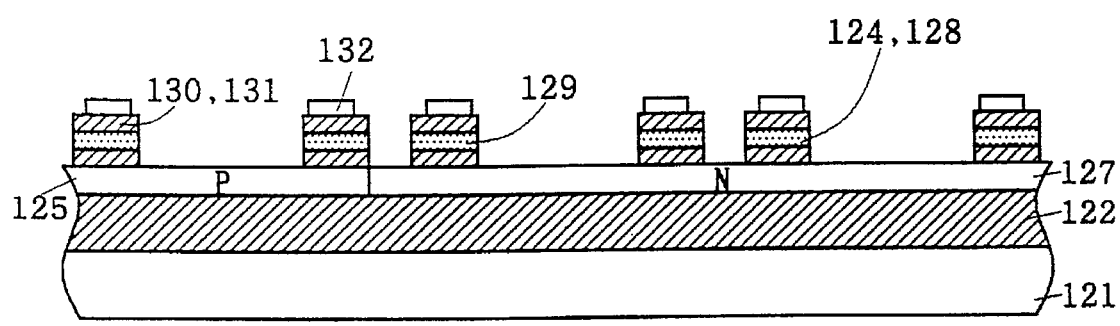

Referring to FIG. 51, a gate oxide film 131 and a gate electrode 132 are formed and resist materials 126B are patterned into prescribed shapes and further etched, thereby obtaining the shape shown in FIG. 52. FIGS. 52 to 57 are sectional views taken along the broken line A-B in FIG. 40.

Figure 53:
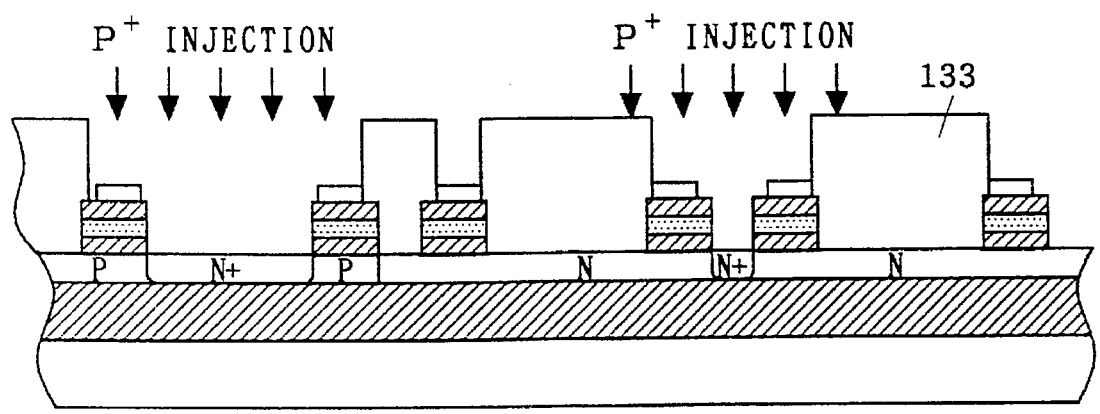

Referring to FIG. 53, resist materials 133 are applied to open a source/drain electrode of the NMOS transistor and a substrate contact formation region of the PMOS transistor by photolithography, and phosphorus, for example, is injected. At this time, injection of phosphorus into the semiconductor layer which is positioned just under the gate electrode 132 and the field shielding gate electrodes 129 of the transistors is inhibited through these electrodes 132 and 129 serving as masks.

Figure 54:
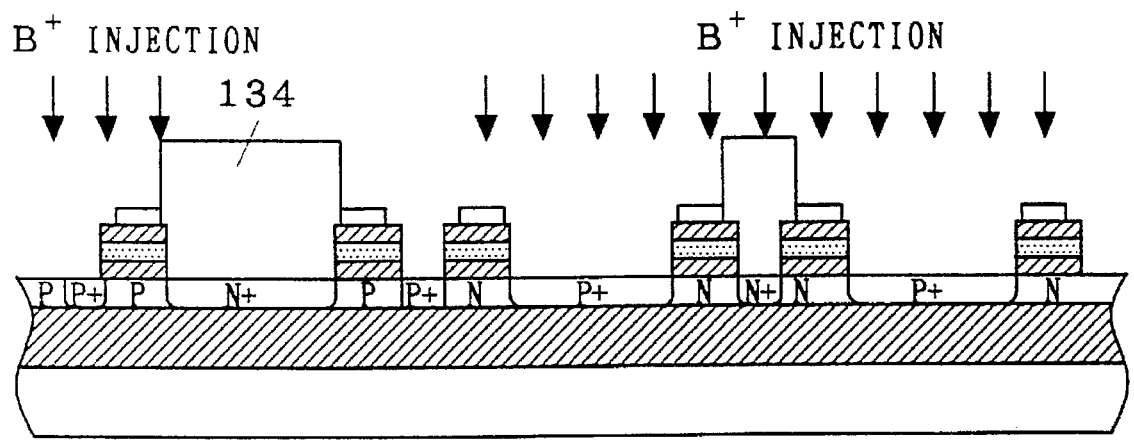

Referring to FIG. 54, resist materials 134 are similarly applied to open a source/drain electrode of the PMOS transistor, a substrate contact formation region of the NMOS transistor and an isolation region between the PMOS and NMOS transistors by photolithography, and boron, for example, is injected. At this time, injection of boron into the semiconductor layer which is positioned just under the gate electrode 132 and the field shielding gate electrodes 129 of the transistors is inhibited through these electrodes 132 and 129 serving as masks.

Figure 55:
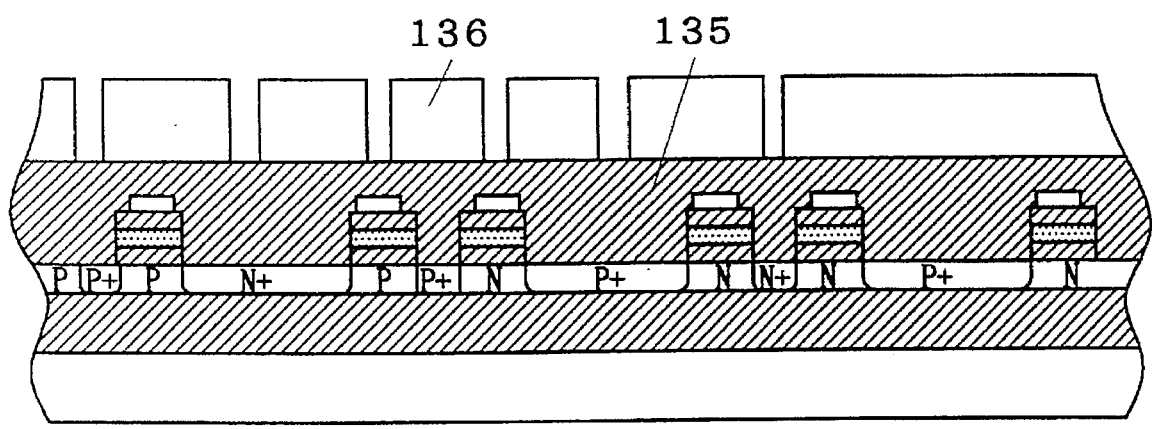

Referring to FIG. 55, overall surfaces of the respective layers which are formed on the upper major surface 118 of the silicon substrate 121 are covered with an oxide film 135 so that resist materials 136 are applied onto its surface, and then the resist materials are removed from contact opening portions by photolithography.

Figure 56:
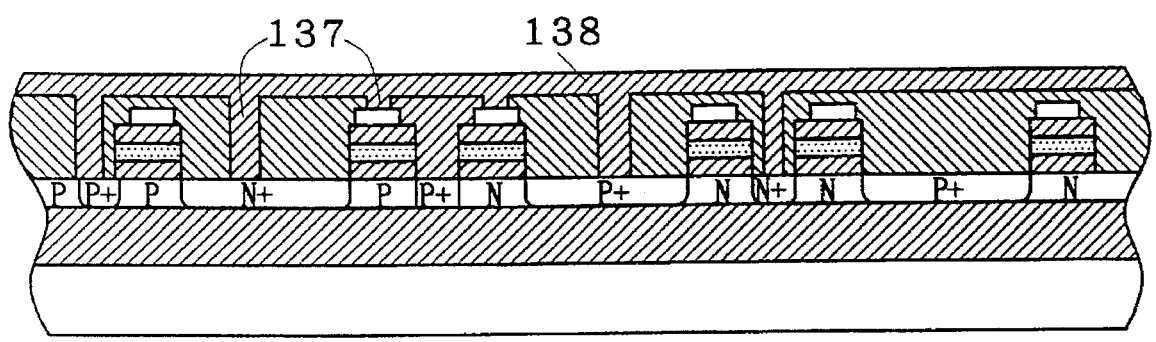

Then, the oxide film 135 is etched and thereafter the resist materials 136 are removed, and contact layers 137 are formed in the contact holes followed by formation of a wiring layer 138, as shown in FIG. 56.

Figure 57:
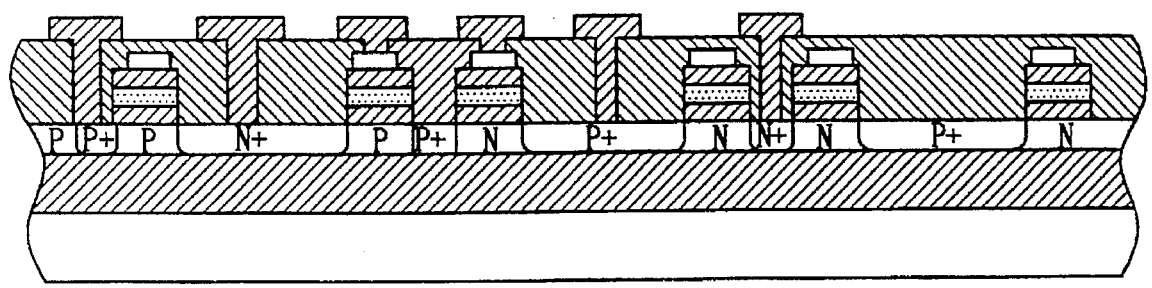

Then, the wiring layer 138 is formed into prescribed shapes by photolithography and etching, whereby the semiconductor integrated circuit device shown in FIG. 57 is completed.

While no contact regions are provided on the field shielding gate electrodes in FIG. 57, the contact regions are also provided on the field shielding gate electrodes through the process steps shown in FIGS. 55 and 56, similarly to the gate electrodes, the source/drain electrodes and the substrate contact arrangement regions of the transistors.

According to this preferred embodiment, as hereinabove described, the isolation region between the PMOS and NMOS transistors is formed by the P-type semiconductor layer 111 (FIGS. 41 and 42) while the end cell 49B (FIG. 44) is formed to be opposed thereto, whereby the withstand voltage is improved similarly to the first and second preferred embodiments. Due to the provision of the P-type semiconductor layer 111, in particular, the fabrication process is simplified as compared with the first preferred embodiment since it is not necessary to form a field oxide film FO.

Figure 58:
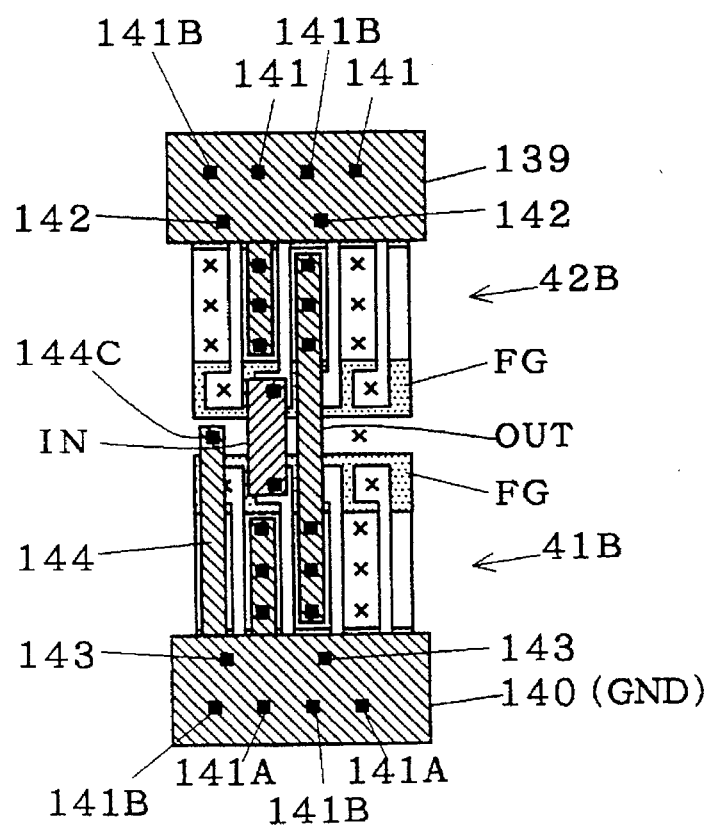
FIG. 58 illustrates another slice cell arrangement in the third preferred embodiment of the present invention.

FIG. 58 shows the CMOS invertor circuit shown in FIG. 6, which is arranged on a master, as an example of a second slice cell employing these fabrication steps. As shown in FIG. 58, the channel region PC of the PMOS transistor 42B (FIG. 42) is connected to a wiring layer 139 of a first power source through the N-type semiconductor layer 112 (FIG. 42) which is positioned just under the field shielding gate electrode FG, the substrate contact arrangement region PBD and contacts 141B, while the channel region NC (FIG. 42) of the NMOS transistor 41B is connected to a wiring layer 140 of a second power source (GND) through the P-type semiconductor layer 114 which is positioned just under the field shielding gate electrode FG, the substrate contact arrangement region NBD and contacts 141B. Consequently, the respective channel regions PC and NC are biased at first and second source potentials respectively. At this time, the respective channel regions PC and NC are drawn out toward the second direction from both ends of the gate electrodes PG and NG due to presence of the field shielding gate electrodes FG (FIG. 42), while the semiconductor layers (109 and 112) (110 and 114) which are positioned just under the field shielding gate electrodes FG are connected with each other by the end cell 49B (FIGS. 43 and 44). Also at this time, the field shielding gate electrodes FG in the PMOS and NMOS transistors 42B and 41B are fixed at the first and second source potentials through contacts 141 and 141A (FIG. 58) which are arranged on the upper major surfaces of the field shielding gate electrodes FG respectively. Further, the PMOS and NMOS transistors 42B and 41B are isolated from PMOS and NMOS transistors which are adjacent thereto by connecting two adjacent gate electrodes in the corresponding basic cell to the wiring layers 139 and 140 of the first and second power sources through contacts 142 and 143 respectively. The above structure is identical to that shown in FIG. 45.

According to this preferred embodiment, the P+ semiconductor layer 111 in the isolation region between the PMOS and NMOS transistors 42B and 41B is connected to the wiring layer 140 of the second power source by a wiring layer 144 and a contact 144C, as shown in FIG. 58. Therefore, the channel region NC (FIG. 42) of the NMOS transistor 41B which is adjacent to the PMOS transistor 42B is not only fixed through the P-type semiconductor layer 116 of the end cell 49B but fixed at the second source potential (GND) also by the wiring layer 144 shown in FIG. 58. Thus, unnecessary holes which are generated in the channel region NC of the NMOS transistor 41B are extracted toward the second source potential through the aforementioned both paths, and the withstand voltage is further improved due to further reduction of extraction resistance.

(Fourth Preferred Embodiment)

Figure 59:
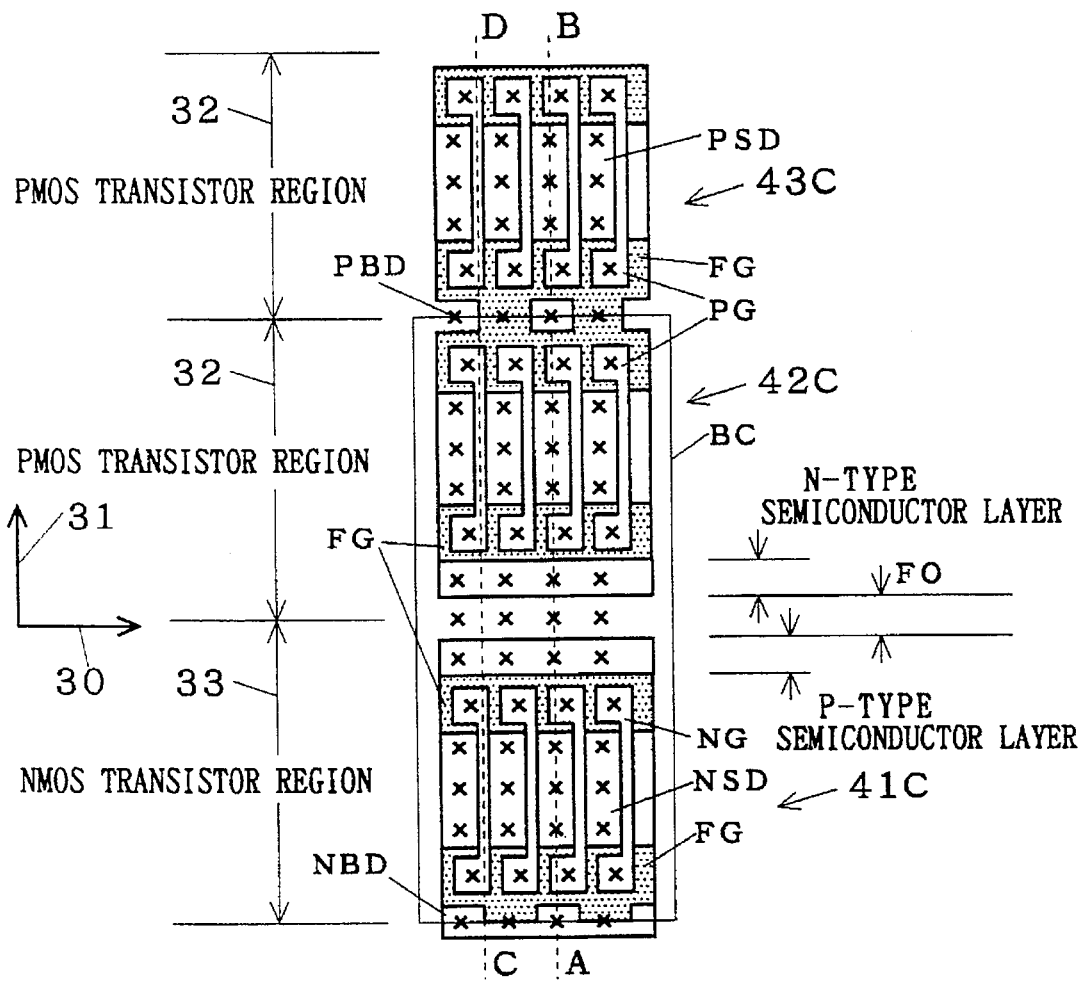
FIG. 59 illustrates the structure of a basic cell according to a fourth preferred embodiment of the present invention.

FIG. 59 is a plan view showing the structure of a basic cell BC according to a fourth preferred embodiment of the present invention, in correspondence to an enlarged view of a portion corresponding to the region 38 shown in FIG. 1. Referring to FIG. 59, numerals and symbols which are identical to those in FIG. 2 denote the same components.

Figure 60:
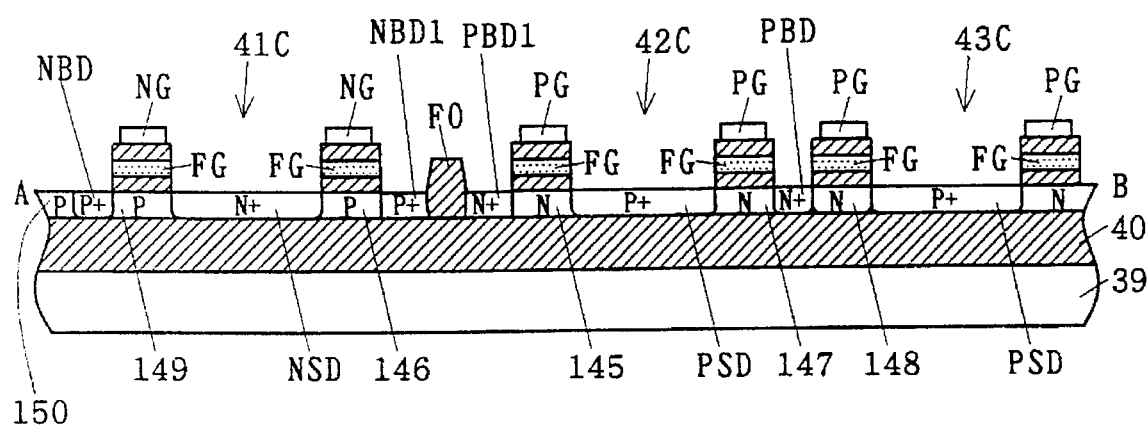
FIG. 60 is a sectional view taken along the broken line A-B in FIG. 59.
Figure 61:
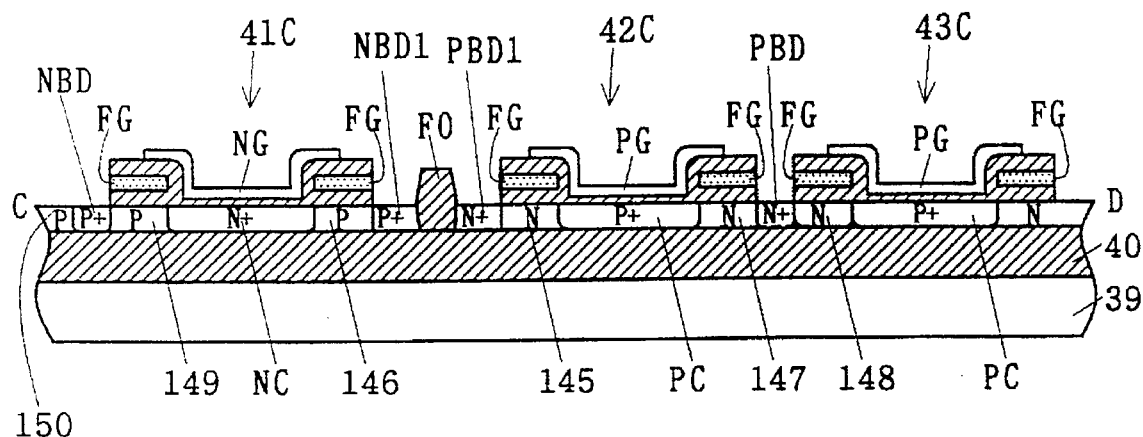
FIG. 61 is a sectional view taken along the broken line C-D in FIG. 59.
Figure 64:
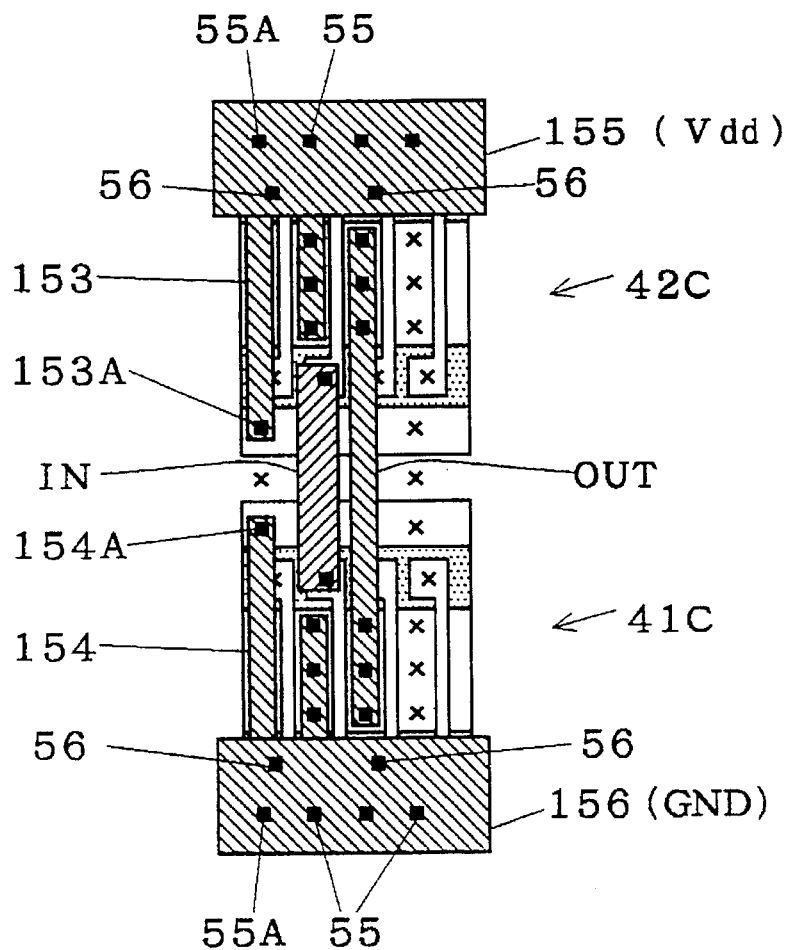
FIG. 64 illustrates slice cell arrangement in the fourth preferred embodiment of the present invention.

FIGS. 60 and 61 are sectional views taken along the broken lines A-B and C-D in FIG. 59 respectively. Referring to FIGS. 60 and 61, numerals and symbols which are identical to those in FIGS. 3 and 4 denote the same components. A PMOS transistor 42C and an NMOS transistor 41C are isolated from each other by an N-type semiconductor layer 145 (an N-type extended layer) which is positioned just under a field shielding gate electrode FG of the PMOS transistor 42C, a substrate contact arrangement region PBD1 (an N-type isolation region layer) consisting of an N-type semiconductor layer, a field oxide film FO in the isolation region, a substrate contact arrangement region NBD1 (a P-type isolation region layer) consisting of a P-type semiconductor layer, and a P-type semiconductor layer 146 (a P-type extended layer) which is positioned just under a field shielding gate electrode FG of the NMOS transistor 41C. Further, the PMOS transistor 42C and another PMOS transistor 43C are isolated from each other by an N-type semiconductor layer consisting of another N-type extended layer 147, the substrate contact arrangement region PBD and the N-type semiconductor layer 148, while the NMOS transistor 41C and another NMOS transistor (not shown) which is adjacent thereto are isolated from each other by a P-type semiconductor layer consisting of another P-type extended layer 149, the substrate contact arrangement region NBD and the P-type semiconductor layer 150. Both of the field shielding gate electrodes FG which are arranged between the PMOS transistors 42C and 43C and between the NMOS transistor 41C and the adjacent NMOS transistor are opened, so that N+ and P+ substrate contact arrangement regions PBD and NBD are formed in the interior of an SOI layer from bottom surfaces of the respective openings. When corresponding voltages are applied to the N+ and P+ substrate contact arrangement regions PBD and NBD respectively as shown in FIG. 64, channel regions PC (N-type semiconductor layers) of the PMOS transistors 42C and 43C and a channel region NC (a P-type semiconductor layer) of the NMOS transistor 41C are fixed at the corresponding potentials which are supplied from the exterior respectively. As shown in FIG. 64, respective regions PBD1 and NBD1 are brought into contact with first and second source potentials, whereby concentration levels of the regions PBD1 and NBD1 are plus +. If no contact is taken, therefore, concentration levels of the respective regions PBD1 and NBD1 may alternatively be minus −.

The layers NBD1 and PBD1 and the field oxide film FO define isolation regions in this case.

Figure 62:
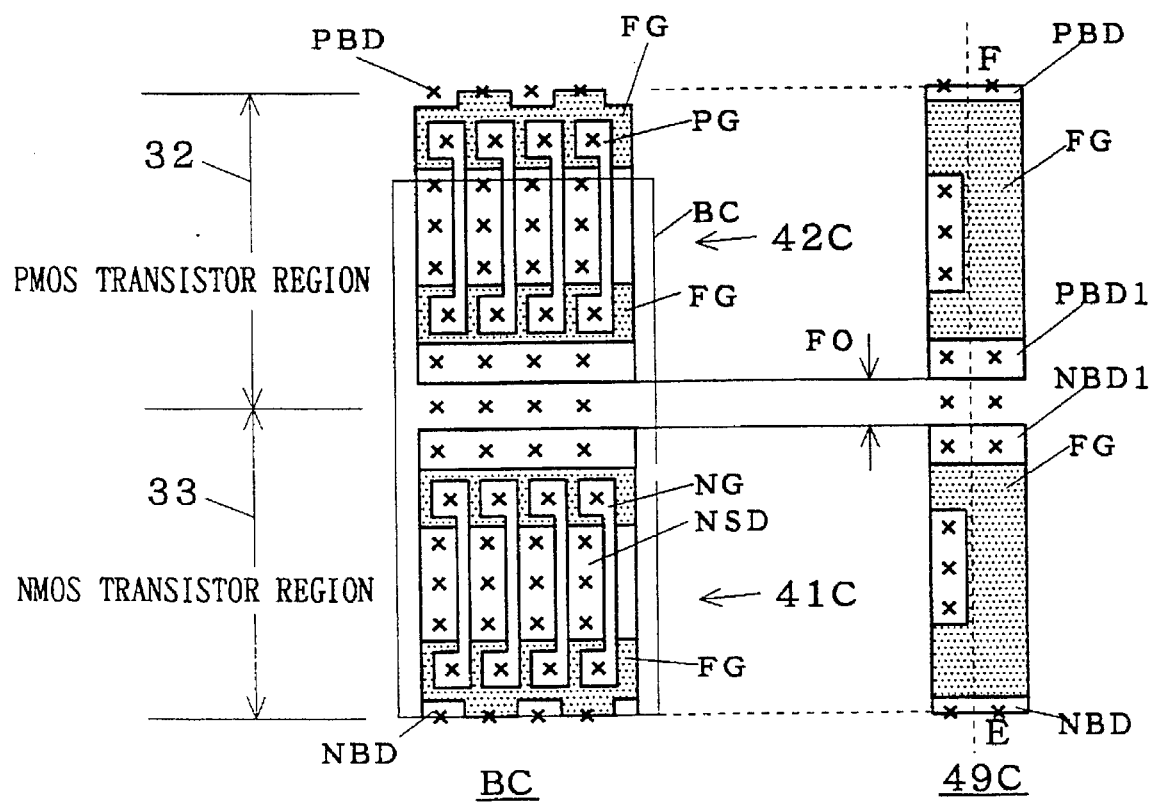
FIG. 62 illustrates the structure of an end cell according to the fourth preferred embodiment of the present invention.
Figure 63:
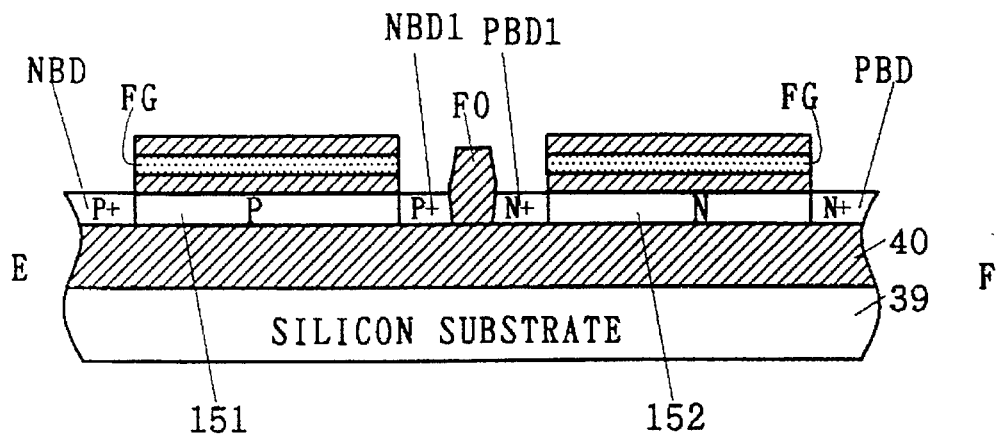
FIG. 63 is a sectional view taken along the broken line E-F in FIG. 62.

FIG. 62 is a plan view of an end cell 49C according to the fourth preferred embodiment, corresponding to the end cell 49 shown in FIG. 1, and FIG. 63 is a sectional view taken along the broken line E-F in FIG. 62 respectively. As shown in FIG. 63, the end cell 49C has a P-type semiconductor layer 151, an N-type semiconductor layer 152, the P+ semiconductor layer NBD1, the N+ semiconductor layer PBD1, the field oxide film FO, and the substrate contact arrangement regions PBD and NBD on the upper major surface of the buried oxide film 40.

As hereinabove described, the end cells 49C shown in FIG. 63 are arranged on each end of a first region formed by repeatedly arranging the basic cells BC, whereby the N-type semiconductor layers 145 and 147 on both ends of the PMOS transistor 42C are connected with each other through the N-type semiconductor layer 152 of the end cell 49, while the P-type semiconductor layers 146 and 149 on both ends of the NMOS transistor 41C are also connected with each other by the P-type semiconductor layer 151. Thus, the withstand voltage is improved.

FIG. 64 is a plan view showing the slice cell of the CMOS invertor circuit shown in FIG. 98, which is arranged on a master, for example. The arrangement shown in FIG. 64 is different from that shown in FIG. 8 in a point that first and second wiring layers 153 and 154 are provided. The remaining structure is identical to that shown in FIG. 8. The N+ and P+ type semiconductor layers PBD1 and NBD1 provided in the isolation region between the PMOS transistor 42C and the NMOS transistor 41C are connected to wiring layers 155 and 156 of first and second power sources by the first and second wiring layers 153 and 154 and contacts 153A and 154A respectively. Therefore, respective channel regions PC and NC of the PMOS transistor 42C and the NMOS transistor 41C are fixed to first and second source potentials not only through the N-type semiconductor layer 152 and the P-type semiconductor layer 151 (FIG. 63) of the end cell region but also by the fist and second wiring layers 153 and 154, respectively. Thus, extraction resistance of unnecessary carriers which are stored in the channel regions is further reduced, whereby further improvement of the withstand voltage can be attained. Further, isolation in the aforementioned isolation regions is completely implemented due to presence of the P+ and N+ semiconductor layers NBD1 and PBD1 to which the second and first potentials GND and Vdd are applied respectively and a field oxide film FO serving as a LOCOS film, whereby a possibility of a latch-up phenomenon can be prevented.

Principal steps of fabricating the gate array semiconductor integrated circuit device according to this preferred embodiment are identical to those described with reference to the third preferred embodiment, and hence redundant description is omitted. The N+ substrate contact region PBD1 (FIGS. 60 and 61) of the isolation region between the PMOS transistor 42C and the NMOS transistor 41C is implemented by opening a resist material in this region in a step of forming a source/drain electrode of the NMOS transistor and injecting phosphorus, for example.

(Fifth Preferred Embodiment)

Figure 65:
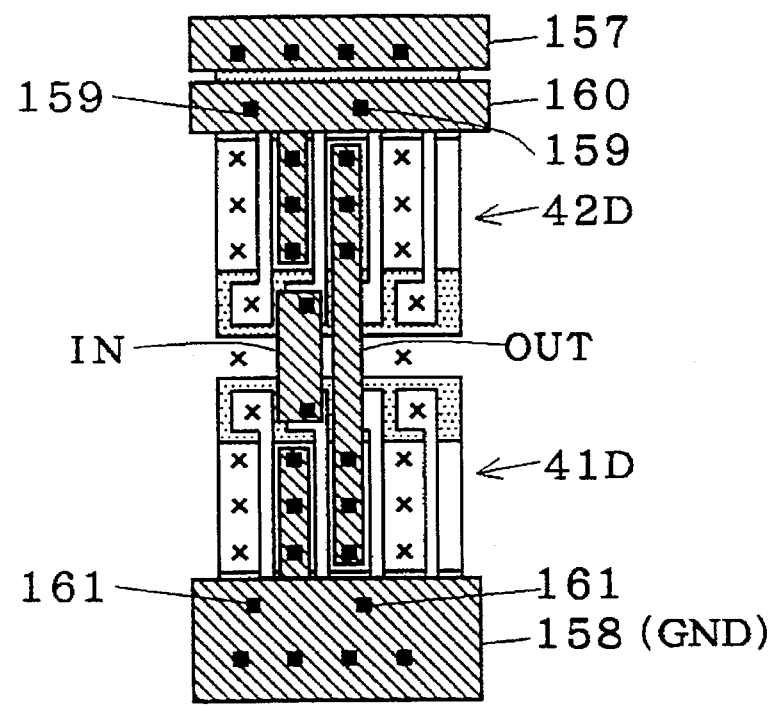
FIG. 65 illustrates another slice cell arrangement in the first preferred embodiment of the present invention.
Figure 66:
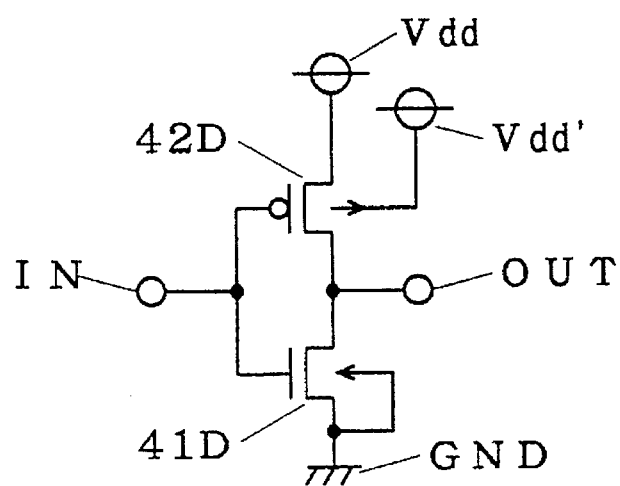
FIG. 66 illustrates another invertor gate of the present invention.

FIG. 65 is a plan view showing the structure of another slice cell according to the first preferred embodiment. In this slice cell, as shown in FIG. 66, the potential (a back gate potential) of the channel region PC (FIG. 4) of a PMOS transistor 42D forming a CMOS invertor circuit is fixed at a third source potential Vdd' (Vdd>Vdd'>0) which is lower than a first source potential Vdd and higher than a second source potential GND.

Figure 67A:
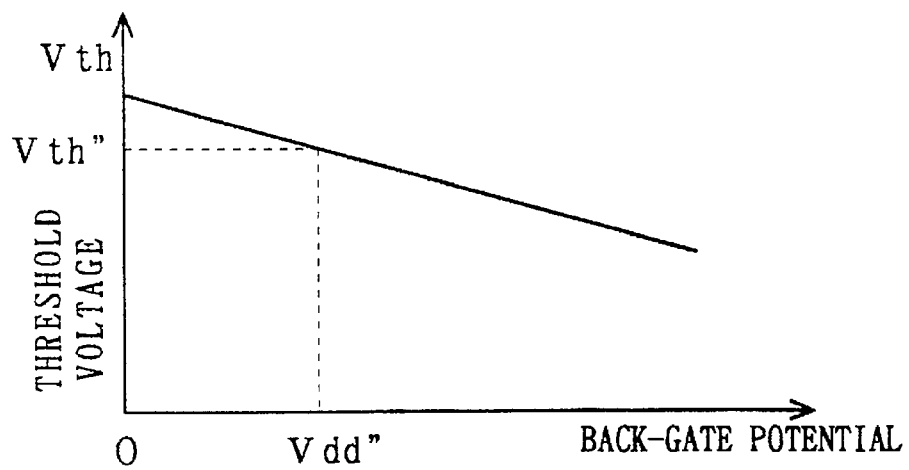
FIGS. 67(a) and 67(b) illustrate the relation between a back gate potential and a threshold value and an effect thereof, respectively.
Figure 67B:
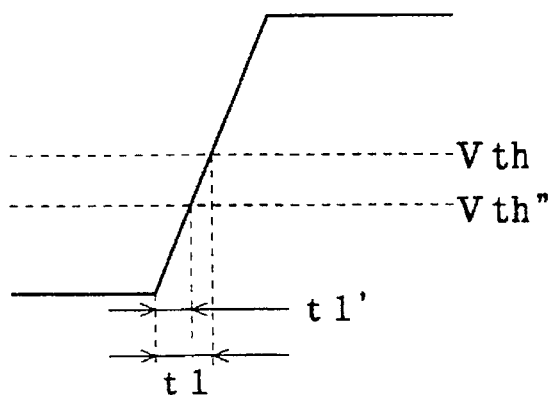

Referring to FIG. 65, the channel region PC (see FIG. 4) of the PMOS transistor 42D is connected to a wiring layer 157 of the third power source Vdd' through the N-type semiconductor layer 46 which is positioned just under the field shielding gate electrode FG and the substrate contact arrangement region PBD, while the channel region NC (FIG. 4) of an NMOS transistor 41D is connected to a wiring layer 158 of the second power source through the P-type semiconductor layer 48 which is positioned just under the field shielding gate electrode FG and the substrate contact arrangement region NBD, whereby the respective channel regions PC and NC are biased at the third and second source potentials Vdd' and GND respectively. Further, source electrodes of the PMOS transistor 42D and the NMOS transistor 41D are connected to the first and second power sources Vdd and GND respectively. This is performed with attention drawn the following point:

As shown in FIG. 67(a), the back gate potential is generally set at the ground potential GND in the case of an NMOS transistor, for example, while a threshold voltage Vth is reduced as the back gate potential is set at a larger value. Therefore, when the back gate potential is set at a level Vdd" in FIG. 67(a), for example, the threshold voltage is Vth" (<Vth), whereby a rise time T1' of the transistor becomes smaller than a rise time t1 in the case where the back gate potential is at the ground potential GND, as shown in FIG. 67(b). This also applies to a PMOS transistor, whose threshold voltage is reduced as the back gate potential is set to be smaller than the source voltage Vdd. When this effect is also applied to a gate array SOI semiconductor integrated circuit device, therefore, the speeds of the transistor operations can be increased.

The PMOS transistor 42D and the NMOS transistor 41D are isolated from PMOS and NMOS transistors which are adjacent thereto in the basic cell BC by connecting adjacent gate electrodes in the basic cell BC to wiring layers 160 and 158 of the first and second power sources Vdd and GND through contacts 159 and 161 respectively.

Figure 68:
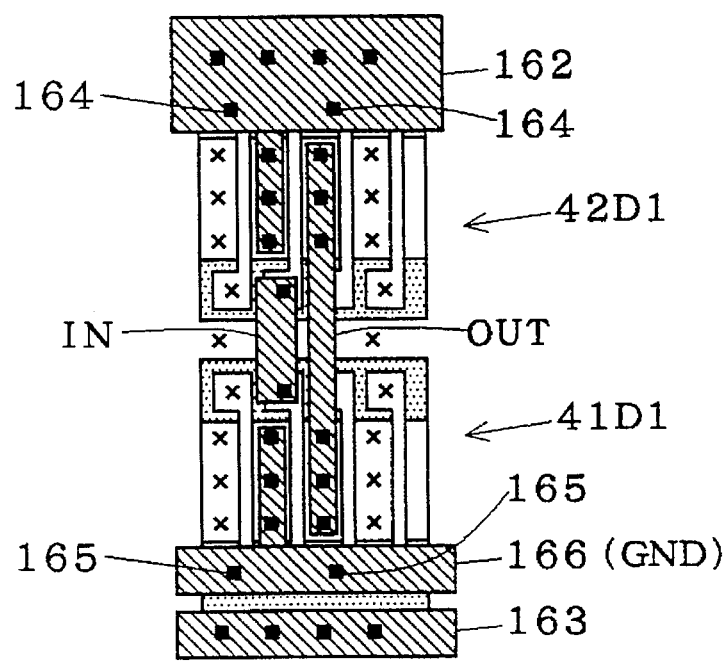
FIG. 68 illustrates still another slice cell arrangement in the first preferred embodiment of the present invention.

FIG. 68 illustrates the structure of still another slice cell according to the first preferred embodiment. In this slice cell, the potential (the back gate potential) of the channel region of an NMOS transistor 41D1 forming the CMOS invertor circuit is set at a fourth source potential Vdd" which is lower than the first source potential Vdd and higher than the second source potential GND, as shown in FIG. 69(a).

Referring to FIG. 68, the channel region of a PMOS transistor 42D1 is connected to a wiring layer 162 of the first power source Vdd through the N-type semiconductor layer 46 which is positioned just under its field shielding gate electrode FG and the substrate contact arrangement region PBD (FIG. 4), and the channel region of the NMOS transistor 41D1 is connected to a wiring layer 163 of the fourth power source Vdd" through the P-type semiconductor layer 48 which is positioned just under its field shielding gate electrode FG and the substrate contact wiring region NBD, so that the channel regions are biased at the first and fourth source potentials Vdd and Vdd" respectively. Further, source electrodes of the PMOS transistor 42D1 and the NMOS transistor 41D1 are connected to the first and second power sources Vdd and GND (162 and 166) respectively. Also in this case, the PMOS transistor 42D1 and the NMOS transistor 41D1 are isolated from PMOS and NMOS transistors which are adjacent thereto in the basic cell BC by connecting adjacent gate electrodes in the basic cell BC to the wiring layers 162 and 166 of the first and second power sources through contacts 164 and 165 respectively.

While the channel region of either the PMOS or NMOS transistor of the invertor circuit is connected to the third or fourth power source in this preferred embodiment, both of the third and fourth power sources may alternatively be provided in the interior of the slice cell so that both transistors are connected to the third or fourth power source (see FIG. 69(b), for example).

Figure 70A:
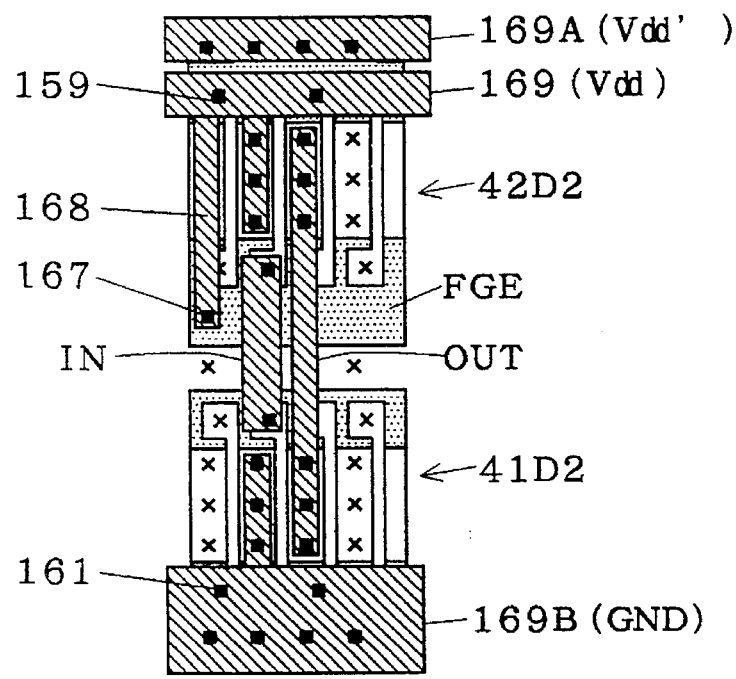
FIGS. 70(a) and 70(b) illustrate further slice cell arrangements in the first preferred embodiment of the present invention.

FIG. 70(a) is a plan view showing the structure of a further slice cell according to the first preferred embodiment. A field shielding gate electrode FG of a PMOS transistor 42D2 (42 in FIGS. 2 and 3→42D2) which is adjacent to an NMOS transistor 41D2 (conversion of 41 in FIGS. 2 and 3→41D2) is further extended toward the NMOS transistor 41 D2 in the basic cell BC according to the first preferred embodiment, so that a contact 167 is provided on an upper major surface of the extended portion FGE and the field shielding gate electrode FG is connected to a wiring layer 169 of the first power source Vdd by a wiring layer 68.

Figure 70B:
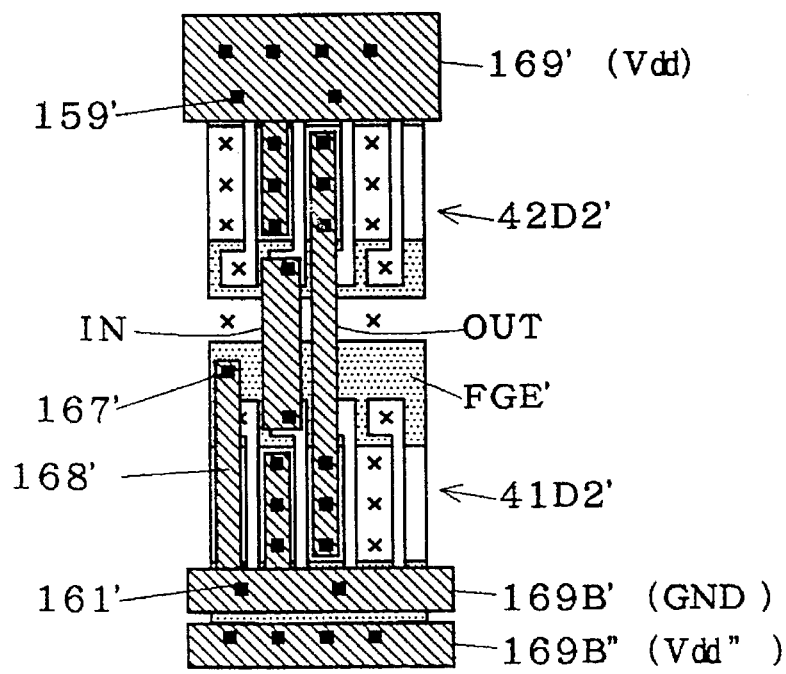

While the field shielding gate electrode FG of the PMOS transistor 42D2 is connected to the first power source Vdd in FIG. 70 (a), a field shielding gate electrode FG of the NMOS transistor 41 D2 may also be connected to the second power source GND in a similar manner to the above (see FIG. 70(b)).

This fifth preferred embodiment is applicable to the second to fourth preferred embodiments, as well as to the case of providing none of the aforementioned end cell regions.

(Sixth Preferred Embodiment)

Figure 71:
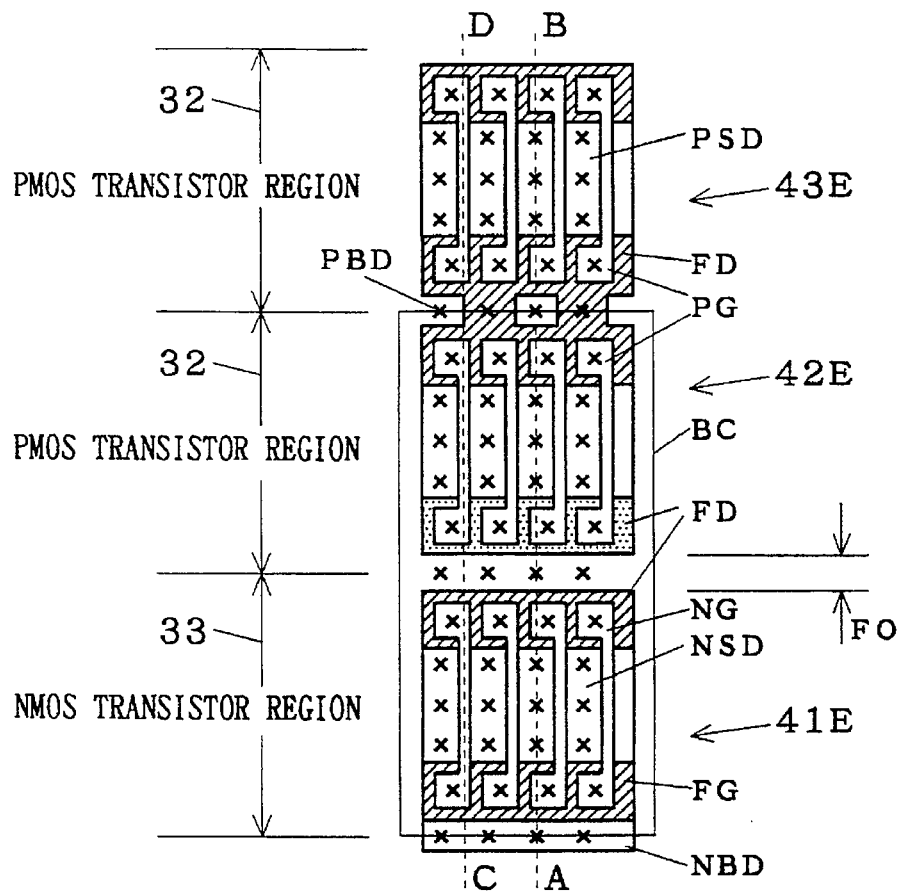
FIG. 71 illustrates the structure of a basic cell according to a sixth preferred embodiment of the present invention.

FIG. 71 is a plan view showing the structure of a basic cell BC, in correspondence to an enlarged view of the region 38 shown in FIG. 1. Referring to FIG. 71, numerals which are identical to those in FIG. 2 denote the same components. A simbol FD denotes an oxide film.

Figure 72:
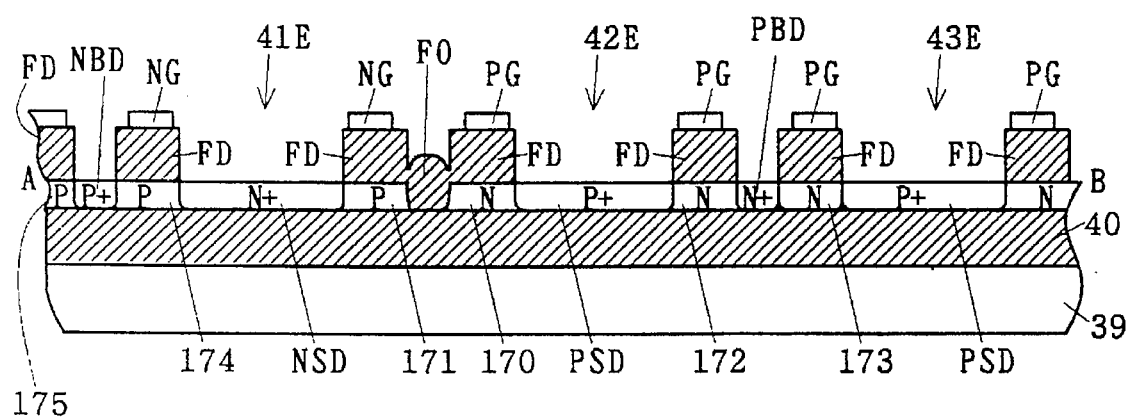
FIG. 72 is a sectional view taken along the broken line A-B in FIG. 70.
Figure 73:
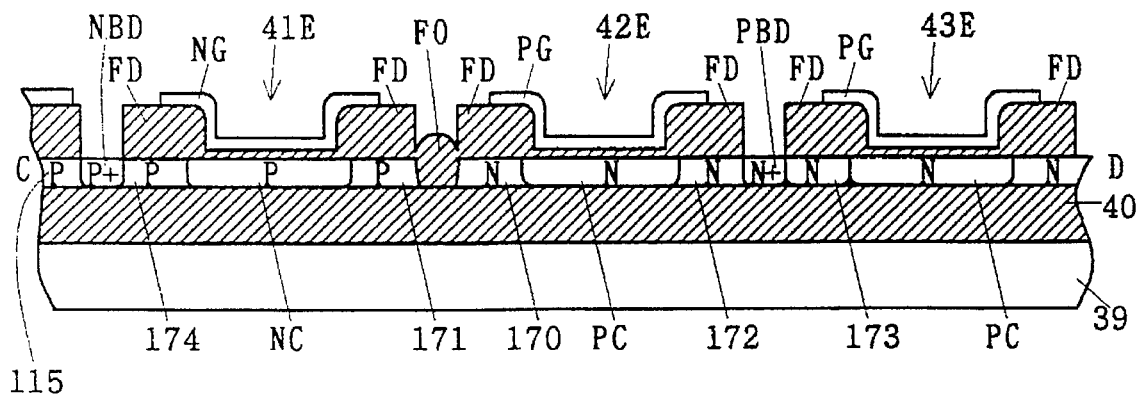
FIG. 73 is a sectional view taken along the broken line C-D in FIG. 70.

FIGS. 72 and 73 are sectional views taken along the broken lines A-B and C-D in FIG. 71 respectively. Referring to FIGS. 72 and 73, numerals which are identical to those in FIGS. 3 and 4 denote the same components. A PMOS transistor 42E and an NMOS transistor 41E are isolated from each other by an N-type semiconductor layer 170 (an N-type extended layer) which is positioned just under an oxide film FD, a field oxide film FO forming an isolation region, and a P-type semiconductor layer 171 (a P-type extended layer) which is positioned just under an oxide film FD. The PMOS transistor 42E and another PMOS transistor 43E are isolated from each other by an N-type semiconductor layer (it includes another N-type extended layer 172, the layer PBD and the layer 173), while the NMOS transistor 41E and another NMOS transistor (not shown) which is adjacent thereto are isolated from each other by a P-type semiconductor layer (it includes another P-type extended layer 174, the layer NBD and the layer 175) respectively. Respective oxide films FD which are arranged between the PMOS transistors 42E and 43E and between the NMOS transistor 41E and the adjacent NMOS transistor (not shown) are opened so that N+ and P+ substrate contact arrangement regions PBD and NBD are formed in the respective openings. When corresponding voltages are applied to the N+ and P+ substrate contact arrangement regions PBD and NBD respectively, channel regions PC (N-type semiconductor layers) of the PMOS transistors 42E and 43E and a channel region NC (a P-type semiconductor layer) of the NMOS transistor 41 are potential-fixed.

Figure 74:
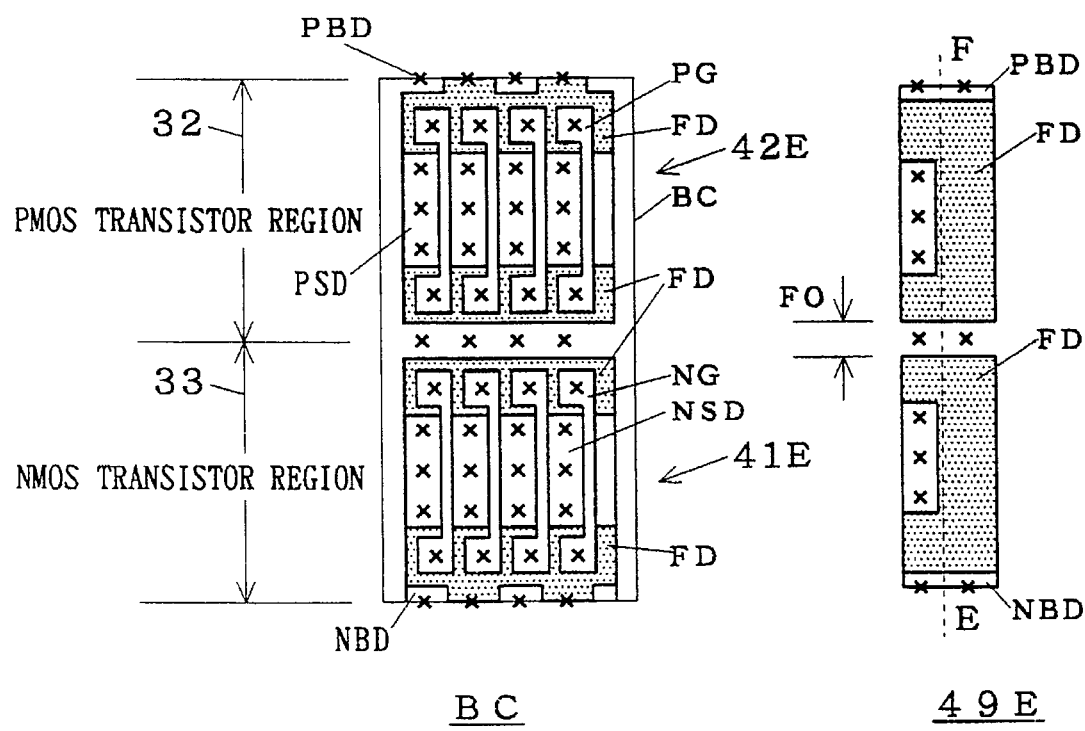
FIG. 74 illustrates the structure of an end cell according to the sixth preferred embodiment of the present invention.
Figure 75:
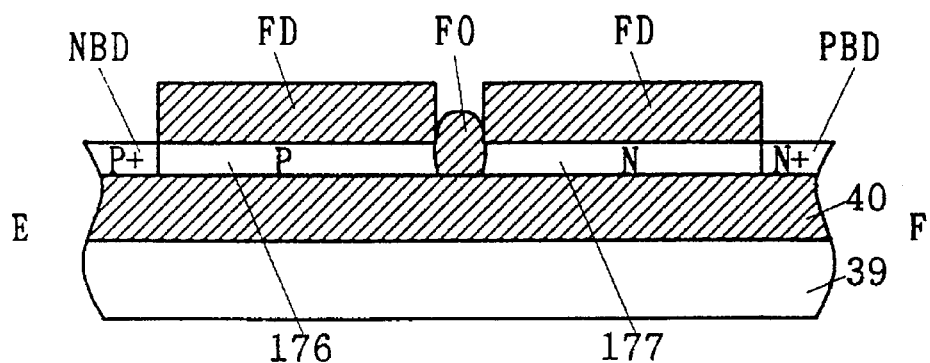
FIG. 75 is a sectional view taken along the broken line E-F in FIG. 75.

FIG. 74 is a plan view showing an end cell 49E according to a sixth preferred embodiment in correspondence to the end cell 49 in FIG. 1, and FIG. 75 is a sectional view taken along the broken line E-F in FIG. 74 respectively. As shown in FIG. 75, the end cell 49E has P-type and N-type semiconductor layers 176 and 177 which are formed on an upper major surface of the buried oxide film 40, oxide films FD and a field oxide film FO which are formed on and between upper surfaces thereof respectively, and substrate contact arrangement regions PBD and NBD.

N-type semiconductor layers 170 and 172 in both ends of the PMOS transistor 42E (FIG. 73) are connected with each other by arranging the end cells 49E on each end of a first region formed by repeatedly arranging the basic cell BC to thereby form a second region, while P-type semiconductor layers 171 and 174 in both ends of the NMOS transistor 41E are also connected with each other. Thus, the withstand voltage can be improved.

Figure 76:
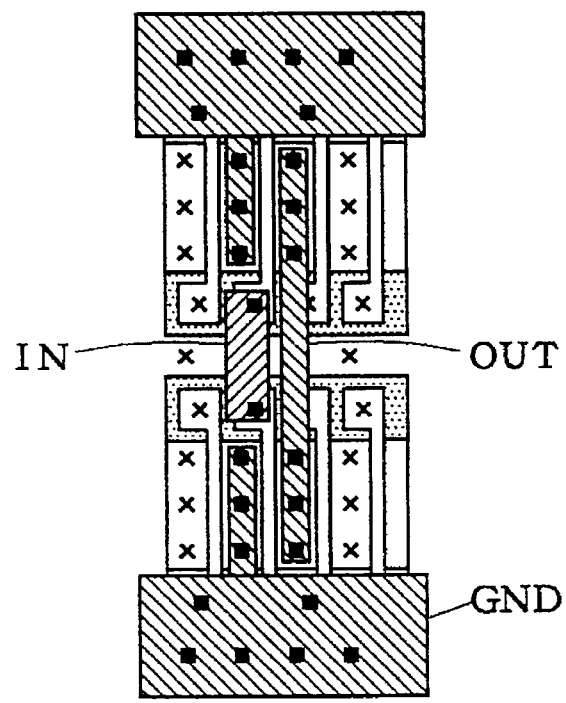
FIG. 76 illustrates slice cell arrangement in the sixth preferred embodiment of the present invention.

FIG. 76 is a plan view showing the slice cell of the CMOS invertor circuit shown in FIG. 98, which is arranged on a master, for example. The arrangement shown in FIG. 76 corresponds to that shown in FIG. 8. Therefore, redundant description is omitted.

Principal steps of fabricating this gate array semiconductor integrated circuit device are now described.

Figure 77:
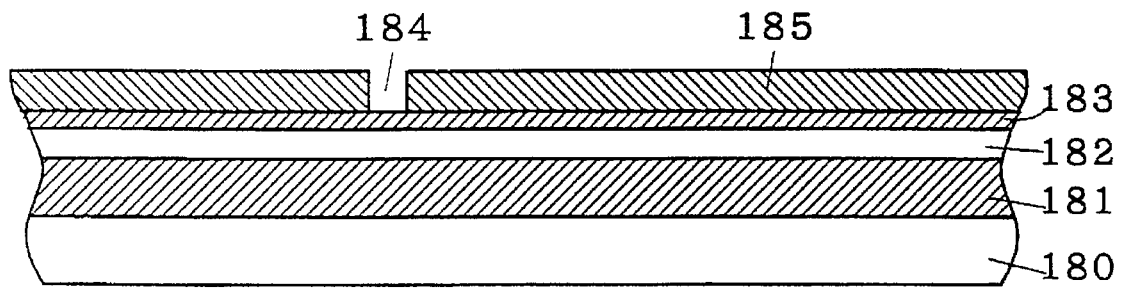
FIGS. 77 to 89 are sectional views showing a fabrication step according to the sixth preferred embodiment of the present invention.

Referring to FIG. 77, a buried oxide film 181 and an SOI layer 182 are first formed on an upper major surface of a silicon substrate 180. Then, a silicon oxide film 183 is formed on an upper major surface of the SOI layer 182 by thermal oxidation. Thereafter, a silicon nitride film 185 having a prescribed opening 184 is formed on an upper major surface of the silicon oxide film 183.

Figure 78:
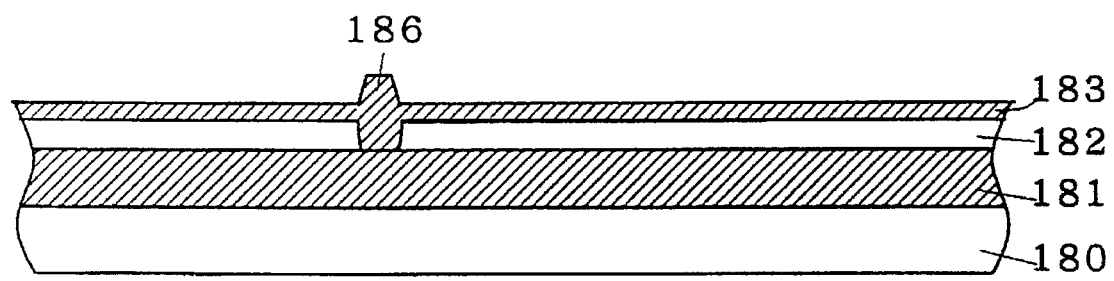

Referring to FIG. 78, a first field oxide film 186 is formed by selective oxidation, and the nitride film 185 is removed. At this time, the first field oxide film 186 is so formed that its lower surface reaches the upper major surface of the buried oxide film 181.

Figure 79:
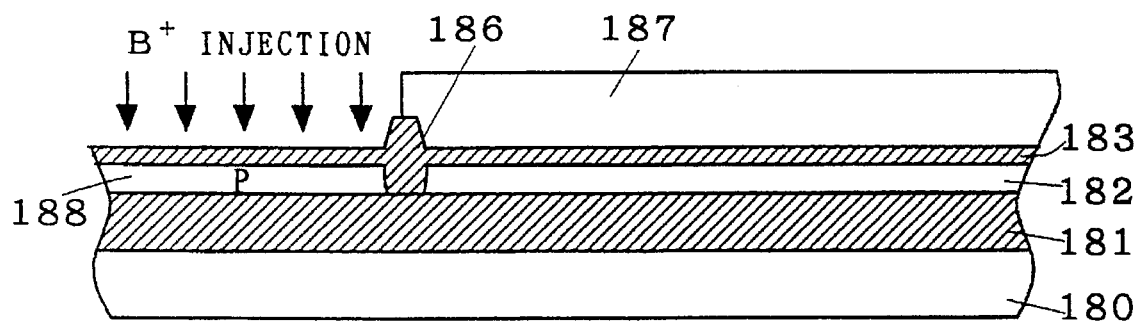

Referring to FIG. 79, a resist material 187 is applied to open a PMOS transistor formation region by photolithography, and boron, for example, is injected to form a channel region 188 of a PMOS transistor.

Figure 80:
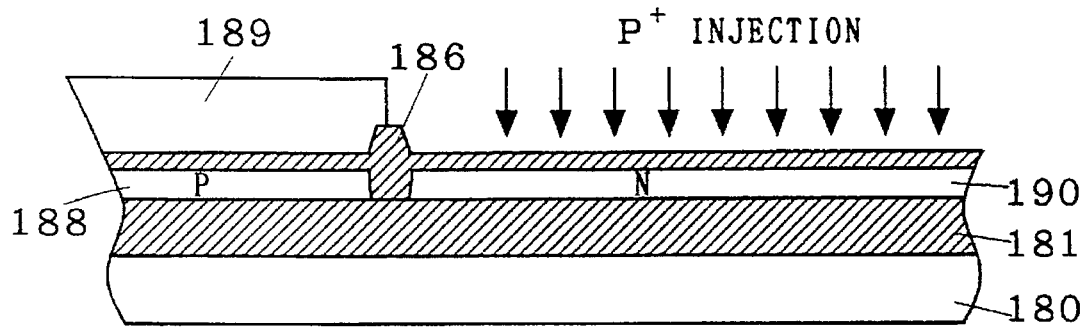

Referring to FIG. 80, another resist material 189 is similarly applied to open an NMOS transistor formation region by photolithography, and phosphorus, for example, is injected to form a channel region 190 of an NMOS transistor.

Figure 81:
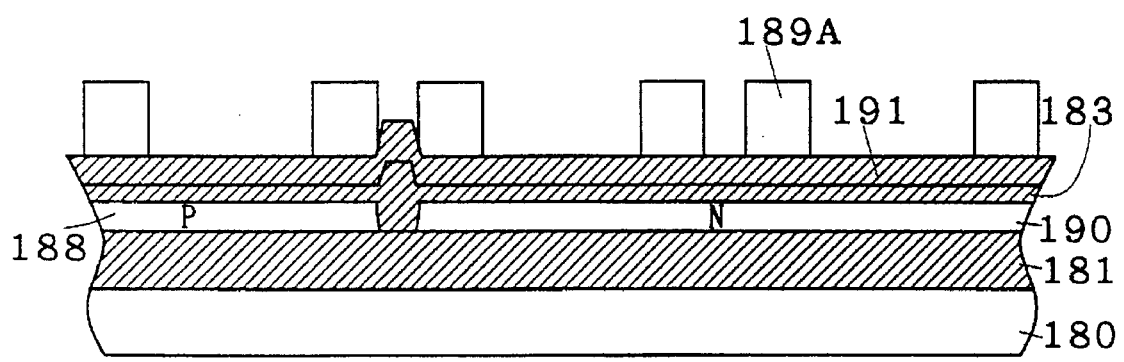
Figure 82:
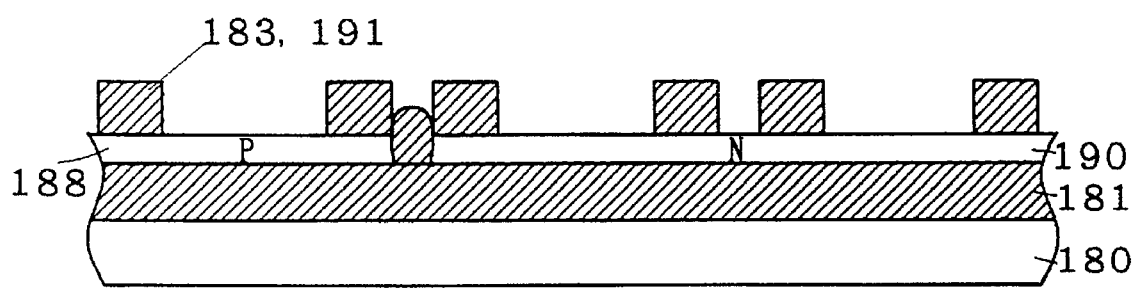

Referring to FIG. 81, an oxide film (FD) 191 is formed on the upper major surface of the silicon oxide film 183, and resist materials 189A are patterned into prescribed shapes by photolithography, so that the oxide film 191 is thereafter etched to obtain oxide films 183 and 191 of desired shapes shown in FIG. 82. The oxide films FD consist of the patterned oxide films 183 and 191. The forming positions of the oxide films FD are similar to those described with reference to FIG. 14.

Figure 83:
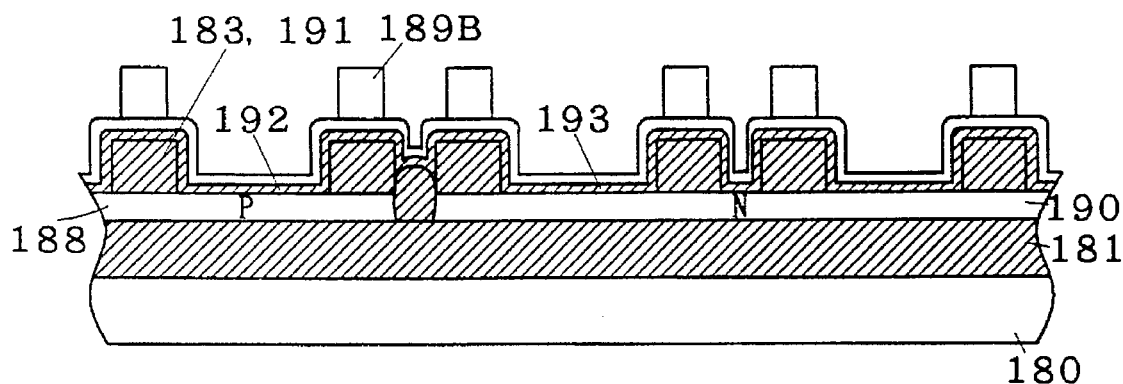
Figure 84:
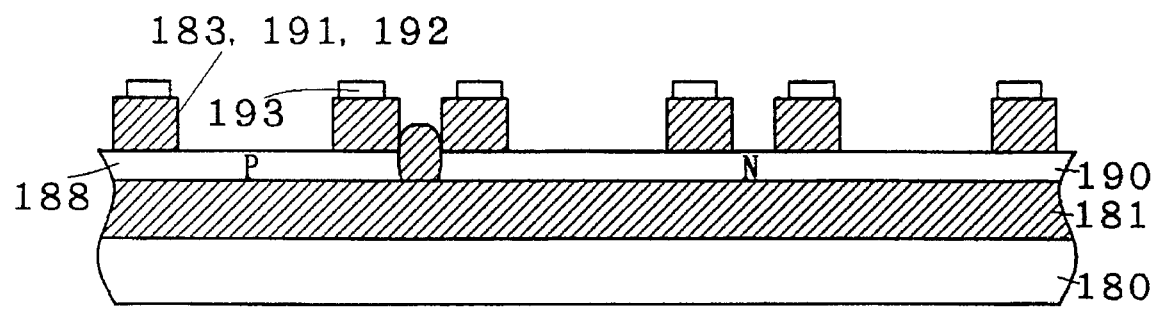

Referring to FIG. 83, a gate oxide film 192 and a gate electrode 193 are formed and resist materials 189B are patterned into prescribed shapes and further etched, thereby obtaining the shape shown in FIG. 84. FIGS. 84 to 89 are sectional views taken along the broken line A-B in FIG. 71.

Figure 85:
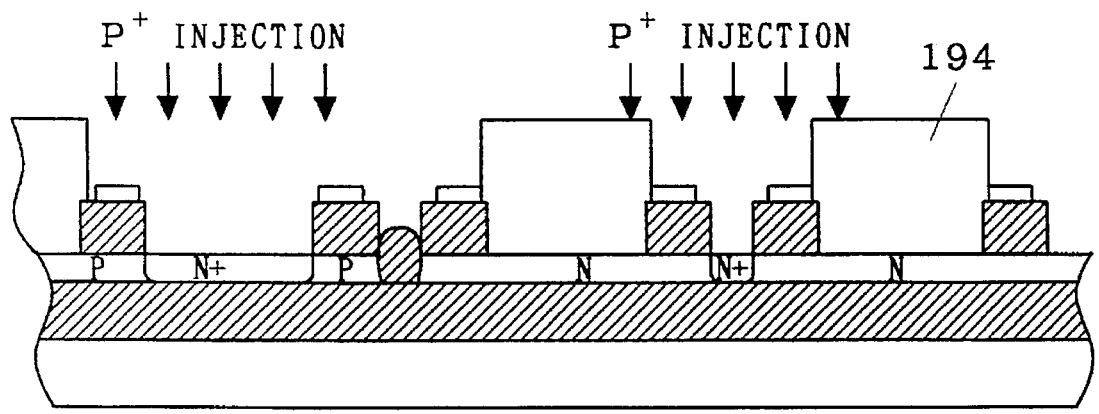

Referring to FIG. 85, resist materials 194 are applied to open source/drain electrodes of the NMOS transistor and a substrate contact formation region of the PMOS transistor, and phosphorus, for example, is injected. At this time, injection of phosphorus into semiconductor layers which are positioned just under the gate electrode of the transistor and the oxide film which is larger in thickness than that in the first preferred embodiment is prevented since the gate electrode and the oxide film serve as masks.

Figure 86:
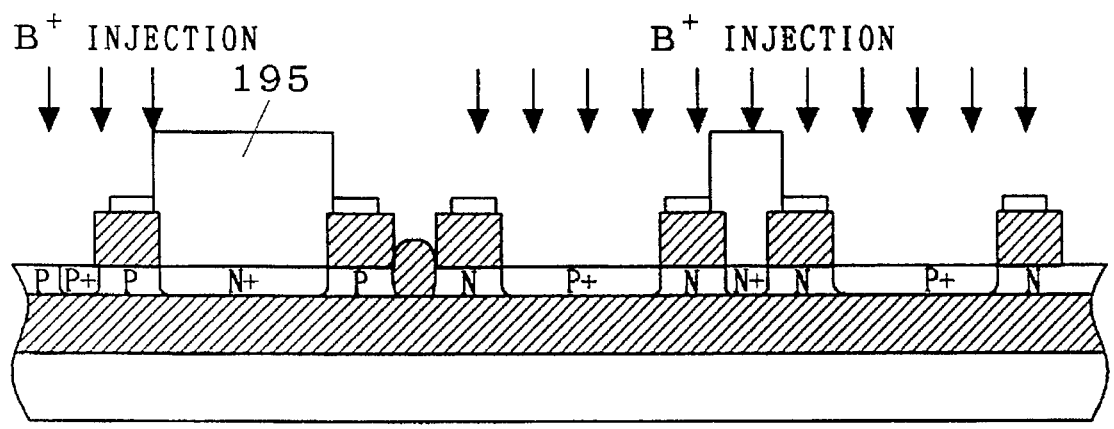

Referring to FIG. 86, resist materials 195 are applied to open source/drain electrodes of the PMOS transistor and a substrate contact formation region of the NMOS transistor by photolithography, and boron, for example, is injected. At this time, the gate electrode of the transistor and the thick oxide film serve as masks, thereby preventing injection of boron into the semiconductor layers which are positioned just under the gate electrode and the thick oxide film.

Figure 87:
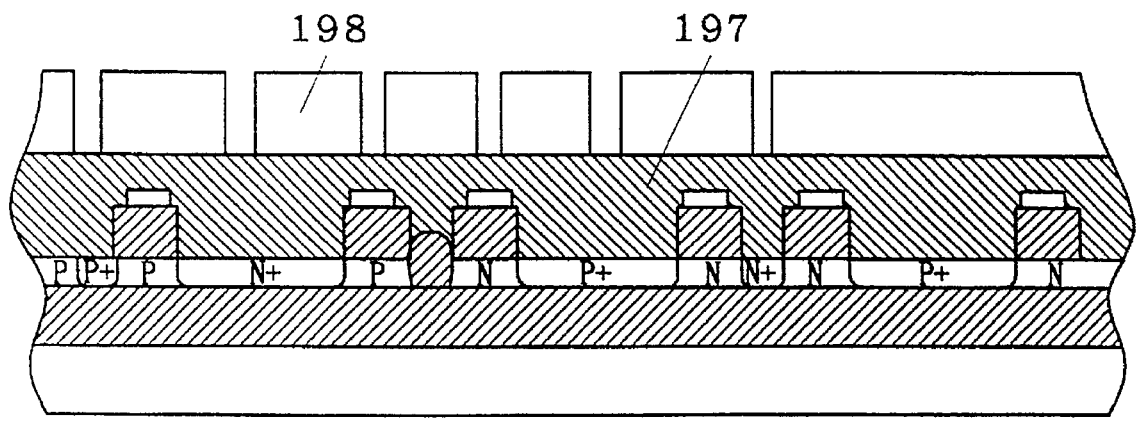

Referring to FIG. 87, overall surfaces of the respective parts provided on the upper major surface of the silicon substrate 180 are covered with an oxide film 197, resist materials 198 are applied, and the resist materials are removed from contact opening portions by photolithography.

Figure 88:
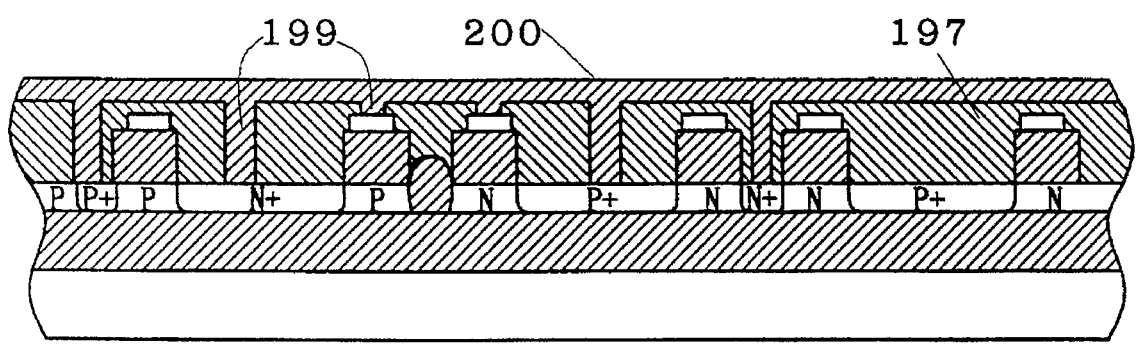

Then, the oxide film 197 is etched and the resist materials 198 are further removed, so that contact layers 199 are formed in the contact holes followed by formation of a wiring layer 200, as shown in FIG. 88.

Figure 89:
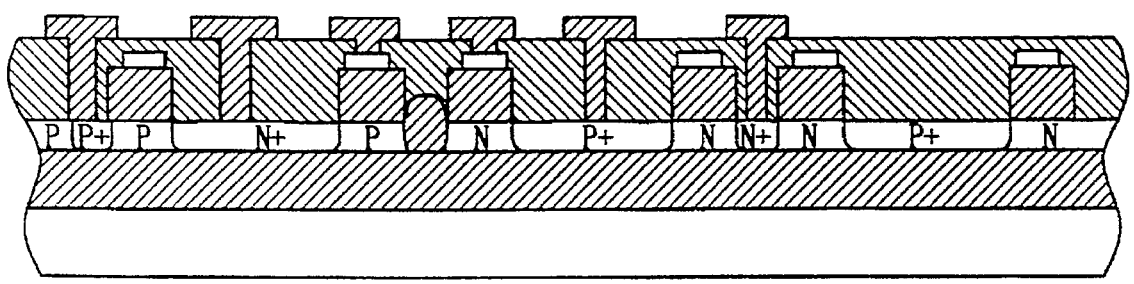

Then, the wiring layer 200 is formed into a plurality of wiring layers of desired shapes by photolithography and etching, whereby a semiconductor integrated circuit device shown in FIG. 89 is completed.

While no contact regions are provided on the major surfaces of the field shielding gate electrodes FG in FIG. 89, the contact regions are also provided on the upper major surfaces of the field shielding gate electrodes FG through the process steps shown in FIGS. 87 and 88, similarly to the gate electrodes, the source/drain electrodes and the substrate contact regions of the transistors.

(Seventh Preferred Embodiment)

Figure 90:
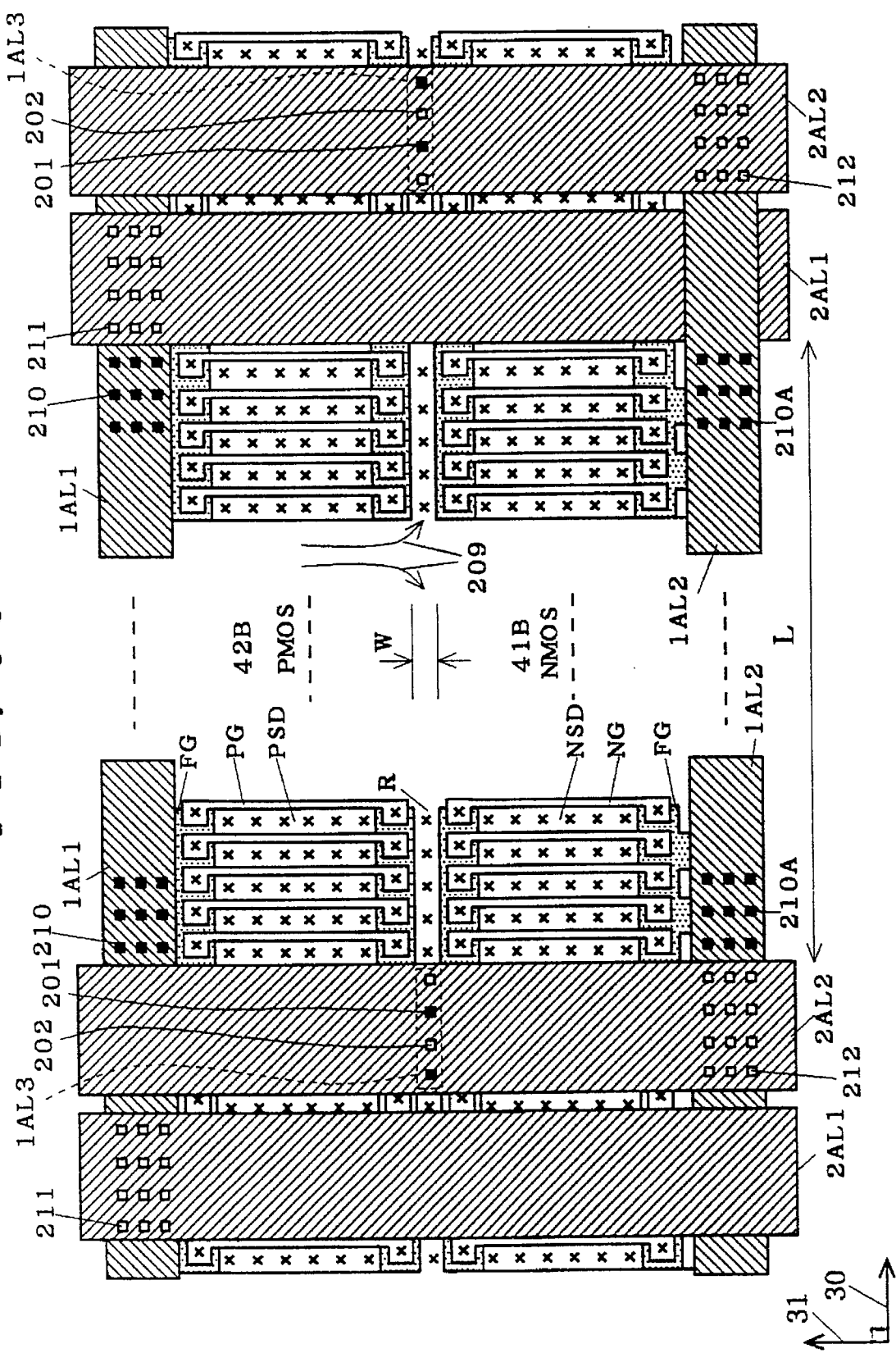
FIG. 90 is a plan view showing the structure of a gate array SOI semiconductor integrated circuit device according to a seventh preferred embodiment of the present invention.

FIG. 90 is a plan view showing the wiring structure of a gate array SOI semiconductor integrated circuit device according to a seventh preferred embodiment of the present invention. This preferred embodiment, which corresponds to a modification of the third preferred embodiment, proposes a new structure for substituting for the wiring layer 144 shown in FIG. 58. Therefore, mastered structures of a PMOS transistor 42B and an NMOS transistor 41B forming each basic cell shown in FIG. 90 are identical to those shown in FIGS. 40 to 42, and a P+ semiconductor layer 111 which is identical to that shown in FIGS. 41 and 42 is formed in an isolation region in an SOI layer held between the adjacent transistors 42B and 41B. However, the preferred embodiment shown in FIG. 90 employs no end cell 49B, which is employed in the third preferred embodiment. Namely, an internal transistor region corresponding to that shown in FIG. 1 consists of only the first region excluding the end cell region 34 (the second region).

Referring to FIG. 90, mark X denotes contact positions, and numerals which are identical to those in FIG. 40 denote the same components. Numeral 1AL1 denotes a first Al (alminum) layer, connected to upper major surfaces of field shielding gate electrodes FG and a substrate contact arrangement region PBD corresponding to that shown in FIG. 42 through contact portions defined by openings in a first oxide film (an insulating film) (not shown) formed on the upper major surfaces of the field shielding gate electrodes FG. The first Al layer 1AL1 is a (first) subsource line for supplying a first source potential Vdd (this potential Vdd is also simply referred to as a source potential) as a back gate potential of the PMOS transistor 42B. Therefore, the first first At layer 1AL1 corresponds to the wiring layer 139 in FIG. 58.

On the other hand, numeral 1AL2 also denotes a second first Al layer, which is formed on the upper major surface of the first oxide film (the insulating film) provided on the upper major surfaces of the field shielding gate electrodes FG and connected to the upper major surfaces of the field shielding gate electrodes FG on the NMOS transistor 41B side through openings as contacts which are formed in the first oxide film. Therefore, the first Al layer 1AL2 is a (second) subsource line which supplies a second source potential GND (this corresponds to "a potential which is lower than the source potential Vdd") as a back gate potential of the NMOS transistor 41B, and corresponds to the wiring layer 140 shown in FIG. 58.

Referring to FIG. 90, black squares 210 and 210A drawn in the first Al layers 1AL1 and 1AL2 denote contact portions.

Further, first and second second Al layers 2AL1 and 2AL2 are first and second main source lines for supplying the first and second source potentials Vdd and GND to the first Al layers 1AL1 and 1AL21 respectively. Line widths of the second At layers 2AL1 and 2AL2 are set at sufficiently large values as compared with those of the first Al layers 1AL1 and 1AL2. 2AL source lines which are formed by combinations of pairs of such second Al layers 2AL1 and 2AL2 are arranged at spaces L (=100 to 500 μm) on the gate array semiconductor integrated circuit device in consideration of migration.

Referring to FIG. 90, Numeral 211 denotes contact portions between the second Al layer 2AL1 and the first Al layer 1AL1. The contact portions 211 are those of openings which are defined in an oxide film (an insulating film (a second oxide film)) (not shown) which is formed on the overall surface between the first Al layers 1AL1 and 1AL2 and the second Al layers 2AL1 and 2AL2. Numeral 212 denotes contact portions between the second Al layer 2AL2 and the first Al layer 1AL2, which are also those of the openings defined in the second oxide film.

Figure 91:
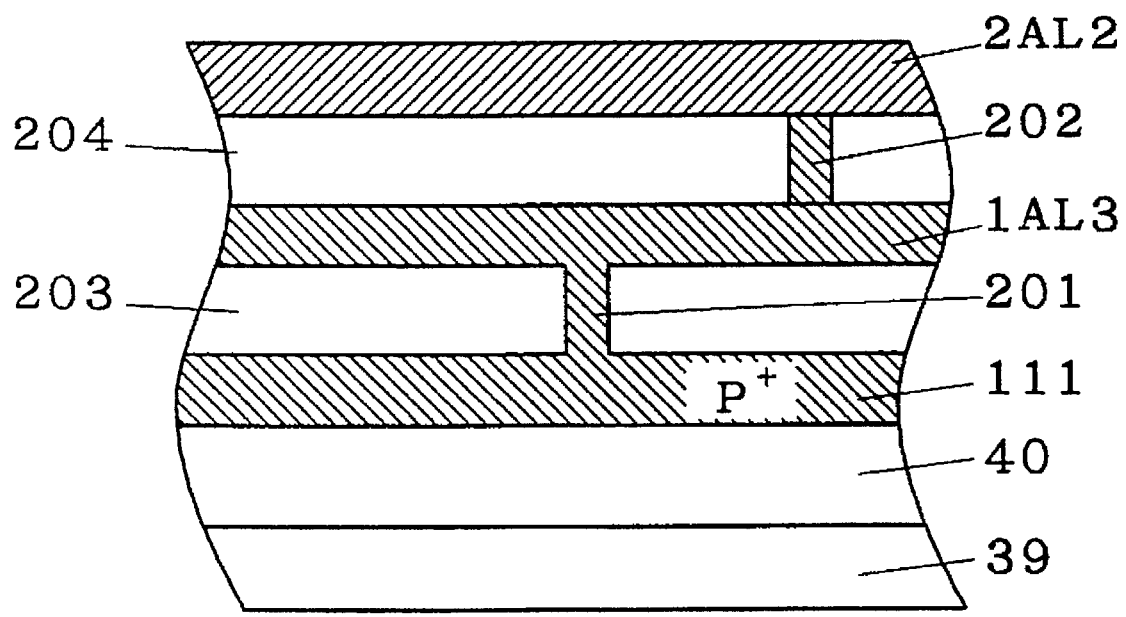
FIG. 91 is a sectional view showing a P+ layer and first and second Al layers.

A part (corresponding to numeral 203 in FIG. 91) (a first oxide film) of the aforementioned first oxide film (not shown) is formed in an opening (see FIGS. 41 and 42) formed on an upper major surface of the P+ semiconductor layer 111 (see FIGS. 41 and 42) in the isolation region between the transistors 42B and 41B, while a third first Al layer 1AL3 (corresponding to another or third subsource line) is formed on a portion which is in the upper major surface of the part 203 above the P+ semiconductor layer 111 in the first oxide film and is positioned just under the second Al layer 2AL2. This first Al layer 1AL3 is connected with the P+ semiconductor layer 111 through contact portions 201, as illustrated in FIG. 91 corresponding to a sectional view of the first Al layer 1AL3 taken along a plane which is perpendicular to the plane of FIG. 90 and parallel to the first direction 30. Openings 202 are formed in an oxide film 204 (a part of the second oxide film) which is formed on an upper major surface of the first Al layer 1AL3, so that the first Al layer 1AL3 is connected with the second Al layer 2AL2 which is formed on an upper major surface of this oxide film 204 through the opening 202 serving as a contact portion. Consequently, the P+ semiconductor layer 111 is connected with the second At layer 2AL2 which is at the second source potential GND through the contact portions 201 and 202 and the first Al layer 1AL3. Therefore, a channel region of the NMOS transistor 41B is biased to the second source potential GND which is supplied by the second Al layer 2AL2. Thus, a hole extraction path extending from the P+ semiconductor layer 111 to the second Al layer 2AL2 having a large width through the first Al layer 1AL3 is newly formed so that holes which are formed in the respective channel regions by a substrate floating effect can be efficiently extracted, whereby the effect of improving the withstand voltage shown in FIG. 7 is attained. Referring to FIG. 90, numeral 209 denotes flows of the holes.

This extraction resistance is provided by the following formula, that is, $(L \times \frac{1}{2})/W \times R \times \frac{1}{2}$ assuming that a symbol R represents a resistivity, and hence the extraction resistance is 500 Ω assuming that L=500 µm, W=1.25 µm and R =5 Ω.

The first and second source potentials Vdd and GND are applied to the substrate contact arrangement regions PBD and NBD (FIG. 42) of the PMOS transistor 42B and the NMOS transistor 41B in the basic cell respectively as shown in FIG. 58 as a matter of course, although this is not shown in FIG. 90.

While the end cell 49B shown in FIG. 43 is not formed in this preferred embodiment, the end cell 49B of FIG. 43 may alternatively be applied to the preferred embodiment shown in FIG. 90. In this case, extraction of electrons in the each PMOS transistor 42B can be reinforced by the each end cell 49B while an extraction path through the end cell 49B is further formed also as to the each NMOS transistor 41B in addition to the aforementioned new extraction path, whereby extraction of the holes is further strengthened and the withstand voltage is further improved.

Further, the idea described with reference to the fifth preferred embodiment may be applied to the preferred embodiment shown in FIG. 90. In this case, the second Al layer 2AL2 are not connected with the corresponding first Al layers 1AL2 and a potential which is lower than the source potential Vdd and higher than the ground potential GND is applied to each of the second Al layers 2AL2. Further, another second Al layers which are at the ground potential are provided and connected to the corresponding first Al layers 1Al2. Thus, it is possible to implement an operation at a higher speed by suppressing a back gate effect in addition to the improvement in withstand voltage through multilayer Al wires.

(Eighth preferred Embodiment)

Figure 92:
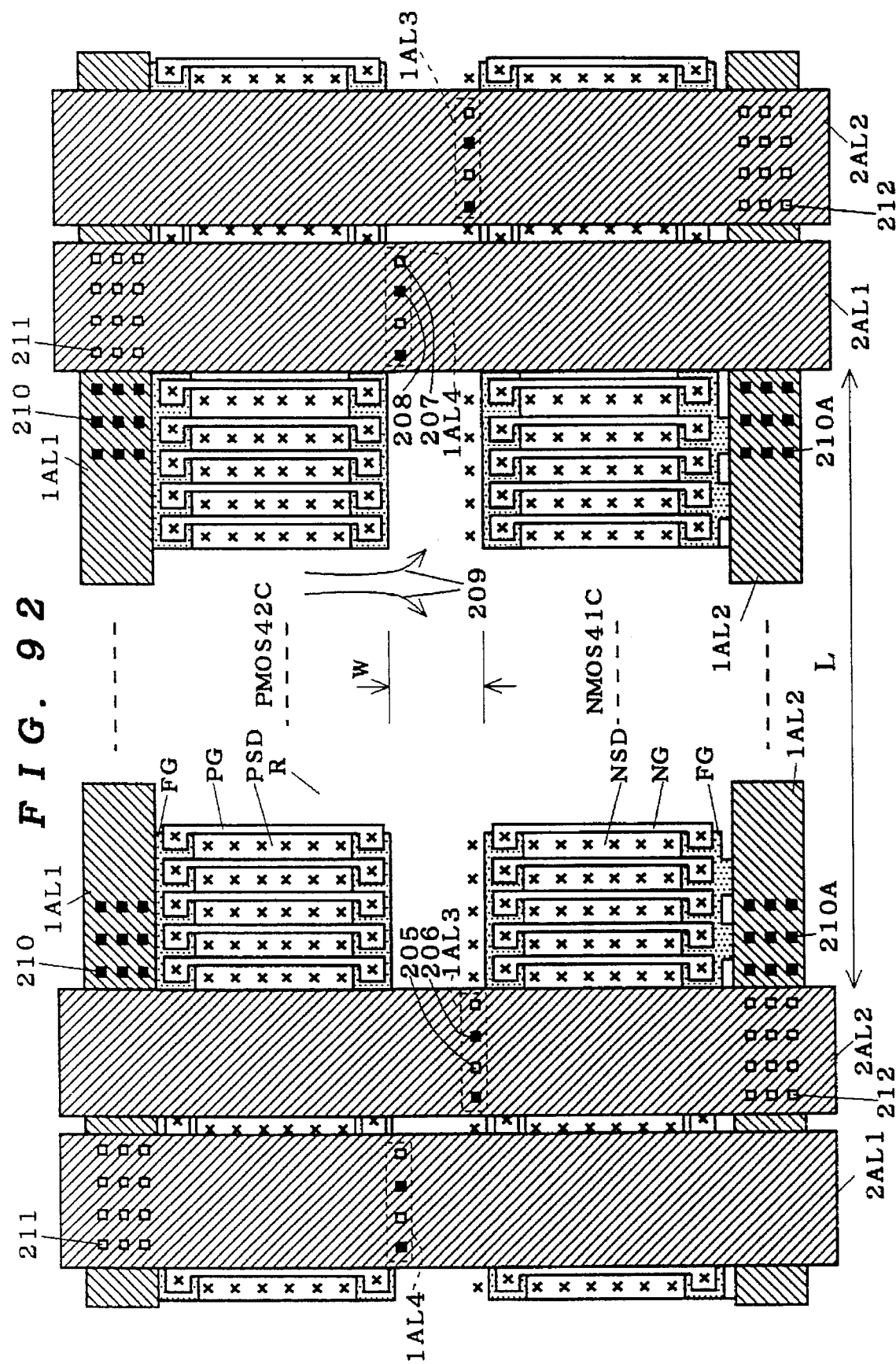
FIG. 92 is a plan view showing the structure of a gate array SOI semiconductor integrated circuit device according to an eighth preferred embodiment of the present invention.
Figure 93:
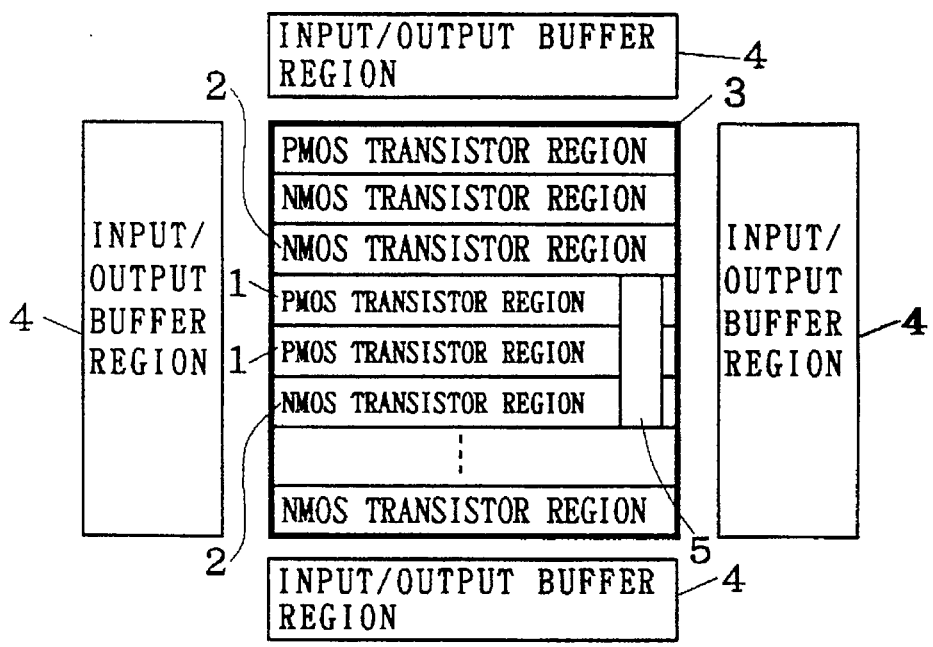
FIG. 93 is a plan view showing a conventional gate array semiconductor integrated circuit device.
Figure 94:
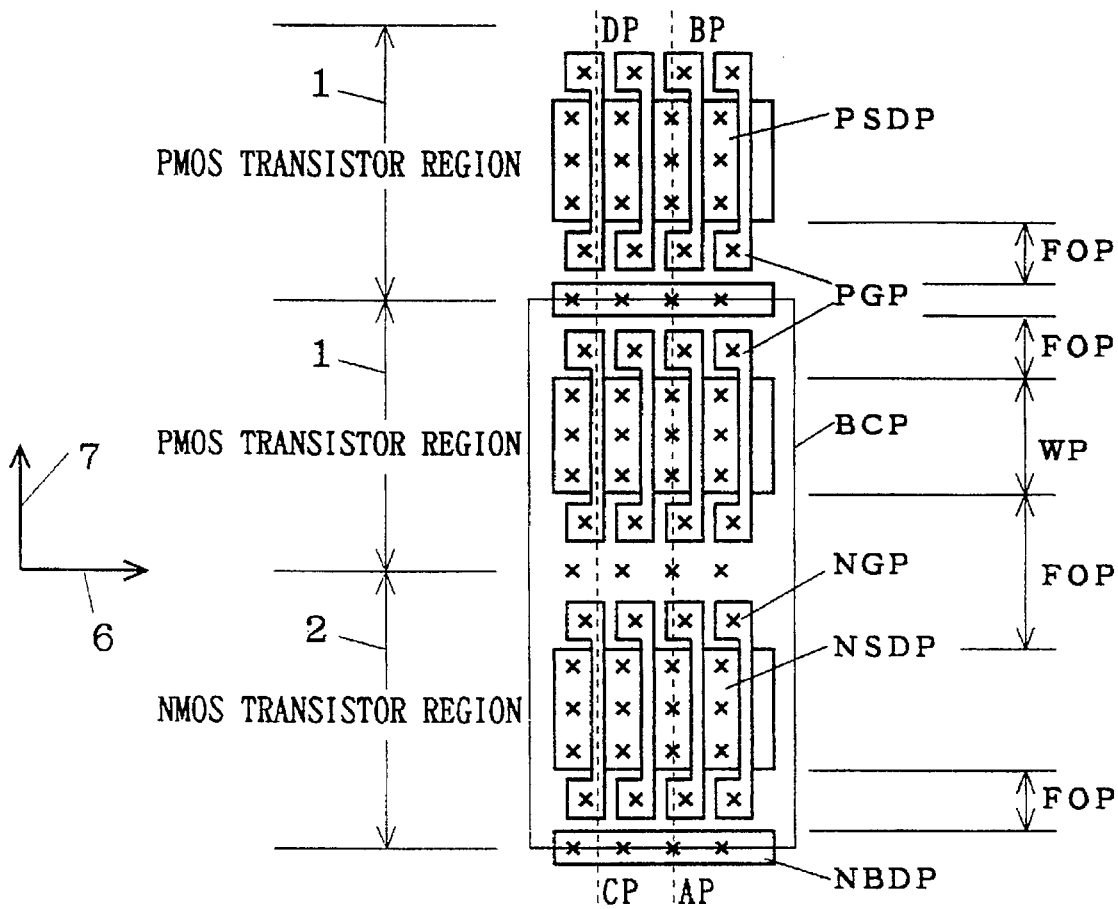
FIG. 94 illustrates the structure of a basic cell in the conventional gate array.
Figure 95:
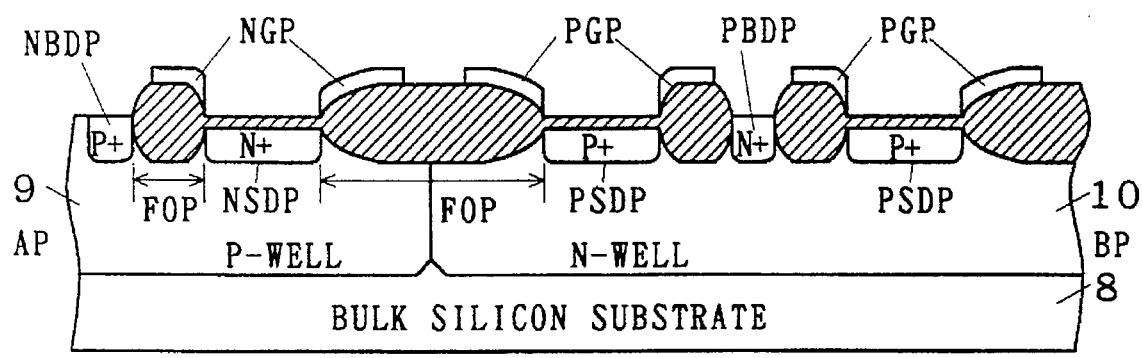
FIG. 95 is a sectional view taken along the broken line A-B in FIG. 94.
Figure 96:
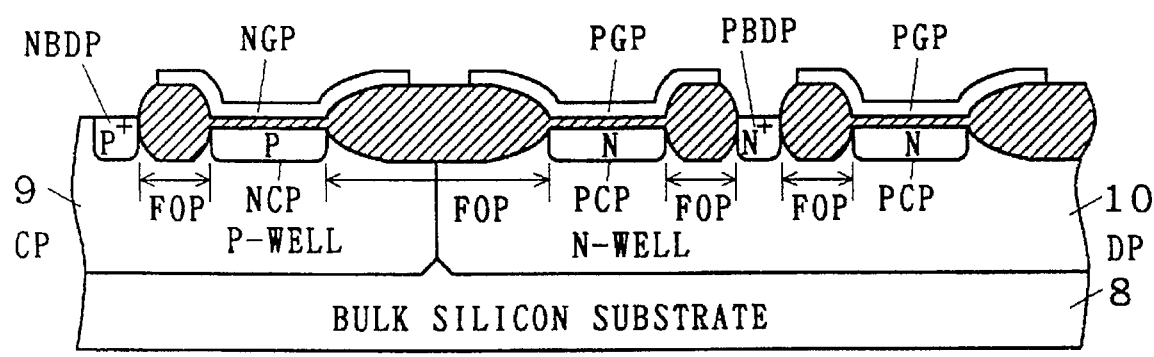
FIG. 96 is a sectional view taken along the broken line C-D in FIG. 94.
Figure 97:
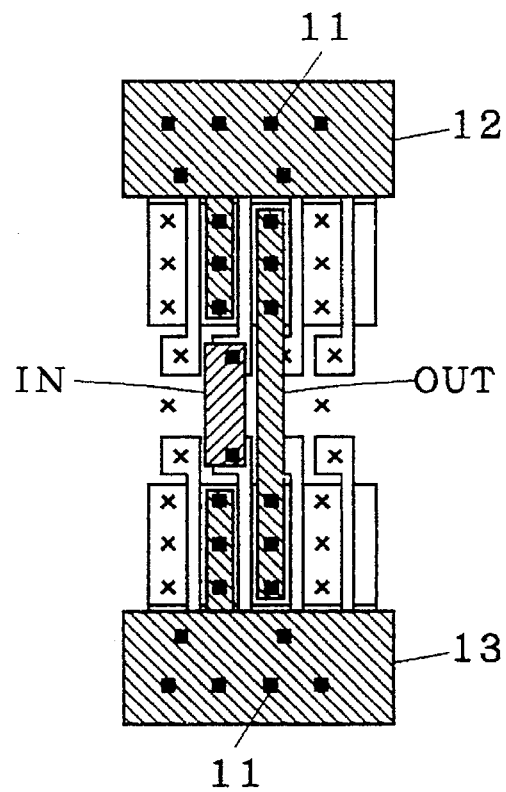
FIG. 97 illustrates a slice cell arrangement in the conventional gate array.

FIG. 92 is a plan view showing a preferred embodiment in which the technical idea described with reference to FIG. 90 is also applied to the fourth preferred embodiment. Referring to FIG. 92, numeral 205 denotes a (third) contact portion connecting a second Al layer 2AL2 and a first Al layer 1AL3 (a third subsource line) with each other, which corresponds to an opening provided in a (second) oxide film between the Al layers 2AL2 and 1AL3. Numeral 206 denotes a contact portion connecting the first Al layer 1AL3 and the p+ semiconductor layer NBD1 (a P-type isolation region layer) shown in FIG. 61 with each other, which is a portion formed by filling up an opening provided in a (first) oxide film formed between the layers 1AL3 and NBD1 with an Al layer.

Further, numeral 207 denotes a (fourth) contact portion connecting the second Al layer 2AL1 and a first Al layer 1AL4 being a fourth subsource line with each other, which is provided in a (second) oxide film between the layers 2AL1 and 1AL4. Numeral 208 denotes a contact portion connecting the first Al layer 1AL4 and the N+ semiconductor layer PBD1 (an N-type isolation region layer) of FIG. 61, which is provided in a (first) oxide film between the layers 1AL4 and PBD1.

Numeral 211 denotes a first contact portion between a first main source line 2AL1 and a first subsource line 1AL1, and numeral 212 denotes a second contact portion between a second main source line 2AL2 and a second subsource line 1AL2.

Thus, a new extraction path extending from the N+ semiconductor layer PBD1 to the second source potential Vdd through the first Al layer 1A14 and the second Al layer 2AL1 is formed also as to a PMOS transistor 42C in addition to an extraction path penetrating to the second power source Vdd through the substrate contact arrangement region PBD in FIG. 61, whereby unnecessary storage carriers in channel regions can be strongly extracted as to the transistors 41C and 42C respectively, for remarkably improving the withstand voltage.

The end cells 49C of FIG. 62 can be formed also as to the preferred embodiment shown in FIG. 92, and the idea of the fifth preferred embodiment can be applied to this preferred embodiment, to increase the speed.

(Effects of Respective Preferred Embodiments)

According to the first preferred embodiment of the present invention, channel regions in an SOI layer are drawn in a second direction beyond both ends of gate electrodes, so that both ends (N-type or P-type semiconductor layers) of the respective channel regions drawn out are connected with each other through an end cell. Therefore, the potentials of the channel regions are fixed in view of both ends of the corresponding gate electrodes, whereby holes and electrons which are stored by the substrate floating effect can be efficiently extracted. Thus, the withstand voltage range can be enlarged, whereby a gate array semiconductor integrated circuit having a large gate width can be obtained.

According to the second preferred embodiment of the present invention, the isolation region between the PMOS and NMOS transistors in the first preferred embodiment is formed by only the N-type semiconductor layer, whereby a step of fabricating a field oxide film, which is required in the first preferred embodiment, can be omitted. Thus, it is possible to obtain a gate array semiconductor integrated circuit device having a large gate width by improving the withstand voltage characteristic through a small number of fabrication steps, thereby reducing the fabrication cost.

According to the third preferred embodiment of the present invention, the isolation region between the PMOS and NMOS transistors in the first preferred embodiment is formed by only the P-type semiconductor layer, whereby a gate array semiconductor integrated circuit device having a large gate width can be obtained while improving the withstand voltage through a small number of fabricating steps. Therefore, the fabrication cost can be reduced.

Further, the P+ semiconductor layer in the isolation region between the PMOS and NMOS transistors can be connected with the wiring layer through the contacts so that the P+ semiconductor layer is connected to the wiring layer of the second power source by the wiring layer. In this case, the channel region of the NMOS transistor which is adjacent to the PMOS transistor is not only potential-fixed through the P-type semiconductor layer of the end cell region but also fixed by the aforementioned wiring layer which is lower in resistance than the P-type semiconductor layer in general. When this structure is employed, therefore, holes which are stored by the substrate floating effect can be further efficiently extracted in relation to the NMOS transistor, whereby a gate array semiconductor integrated circuit device having a larger gate width can be readily obtained.

According to the fourth preferred embodiment of the present invention, not only potential fixation of the respective channel regions of the PMOS and NMOS transistors in the first preferred embodiment is performed through the end cell, but the respective channel regions are fixed to the first and second power sources in the slice cell by directly connecting the N+ and P+ semiconductor layers in the isolation region with the corresponding wiring layers. Thus, electrons or holes which are stored in the respective channel regions of the PMOS and NMOS transistors by the substrate floating effect can be further efficiently extracted, whereby a gate array semiconductor integrated circuit device having a larger gate width can be obtained by further improving the withstand voltage characteristic.

According to the fifth preferred embodiment of the present invention, the channel region and the field shielding gate electrode of either the PMOS or NOS transistor are connected to the third or fourth power source which is lower than the first source potential and higher than the second source potential. Therefore, the back gate effect can be suppressed and the threshold voltage for turning on the transistor is reduced, whereby a gate array semiconductor integrated circuit device which operates at a higher speed can be obtained.

While it is necessary to fix the potentials of the field shielding gate electrodes and to turn off parasitic transistors formed by the field shielding gate electrodes and the source/drain electrodes in order to isolate the transistors which are adjacent to each other in the first direction, it is possible to strongly turn off the parasitic transistors by connecting the potentials of the field shielding gate electrodes to the first or second power source, thereby reducing leakage currents of the parasitic transistors as compared with the case of fixing the potentials of the field shielding gate electrodes at the third or fourth power source.

According to the sixth preferred embodiment of the present invention, the oxide film which is larger in thickness than that in the first preferred embodiment is employed as means for forming the N-type or P-type semiconductor layer which is positioned on the both ends of either the PMOS or NMOS transistor region for drawing out its channel region. The thickness must be at a degree capable of inhibiting injection of impurity ions of P or B etc., whereby the oxide film projects beyond the field oxide film FO for isolation. Thus, no impurity such as P or B etc. is injected into the P-type and N-type semiconductor layers. In addition, a step of fabricating field shielding gate electrodes can be omitted, and a gate array semiconductor integrated circuit device having a large gate width can be obtained through a small number of fabrication steps. Thus, the fabrication cost can be reduced.

According to the seventh or eighth preferred embodiment of the present invention, it is possible to improve the withstand voltage through the 2AL source lines, thereby implementing a gate array semiconductor device having a large gate width. The withstand voltage can be further improved by providing the end cells.

While the invention has been shown and described in detail, the foregoing description is in all aspects illustrative and not restrictive. It is therefore understood that numerous modifications and variations can be devised without departing from the scope of the invention.

What is claimed is:

1. A gate array semiconductor, integrated device, comprising:

an insulating layer;

a semiconductor layer being formed on an upper major surface of said insulating layer;

N-type and P-type MOS transistors, having gate electrodes in gate length directions and gate width directions corresponding to a first direction and a second direction being perpendicular to said first direction respectively, being adjacently formed in said semiconductor layer and on its upper major surface through an isolation region;

said isolation region being a P-type layer being formed in said semiconductor layer along said first direction;

a P-type extended layer having one end surface being bonded to one end surface being perpendicular to said second direction of a channel region of said N-type MOS transistor and another end surface being bonded to one end surface being perpendicular to said second direction of said isolation region, and being formed in said semiconductor layer;

an N-type extended layer having one end surface being bonded to one end surface being perpendicular to said second direction of a channel region of said P-type MOS transistor and another end surface being bonded to another end surface being perpendicular to said second direction of said isolation region, and being formed in said semiconductor layer;

a first oxide film covering said semiconductor layer, said isolation region and said N-type and P-type MOS transistors;

a subsource line being formed on an upper major surface of said first oxide film along said first direction and being at a potential being lower than a source potential;

another subsource line being formed on a portion being in said upper major surface of said first oxide film, and being just above said isolation region along said first direction;

a second oxide film covering said subsource line and said another subsource line; and a main source line being positioned above said another subsource line, being formed on an upper major surface of said second oxide film along said second direction, having a line width being set to be larger than a line width of said subsource line and being a potential being lower than said source potential, said isolation region and said another subsource line being connected with each other through a contact portion being provided in said first oxide film, said main source line and said subsource line being connected with each other through a contact portion being provided in said second oxide film, said main source line and said another subsource line being connected with each other through another contact portion being provided in said second oxide film.

2. The gate array semiconductor integrated circuit device in accordance with claim 1, wherein said main source line, said subsource line and said another subsource line correspond to a second main source line, a second subsource line and a third subsource line respectively, said gate array semiconductor integrated circuit device further comprises:

a first main source line being formed on said upper major surface of said second oxide film in parallel with said second main source line along said second direction and having a line width being set to be equal to said line width of said second main source line, said first main source line being at said source potential; and a first subsource line being formed on said upper major surface of said first oxide film in parallel with said second subsource line along said first direction, said first subsource line being at said source potential, said first main source line and said first subsource line are connected with each other through still another contact portion being provided in said second oxide film, another P-type extended layer is formed in said semiconductor layer, said another P-type extended layer having one end surface being bonded to another end surface being perpendicular to said second direction of said channel region of said N-type MOS transistor and an upper major surface being connected with said second subsource line, and another N-type extended layer is formed in said semiconductor layer, said another N-type extended layer having one end surface being bonded to another end surface being perpendicular to said second direction of said channel region of said P-type MOS transistor and an upper major surface being connected with said first subsource line.

3. The gate array semiconductor integrated circuit device in accordance with claim 2, wherein said potential being lower than said source potential is a ground potential, and said ground potential and said source potential are applied to respective source regions of said N-type and P-type MOS transistors through said second and first subsource lines respectively.

4. The gate array semiconductor integrated circuit device in accordance with claim 2, wherein an end cell region having an end cell corresponding to a basic cell consisting of said N-type and P-type MOS transistors is formed on each end of a region being formed by repeatedly arranging said basic cell in said first direction while symmetrically arranging the same to be folded in said second direction, all of said P-type extended layer, said another P-type extended layer, said N-type extended layer and said another N-type extended layer are extended in said semiconductor layer along said first direction to reach said end cell region, a part of said isolation region being formed along said first direction also defines a part of said end cell, said end cell comprises:

an end cell P-type semiconductor layer being formed in said semiconductor layer along said second direction so that one of end surfaces thereof being perpendicular to said second direction is bonded to one end surface of said part of said isolation region; and an end cell N-type semiconductor layer being formed in said semiconductor layer along said second direction so that one of end surfaces thereof being perpendicular to said second direction is bonded to another end surface of said part of said isolation region, one and another end portions of said end cell P-type semiconductor layer are connected with said P-type extended layer and said another P-type extended layer respectively, and one and another end portions of said end cell N-type semiconductor layer are connected with said N-type extended layer and said another N-type extended layer respectively.

5. A gate array semiconductor integrated device, comprising:

an insulating layer;

a semiconductor layer being formed on an upper major surface of said insulating layer;

N-type and P-type MOS transistors, having gate electrodes in gate length directions and gate width directions corresponding to a first direction and a second direction being perpendicular to said first direction respectively, being adjacently formed in said semiconductor layer and on its upper major surface through an isolation region;

said isolation region comprising:

a P-type isolation region layer being formed in said semiconductor layer along said first direction;

an N-type isolation region layer being formed in said semiconductor layer along said first direction; and a field oxide film being formed between one end surface of said P-type isolation region layer and one end surface of said N-type isolation region layer, a P-type extended layer being formed in said semiconductor layer, said P-type extended layer having one end surface being bonded to one end surface being perpendicular to said second direction of a channel region of said N-type MOS transistor and another end surface being bonded to another end surface being perpendicular to said second direction of said P-type isolation region layer;

an N-type extended layer being formed in said semiconductor layer, said N-type extended layer having one end surface being bonded to one end surface being perpendicular to said second direction of a channel region of said P-type MOS transistor and another end surface being bonded to another end surface being perpendicular to said second direction of said N-type isolation region layer;

a first oxide film covering said semiconductor layer, said isolation region and said N-type and P-type MOS transistors;

a first subsource line being formed on an upper major surface of said first oxide film along said first direction and being at a source potential;

a second subsource line being formed on said upper major surface of said first oxide film along said first direction and being at a potential being lower than said source potential;

a third subsource line being formed on a portion of said upper major surface of said first oxide film and being just above said P-type isolation region layer along said first direction;

a fourth subsource line being formed on a portion of said upper major surface of said first oxide film and being just above said N-type isolation region layer along said first direction;

a second oxide film covering respective said first to fourth subsource lines;

a first main source line being positioned above said fourth subsource line and formed on an upper major surface of said second oxide film along said second direction with a line width being set to be larger than those of said first and second subsource lines, said first main source line being at said source potential; and a second main source line being positioned above said third subsource line and formed on said upper major surface of said second oxide film along said second direction with a line width being set to be larger than those of said first and second subsource lines, said second main source line being at a potential being lower than said source potential, said P-type isolation region layer and said third subsource line being connected with each other through a contact portion being provided in said first oxide film, said N-type isolation region layer and said fourth subsource line being connected with each other through another contact portion being provided in said first oxide film, said first main source line and said first subsource line being connected with each other through a first contact portion being provided in said second oxide film, said second main source line and said second subsource line being connected with each other through a second contact portion being provided in said second oxide film, said second main source line and said third subsource line being connected with each other through a third contact portion being provided in said second oxide film, said first main source line and said fourth subsource line being connected with each other through a fourth contact portion being provided in said second oxide film.

6. The gate array semiconductor integrated circuit device in accordance with claim 5, wherein an end cell region having an end cell corresponding to a basic cell consisting of said N-type and P-type MOS transistors is formed on each end of a region being formed by repeatedly arranging said basic cell in said first direction while symmetrically arranging the same to be folded in said second direction, all of said P-type extended layer, said another P-type extended layer, said N-type extended layer and said another N-type extended layer are extended in said semiconductor layer along said first direction to reach said end cell region, a part of said isolation region being formed along said first direction also defines a part of said end cell, said end cell comprises:

an end cell P-type semiconductor layer being formed in said semiconductor layer along said second direction so that one of end surfaces thereof being perpendicular to said second direction is bonded to another end surface of a part of said P-type isolation region layer, and an end cell N-type semiconductor layer being formed in said semiconductor layer along said second direction so that one of end surfaces thereof being perpendicular to said second direction is bonded to another end surface of a part of said N-type isolation region layer, one and another end portions of said end cell P-type semiconductor layer are connected with said P-type extended layer and said another P-type extended layer respectively, and one and another end portions of said end cell N-type semiconductor layer are connected with said N-type extended layer and said another N-type extended layer respectively.

7. The gate array semiconductor integrated circuit device in accordance with claim 6, wherein said potential being lower than said source potential is a ground potential, said ground potential and said source potential being applied to respective source regions of said N-type and P-type MOS transistors through said second and first subsource lines respectively.

8. A gate array semiconductor integrated circuit device, comprising:

an insulating layer;

a semiconductor layer being formed on an upper major surface of said insulating layer;

N-type and P-type MOS transistors being formed in said semiconductor layer and on its upper major surface; and a gate circuit portion including said N-type and P-type MOS transistors and operating through operating power sources of a first source potential and a second source potential being lower than said first source potential, wherein a back gate potential of either said N-type or P-type MOS transistor is set at a potential being lower than said first source potential and higher than said second source potential.

9. A gate array semiconductor integrated circuit device, comprising:

an insulating layer;

a semiconductor layer being formed on an upper major surface of said insulating layer;

N-type and P-type MOS transistors being formed in said semiconductor layer and on its upper major surface; and a gate circuit portion including said N-type and P-type MOS transistors and operating through operating power sources of a first source potential and a second source potential being lower than said first source potential, wherein a back gate potential of said P-type MOS transistor is set at a third potential being lower than said first source potential and higher than said second source potential, and a back gate potential of said N-type MOS transistor is set at a fourth potential being lower than said first source potential and higher than said second source potential.

10. A gate array semiconductor integrated circuit device, comprising:

an insulating layer;

a semiconductor layer being formed on an upper major surface of said insulating layer;

a first source wiring layer, being at a first source potential, being formed on an upper major surface of said semiconductor layer;

a second source wiring layer, being at a second potential being lower than said first source potential, being formed on said upper major surface of said semiconductor layer;

N-type and P-type MOS transistors, having gate electrodes in gate length directions and gate width directions corresponding to a first direction and a second direction being perpendicular to said first direction respectively, being adjacently formed in said semiconductor layer and on its upper major surface through an isolation region;

said isolation region being formed in said semiconductor layer along said first direction, a P-type extended layer being formed in said semiconductor layer along said first direction, said P-type extended layer having one end surface being bonded to one end surface being perpendicular to said second direction of a channel region of said N-type MOS transistor and another end surface being bonded to one end surface being perpendicular to said second direction of said isolation region;

another P-type extended layer being formed in said semiconductor layer, said another P-type extended layer having one end surface being bonded to another end surface being perpendicular to said second direction of said channel region of said N-type MOS transistor and an upper major surface being connected with said second source wiring layer;

an N-type extended layer being formed in said semiconductor layer along said first direction, said N-type extended layer having one end surface being bonded to one end surface being perpendicular to said second direction of a channel region of said P-type MOS transistor and another end surface being bonded to another end surface being perpendicular to said second direction of said isolation region;

another N-type extended layer being formed in said semiconductor layer, said another N-type extended layer having one end surface being bonded to another end surface being perpendicular to said second direction of said channel region of said P-type MOS transistor and an upper major surface being connected with said first source wiring layer; and an end cell region having an end cell corresponding to a basic cell consisting of said N-type and P-type MOS transistors, said end cell region being formed on each end of a region being formed by repeatedly arranging said basic cell in said first direction while symmetrically arranging the same to be folded in said second direction, wherein all of said P-type extended layer, said another P-type extended layer, said N-type extended layer and said another N-type extended layer are extended in said semiconductor layer along said first direction to reach said end cell region, a part of said isolation region being formed along said first direction also defines a part of said end cell, said end cell comprises:

an end cell P-type semiconductor layer being formed in said semiconductor layer along said second direction so that one of end surfaces thereof being perpendicular to said second direction is bonded to one end surface of said part of said isolation region; and an end cell N-type semiconductor layer being formed in said semiconductor layer along said second direction so that one of end surfaces thereof being perpendicular to said second direction is bonded to another end surface of said part of said isolation region, one and another end portions of said end cell P-type semiconductor layer are connected to said P-type extended layer and said another P-type extended layer respectively, and one and another end portions of said end cell N-type semiconductor layer are connected to said N-type extended layer and said another N-type extended layer respectively.

11. The gate array semiconductor integrated circuit device in accordance with claim 10, wherein said isolation region comprises a field oxide film being formed on said upper major surface of said insulating layer.

12. The gate array semiconductor integrated circuit device in accordance with claim 11, wherein said isolation region consists essentially of only said field oxide film.

13. The gate array semiconductor integrated circuit device in accordance with claim 12, wherein a P-type MOS transistor field shielding gate electrode is formed on an upper major surface of said P-type extended layer along said first direction through an insulating film, an N-type MOS transistor field shielding gate electrode is formed on an upper major surface of said N-type extended layer along said first direction through said insulating film, Parts of said insulating film and said P-type MOS transistor field shielding gate electrode both extending in said first direction are successively formed on an upper major surface of said end cell P-type semiconductor layer respectively, and Another part of said insulating film and a part of said N-type MOS transistor field shielding gate electrode both extending in said first direction are successively formed on an upper major surface of said end cell N-type semiconductor layer respectively.

14. The gate array semiconductor integrated circuit device in accordance with claim 13, wherein a part of an upper major surface of said P-type MOS transistor field shielding gate electrode is connected to said first source wiring layer.

15. The gate array semiconductor integrated circuit device in accordance with claim 12, wherein an insulating film having a thickness capable of preventing implantation of impurity ions is formed on said upper major surfaces of said P-type and N-type extended layers along said first direction, a part of said insulating film extending in said first direction being formed on upper major surfaces of said end cell P-type and N-type semiconductor layers.

16. The gate array semiconductor integrated circuit device in accordance with claim 11, wherein said isolation region comprises P-type and N-type isolation region layers being formed in said semiconductor layer to be opposed to each other through said field oxide film, said one end surface of said isolation region corresponds to that, being not opposed to said N-type isolation region layer, of both end surfaces of said P-type isolation region layer in relation to said second direction, and said another end surface of said isolation region corresponds to that, being not opposed to said P-type isolation region layer, of both end surfaces of said N-type isolation region layer in relation to said second direction.

17. The gate array semiconductor integrated circuit device in accordance with claim 10, wherein said isolation region is a layer of a prescribed conductivity type being formed in said semiconductor layer.

18. The gate array semiconductor integrated circuit device in accordance with claim 17, wherein said isolation region is said semiconductor layer of an N-type conductivity.

19. The gate array semiconductor integrated circuit device in accordance with claim 17, wherein said isolation region is said semiconductor layer of a P-type conductivity.

20. The gate array semiconductor integrated circuit device in accordance with claim 19, wherein said isolation region is connected with said second source wiring layer.

* * * * *